(12) United States Patent
Blomgren et al.

(10) Patent No.: US 6,334,136 B1
(45) Date of Patent: Dec. 25, 2001

(54) DYNAMIC 3-LEVEL PARTIAL RESULT MERGE ADDER

(75) Inventors: James S. Blomgren; Anthony M. Petro, both of Austin, TX (US)

(73) Assignee: Intrinsity, Inc., Austin, TX (US)

( * ) Notice: Subject to any disclaimer, the term of this patent is extended or adjusted under 35 U.S.C. 154(b) by 0 days.

(21) Appl. No.: 09/209,935

(22) Filed: Dec. 11, 1998

Related U.S. Application Data

(60) Provisional application No. 60/069,250, filed on Dec. 11, 1997.

(51) Int. Cl.[7] ........................................... G06F 7/50
(52) U.S. Cl. ............................. 708/710; 708/670
(58) Field of Search .................... 708/670, 700, 708/702–704, 706, 710–713

(56) References Cited

U.S. PATENT DOCUMENTS

| | | | | |
|---|---|---|---|---|
| 5,299,145 | * | 3/1994 | Yoshida | 708/670 |
| 5,463,571 | * | 10/1995 | Kim | 708/670 |
| 5,463,572 | * | 10/1995 | Kim | 708/670 |
| 5,463,573 | * | 10/1995 | Yoshida | 708/670 |
| 5,467,298 | * | 11/1995 | Yoshida | 708/670 |
| 5,499,203 | * | 3/1996 | Grundland | 708/710 |

* cited by examiner

*Primary Examiner*—Tan V. Mai
(74) *Attorney, Agent, or Firm*—Booth & Wright, L.L.P.; Matthew J. Booth; Karen S. Wright

(57) ABSTRACT

The present invention comprises a method and apparatus that selectably performs either addition or subtraction on two N-nary operands to generate an intermediate, then final, N-nary final result. If the intermediate result of the operation contains less bits than a full register, the intermediate result is "merged" with the second operand in that unaltered bits from the second operand are bypassed to the final result. Accordingly, the final result and the second operand have an equal number of bits.

20 Claims, 22 Drawing Sheets

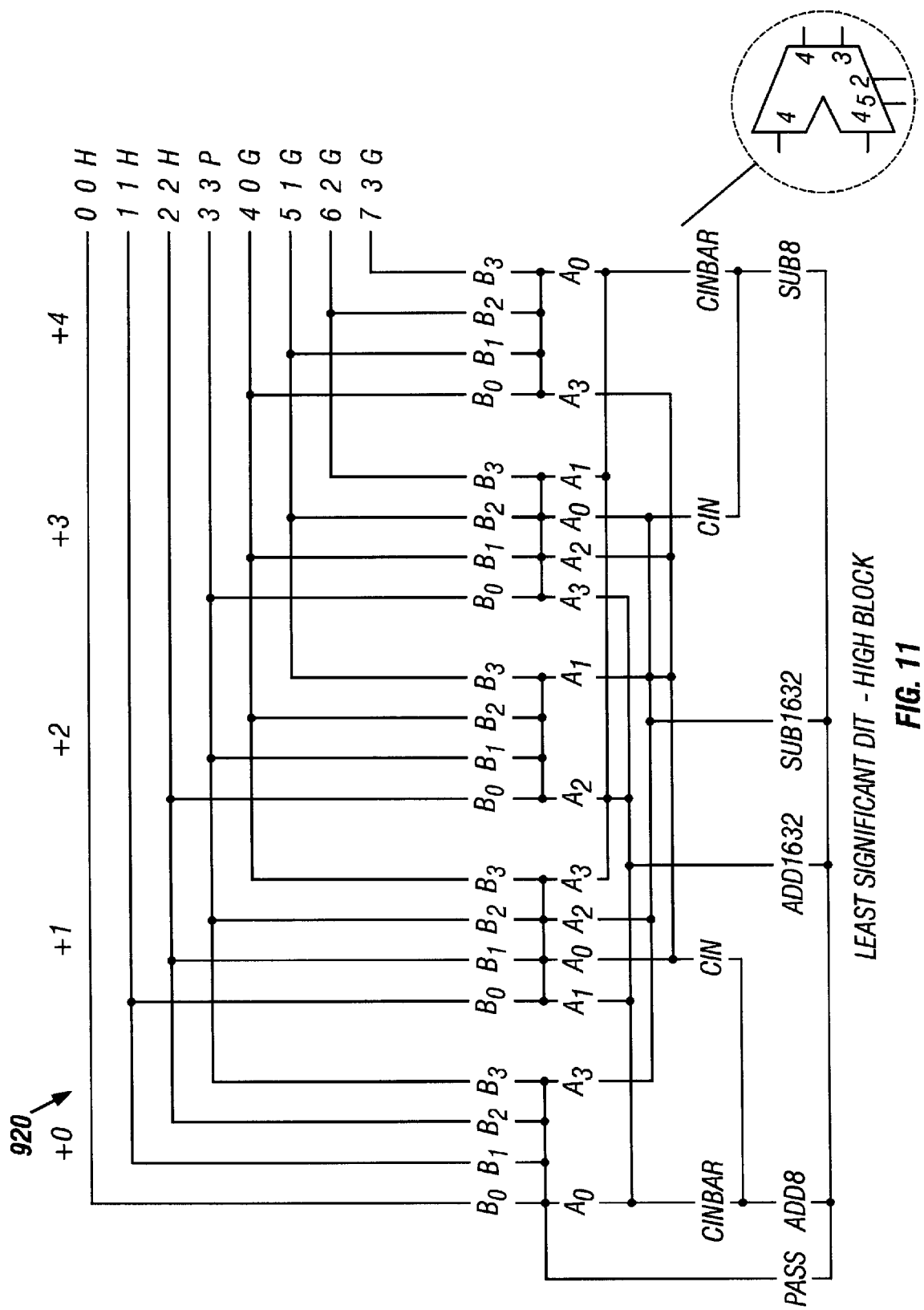
FIG. 11  LEAST SIGNIFICANT DIT - HIGH BLOCK

DYNAMIC 3-LEVEL PARTIAL RESULT MERGE ADDER

This application claims the benefits of the earlier filed U.S. Provisional Application Ser. No. 60/069,250, filed Dec. 11, 1997, which is incorporated by reference for all purposes into this application.

BACKGROUND OF THE INVENTION

1. Field of the Invention

The present invention relates to digital computing, and more particularly to an apparatus and method for a three logic-level 32-bit adder/subtractor that implements carry-propagate logic and that allows a subset of the contents of the register containing one of the 32-bit operands to be modified while leaving the remainder of the register contents unmodified.

2. Description of the Related Art

Two areas of related art are relevant to the present invention. One area of related art is the prior art x86 instruction set regarding addition and subtraction, and the manner in which the x86 instruction set's manipulation of registers must be altered to support pipelining. The other area of related art is the N-nary logic design style. These two areas of prior art are discussed separately below.

x86 Instruction Set's Manipulation of Registers

The original 8086 instruction set supported eight 16-bit general purpose registers that could be used, among other purposes, for addition and subtraction operations. Each addition or subtraction instruction requires two operands, which are stored in registers for use by the adder/subtractor. The nomenclature "X" came to represent a standard 16-bit register. Four 8086 registers of interest were therefore known as "AX", "BX", "CX", and "DX". These four standard registers AX, BX, CX, DX are of interest in the background discussion of the present invention because the 8086 instruction set supported a conceptual division of such registers into two constituent parts each.

The 8086 standard registers were conceptually divided into a low byte and a high byte, wherein the low byte is identified by the "L" nomenclature and the high byte is identified by the "H" nomenclature. The standard registers AX, BX, CX, and DX therefore conceptually further comprised "AH" and "AL", "BH" and "BL", "CH" and "CL", and "DH"and "DL", respectively. This division of registers AX, BX, CX, and DX allowed byte-access (8-bit access) to the upper ("H") and lower ("L") bytes of these registers for purposes of performing addition and subtraction operations.

With the introduction of the 386, the x86 architecture grew to support 32-bit registers, known as extended registers and denoted by the nomenclature "ExX". Despite this introduction of extended registers, the 386 was required to support older code that had been written for 16-bit registers. The need to support both a 32-bit and a 16-bit instruction set led to a conceptual overlay structure of extended registers. The overlay structure for extended registers defines a standard 16-bit register (i.e., AX) to occupy the 16 least significant bits of the corresponding extended register (i.e., EAX), with a low byte (i.e., AL) occupying bits 0 through 7 of both the standard and extended registers, and with a high byte (i.e., AH) occupying bits 8 through 15 of the standard and extended registers. This overlay structure is illustrated in FIG. 11A. FIG. 11A illustrates that each extended register EX comprises a top portion (bits 16–31), denoted in FIG. 11A with a "T", and a standard register portion (bits 0–15), denoted in FIG. 11A with an "X". FIG. 11A further illustrates that the standard register portion X further comprises a high byte H and a low byte L. Such overlay structure allows, for each add or subtract instruction, the option of utilizing one of four register sizes for the operands: a 32-bit extended register, a 16-bit standard register, an 8-bit high byte, or an 8-bit low byte.

N-nary Logic

A second area of interest regarding the background of the present invention deals with the manner in which addition and subtraction operands are represented when they are stored in the registers discussed above. Most computer systems represent addition and subtraction operands and results as binary numbers. In systems using traditional binary logic, the truth table for one-bit addition is set forth in Table 1.

TABLE 1

| A | B | A + B |
|---|---|-------|
| 0 | 0 | 0 |
| 0 | 1 | 1 |
| 1 | 0 | 1 |
| 1 | 1 | 0* |

In the last row of Table 1, a carry condition occurs. That is, the result is 0, but a carry into the next-higher-order bit position, corresponding to a decimal value of 2, has conceptually occurred. In addition to single bits, the addition operation may be performed on multiple bits, including addition of two two-bit values. The truth table for such an operation is set forth in Table 2, where the first operand A is a two-bit value comprising bits $A_0$ and $A_1$. The second operand, B, is a two-bit value comprising bits $B_0$ and $B_1$.

TABLE 2

| $A_1$ | $A_0$ | $B_1$ | $B_0$ | A = Decimal Value | B = Decimal Value | A + B | A + B = Dec. Value |
|---|---|---|---|---|---|---|---|
| 0 | 0 | 0 | 0 | 0 | 0 | 00 | 0 |
| 0 | 0 | 0 | 1 | 0 | 1 | 01 | 1 |
| 0 | 0 | 1 | 0 | 0 | 2 | 10 | 2 |
| 0 | 0 | 1 | 1 | 0 | 3 | 11 | 3 |
| 0 | 1 | 0 | 0 | 1 | 0 | 01 | 1 |
| 0 | 1 | 0 | 1 | 1 | 1 | 10 | 2 |
| 0 | 1 | 1 | 0 | 1 | 2 | 11 | 3 |
| 0 | 1 | 1 | 1 | 1 | 3 | 00* | 0 |
| 1 | 0 | 0 | 0 | 2 | 0 | 10 | 2 |
| 1 | 0 | 0 | 1 | 2 | 1 | 11 | 3 |
| 1 | 0 | 1 | 0 | 2 | 2 | 00* | 0 |
| 1 | 0 | 1 | 1 | 2 | 3 | 01* | 1 |
| 1 | 1 | 0 | 0 | 3 | 0 | 11 | 3 |
| 1 | 1 | 0 | 1 | 3 | 1 | 00* | 0 |
| 1 | 1 | 1 | 0 | 3 | 2 | 01* | 1 |
| 1 | 1 | 1 | 1 | 3 | 3 | 10* | 2 |

Each output value in the "A+B" column of Table 2 indicated with an asterisk denotes a carry condition where a logical one has conceptually carried into the next-higher-order bit (the bit position corresponding to a decimal value of four).

In contrast to the binary system discussed above, the present invention utilizes an N-nary logic representation. The N-nary logic family supports a variety of signal encodings, including 1-of-4. The N-nary logic family is described in a copending patent application, U.S. patent application Ser. No. 09/019,355, filed Feb. 5, 1998, now U.S. Pat. No. 6,066,965, and titled "Method and Apparatus for a N-Nary logic Circuit Using 1-of-4 Signals", which is incorporated herein for all purposes and is hereinafter referred to as "The N-nary Patent." This application also incorporates several other copending patent applications, including U.S. patent application Ser. No. 09/179,330, filed Oct. 27, 1998, entitled "Method and Apparatus for Logic Synchronization," now U.S. Pat. No. 6,118,304, and U.S. patent application Ser. No. 09/206,463, filed Dec. 7, 1998, titled "Method and Apparatus for 3-stage 32-Bit Adder/ Subtractor," hereinafter referred to as the "Adder Patent," all of which are incorporated by reference into this application.

In 1-of-4 encoding, four wires are used to indicate one of four possible values. In contrast, traditional static logic design uses two wires to indicate four values, as is demonstrated in Table 2. In Table 2, the $A_0$ and $A_1$ wires are used to indicate the four possible values for operand A: 00, 01, 10, and 11. The two B wires are similarly used to indicate the same four possible values for operand B. "Traditional" dual-rail dynamic logic also uses four wires to represent two bits, but the dual-rail scheme always requires two wires to be asserted. In contrast, N-nary logic only requires assertion of one wire. The benefits of N-nary logic over dual-rail dynamic logic, such as reduced power and reduced noise, should be apparent from a reading of The N-nary Patent.

All signals in N-nary logic, including 1-of-4, are of the 1-of-N form where N is any integer greater than one. A 1-of-4 signal requires four wires to encode four values (0–3 inclusive), or the equivalent of two bits of information. More than one wire will never be asserted for a 1-of-N signal. Similarly, N-nary logic requires that a high voltage be asserted for all values, even 0. (Some versions of N-nary logic allow a "null" case, where no high voltage is asserted for an N-nary signal, which indicates that the N-nary signal has not yet evaluated, and is not required).

Any one N-nary gate may comprise multiple inputs and/or outputs. In such a case, a variety of different N-nary encodings may be employed. For instance, consider a gate that comprises two inputs and two outputs, where the inputs are a 1-of-4 signal and a 1-of-2 signal and the outputs comprise a 1-of-4 signal and a 1-of-3 signal. Various variables, including P, Q, R, and S, may be used to describe the encoding for these inputs and outputs. One may say that one input comprises 1-of-P encoding and the other comprises 1-of-Q encoding, wherein P equals two and Q equals four. Similarly, the variables R and S may be used to describe the outputs. One might say that one output comprises 1-of-R encoding and the other output comprises 1-of-S encoding, wherein R equals four and S equals 3. Through the use of these, and other, additional variables, it is possible to describe multiple N-nary signals that comprise a variety of different encodings.

SUMMARY OF THE INVENTION

The present invention comprises a method and apparatus that performs an arithmetic operation on two N-nary operands to generate a final result. The apparatus includes control logic that selects one or more groupings of two or more bits of the 1-of-P first operand and one or more groupings of two or more bits of the second 1-of-Q operand. The present invention also includes sum/bypass logic that performs an arithmetic operation on the selected groupings of bits from each operand to produce an intermediate sum. The arithmetic operation will comprise either addition or subtraction, depending on the value of an operation selector. In addition to the HPG signal generated by the sum/bypass logic, a block HPG indicator is generated by the present invention's HPG logic. The apparatus comprises a result logic that generates a 1-of-R final result. If the intermediate sum comprises fewer bits than the original operands, undisturbed bits of the original second operand are bypassed to the final result. Accordingly, the final result and the second operand have an equal number of bits, the additional "bypassed" bits of the second operand being selected according to the control logic.

BRIEF DESCRIPTION OF THE DRAWINGS

To further aid in understanding the invention, the attached drawings help illustrate specific features of the invention and the following is a brief description of the attached drawings:

FIG. 11 is a HIGH block Sum/Bypass LSD specialized adder/subtractor/bypass/HPG gate that implement dual-mode addition logic (straight and increment), carry propagate logic, dual-mode subtraction logic (three's complement and four's complement), and borrow propagate functions.

DETAILED DESCRIPTION OF THE INVENTION

The present invention relates to an N-nary merge adder/subtractor that selects various operations, each operation adding, subtracting, or passing various portions of a first N-nary number and a second N-nary number. In other words, an execution unit operates on portions of two operands, rather than on full operands. This type of operation is known as a partial register operation.

The conceptual framework for partial register handlers and their execution units is set forth in a copending patent application, U.S. patent application Ser. No. 09/195,757, filed Nov. 18, 1998, and titled "Method and Apparatus for Partial Register Write Handling" which is incorporated herein for all purposes and is hereinafter referred to as the "Partial Register Handling Patent." The partial result-merge adder of the present invention is suitable for inclusion in a N-nary partial-register handling system. Such a system may also include an N-nary register file, such as the N-nary register file described in a copending patent application, U.S. patent application Ser. No. 09/207,806, filed Dec. 9, 1998, now U.S. Pat. No. 6,104,642 and titled "Method and Apparatus for 1-of-4 Register File Design," which is incorporated herein for all purposes and is hereinafter referred to as the "Register File Patent."

This disclosure describes numerous specific details that include specific formats, structures, circuits, and logic functions in order to provide a thorough understanding of the present invention. One skilled in the art will appreciate that one may practice the present invention without these specific details. Additionally, this disclosure does not describe in detail some well-known structures such as N-FETs, P-FETs, nor does it describe N-nary logic in detail, in order not to obscure the present invention.

N-nary Logic Circuits

N-nary logic may be used to create circuits to perform a desired function. The present invention utilizes N-nary logic in the preferred embodiment of a three-logic-level 32-bit partial result merge adder. A background discussion of N-nary circuits is in order before discussing the adder/subtractor of the present invention.

Figure 1:
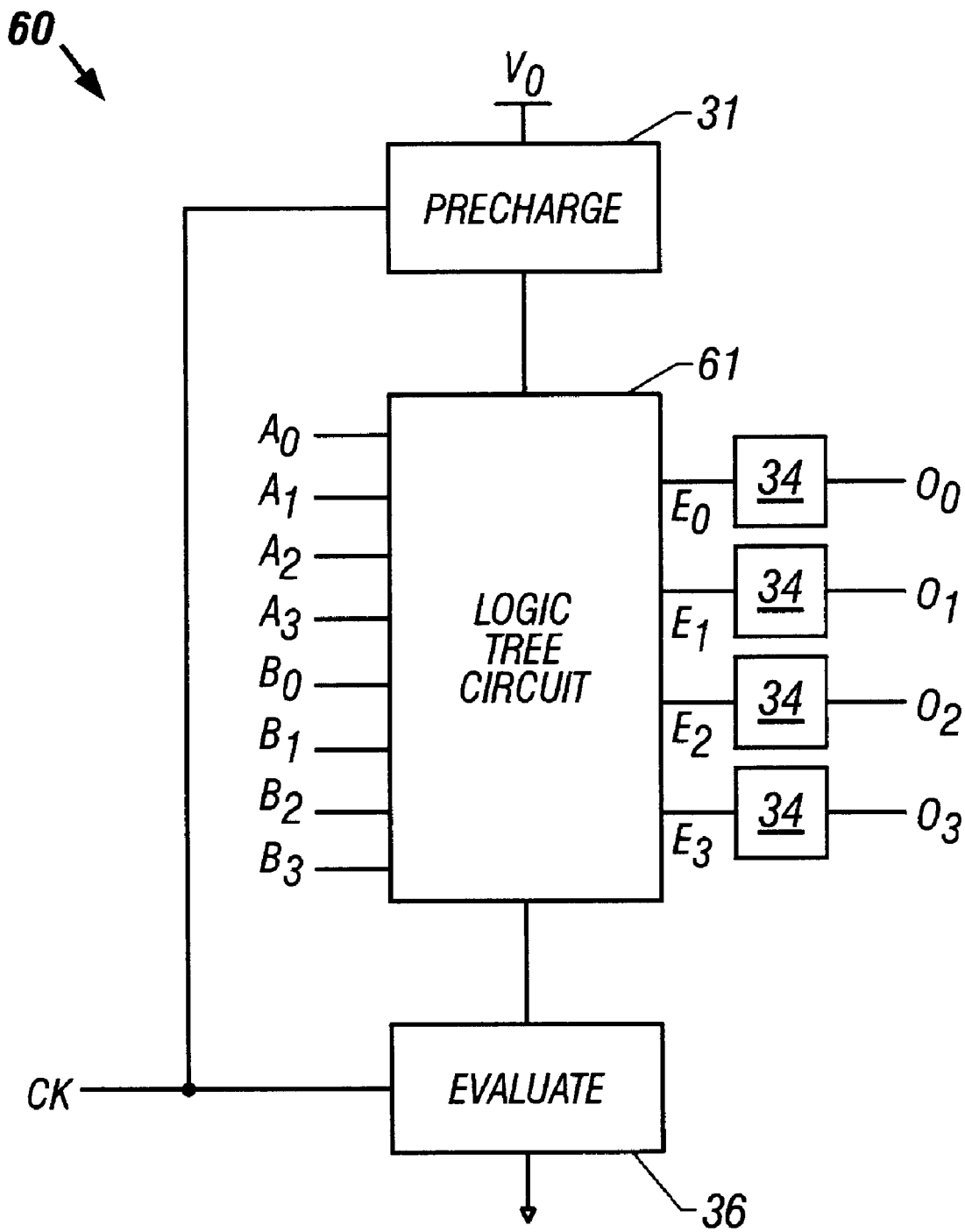
FIG. 1 is a block diagram of an N-nary gate.

FIG. 1 illustrates an N-nary logic gate 60 that uses two sets of 1-of-N signals for the inputs and produces one 1-of-N signal for the output. In gate 60, the A and B inputs comprise four wires each, with each set of wires representing 2 bits (one dit) of data. A is a one-dit input, B is a one-dit input, and O is a one-dit output. In other words, the gate 60 depicted in FIG. 1 comprises 4 input bits (2 dits) and 2 output bits (one dit).

Figure 2:
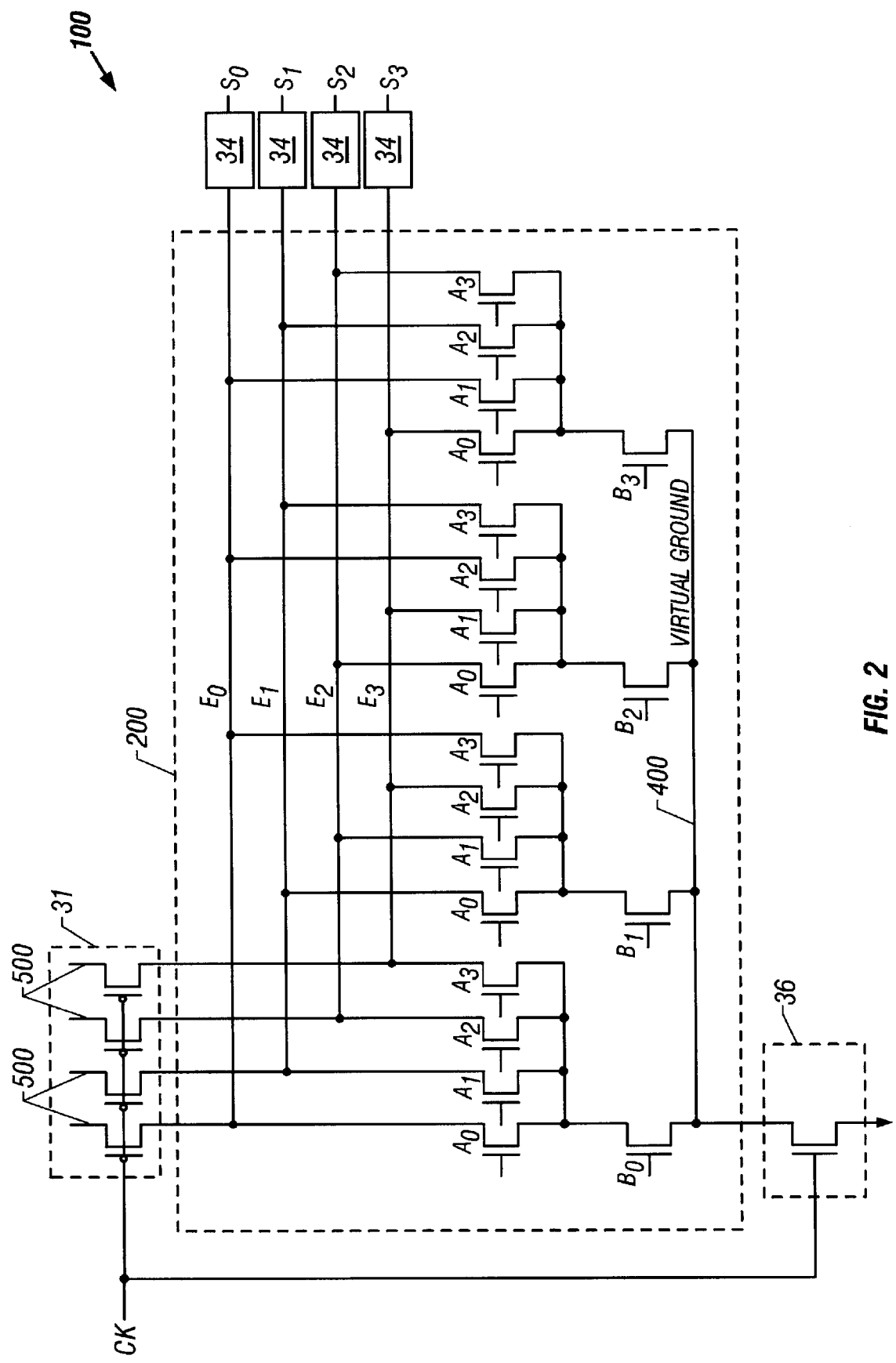
FIG. 2 is an illustration of an N-nary adder gate.

Referring to FIG. 1, each N-nary dit logic circuit 60 comprises a logic tree circuit 61, a precharge circuit 31, and an evaluate circuit 36. The logic tree circuit 61 performs a logic function on the two 1-of-4 input signals that could comprise a variety of functions, for example, the Boolean logic functions AND/NAND and OR/NOR, or the more complex add/subtract/carry-propagate function of the present invention. The logic gates of the N-nary family are clocked pre-charge (CP) gates. FIG. 2 illustrates that each input into the logic tree circuit 61 $A_0$–$A_3$, $B_0$–$B_3$ is coupled to at least one N-channel field effect transistor (NFET) $A_0$–$A_3$, $B_0$–$B_3$. Referring back to FIG. 1, the logic tree circuit 61 therefore comprises one or more N-channel FETS. Coupled to the wires of the 1-of-4 output signal are the output buffers 34 that aid in driving additional circuits that couple to the output signal. The preferred embodiment of the present invention uses a circuit with an inverting function as the output buffer 34.

Referring again to FIG. 1, a precharge circuit 31 couples to the logic tree circuit 61 and precharges the dynamic logic of the logic tree circuit 61. The precharge circuit 31 comprises one or more FETs with the preferred embodiment of the circuit comprising P-channel FETs (PFETs). Each evaluation path of the logic tree circuit 61 has its own precharge PFET, shown as 500 in FIG. 2. The PFETs 500 of the precharge circuit 31 quickly and fully precharge all of the dynamic logic in the logic tree circuit 61 during the precharge phase of the clock cycle.

FIG. 2 is a diagram of an N-nary adder gate. FIG. 2 illustrates that the precharge PFET 500 for an evaluation node E of an N-nary circuit is connected to positive high voltage, Vcc, and is used to create conductive paths between the evaluation node E and Vcc. Each precharge PFET 500 is coupled to an input, the pre-charge signal. When the pre-charge signal for any evaluate node has a low voltage, then there is a conductive path between Vcc and the evaluation node E. Coupled to the precharge circuit 31 is the clock signal CK. A low clock signal on CK will cause the FETs in the logic tree circuit 32 to charge when using P-channel FETs in the precharge circuit 31.

An evaluate circuit 36 couples to the logic tree circuit 61 and controls the evaluation of the logic tree circuit 61. The evaluate circuit 36 comprises one or more FETs connected to the CK signal, with the preferred embodiment of the evaluate circuit comprising a single N-channel FET. The single N-FET acts as an evaluation transistor that is used to control when the gate is sensitive to inputs, helps avoid races between other devices, and prevents excessive power consumption. During the precharge phase, the evaluate circuit 36 receives a low value so that no path to Vss may exist through the NFET(s) of the logic tree circuit 61. During the evaluate phase, the evaluate circuit 36 receives a high signal so that a path to Vss through the NFET(s) of the logic tree circuit 61 may exist. Coupled to the evaluate circuit 36 is the clock signal CK. A high clock signal on CK will cause the FETs in the logic tree circuit 61 to evaluate when using N-channel FETs in the evaluate circuit 36. In other words, when the clock signal is high, the evaluate circuit 36 evaluates the logic tree circuit 61.

An evaluate node, E, which comprises the four wires $E_0$, $E_1$, $E_2$, and $E_3$, is the signal pathway between the logic tree circuit 61 and an output buffer 34, and constitutes an evaluation path of the logic tree circuit 61. As stated earlier, each evaluation node wire $E_0$, $E_1$, $E_2$, and $E_3$ has its own precharge PFET. The signal on a particular wire, $E_0$, $E_1$, $E_2$, $E_3$ of the evaluate node E is high only when there is no connection to Vss through the logic tree circuit 61 NFET(s) associated with that particular wire. If the pre-charge signal is low at time 0 and there is no path to ground through the NFET(s) associated with an evaluate node E of the logic tree circuit 61, then the evaluate node wire E gets pulled to a high voltage. This is called the precharge phase of the gate and we may also say that the gate is in precharge mode. If the precharge signal switches to a high voltage at a later time, the evaluate node E will be floating but the charge left on it will leave the voltage high. This is called the evaluate phase of the gate, and we may also say that the gate is in evaluate mode. If input signals generate a high voltage for any NFET(s) in the logic tree circuit 61 such that a path from the evaluate node E to ground (Vss) exists, then the charge on the evaluate node E will drain to ground, and the evaluate voltage will drop to Vss. If no such path exists, then the evaluate node E will remain at Vcc. When any gate, therefore, switches from precharge mode to evaluate mode, the evaluate node voltage is high, and it either stays high or goes low. Once the evaluate node voltage goes low during the evaluate phase, it cannot be driven high again until the next precharge phase.

Figure 3:
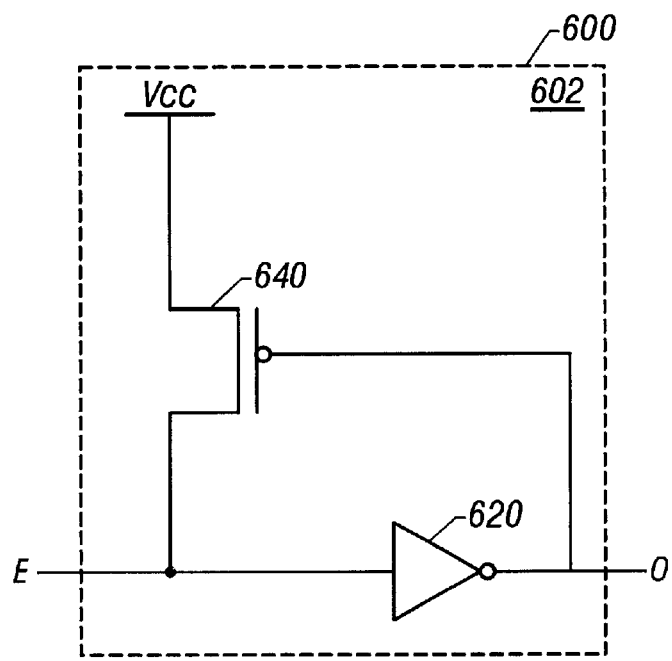
FIG. 3 is a diagram of a first embodiment of an N-nary output driver circuit, and in particular a half keeper output driver circuit that comprises an inverter and a PFET device.
Figure 4:
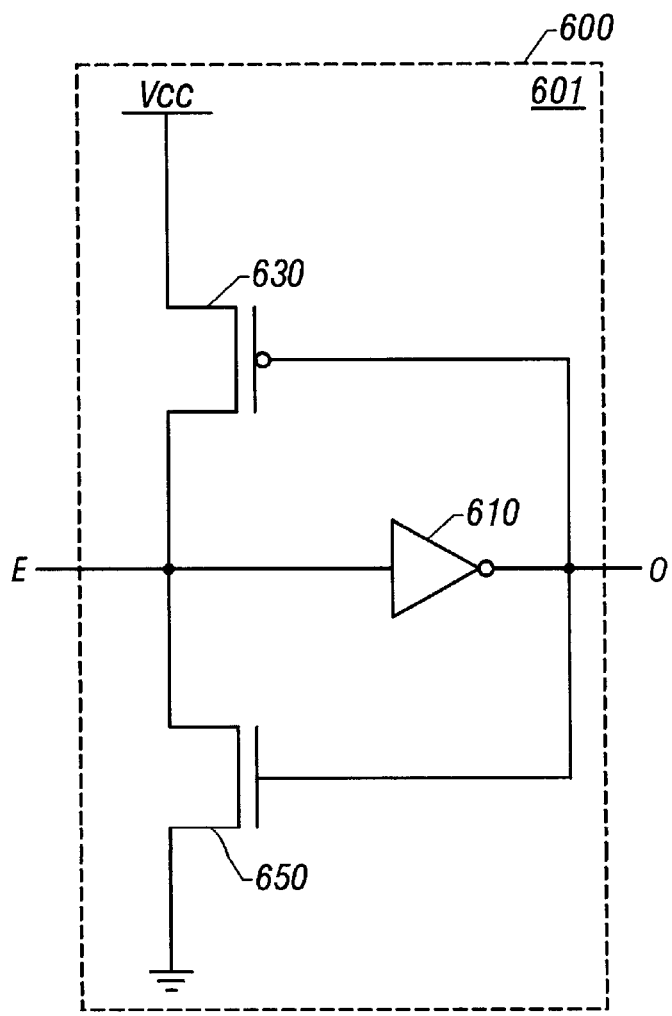
FIG. 4 is a diagram of a second embodiment of an N-nary output driver circuit, and in particular a full keeper output driver circuit that comprises an inverter coupled to a PFET device and an NFET device.

Each evaluate node wire $E_0$, $E_1$, $E_2$, and $E_3$ couples to an output buffer 34. Two embodiments of the output driver circuit 600 comprising the output buffer 34 are illustrated in FIGS. 3 and 4. FIG. 3 illustrates a half keeper output driver circuit 602 that comprises an inverter 620 and a PFET device 640. FIG. 4 illustrates a full keeper output driver circuit 601 that comprises an inverter 610 coupled to a PFET device 630 and an NFET device 650. Full keeper circuits 601 are necessary for gates that can be in neither evaluate nor precharge mode for lengthy periods. The flow through the output driver circuit 600 is from evaluate node E to the output signal path O. The inverter 610, 620 of the output driver circuit 600 is necessary because the evaluate nodes of CP gates of the N-nary logic family precharge to a high value and evaluate to a low value. The output driver circuit 600 of the output buffer 34 holds the value of an evaluate node E during an evaluate phase if the evaluate node E has not discharged. If the evaluate node E has discharged, then there is a path to ground holding its value low. The output of each evaluate node E will switch from low to high once, at most, during an evaluate phase. The output of each evaluate node E, once coupled to an output driver circuit 600 of an output buffer 34, is therefore suitable for feeding a subsequent CP gate.

Figure 5:
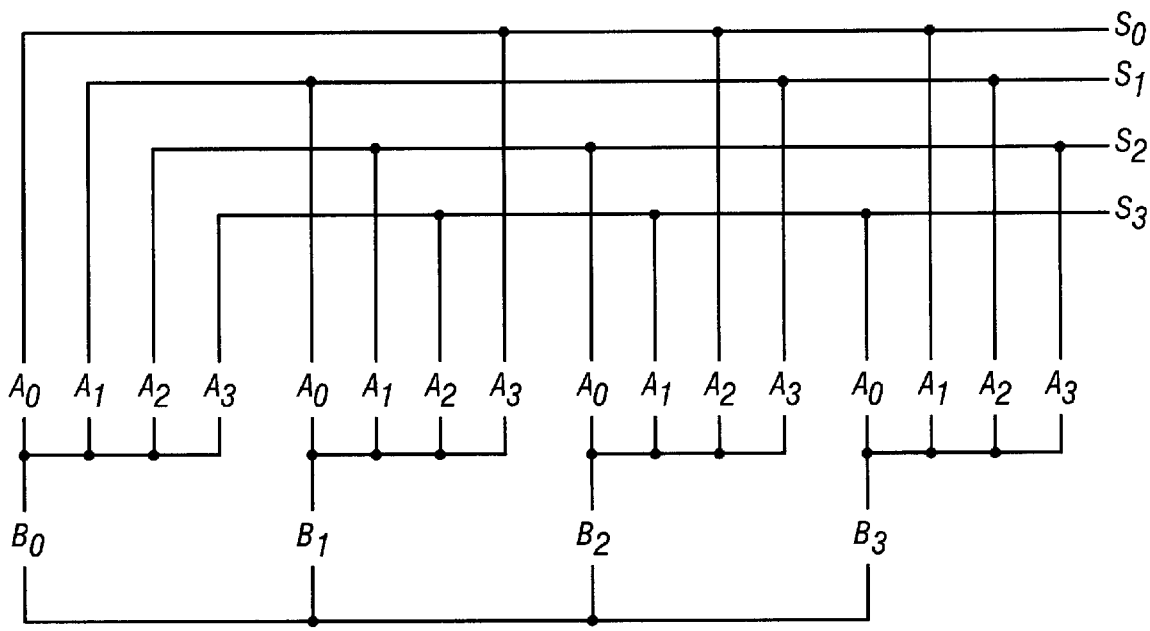
FIG. 5 is a shorthand representation of an N-nary adder gate having two 1-of-4 inputs that uses 1-of-4 logic to perform an addition function on two two-bit 1-of-4 inputs to generate a two-bit 1-of-4 output signal.
Figure 8:
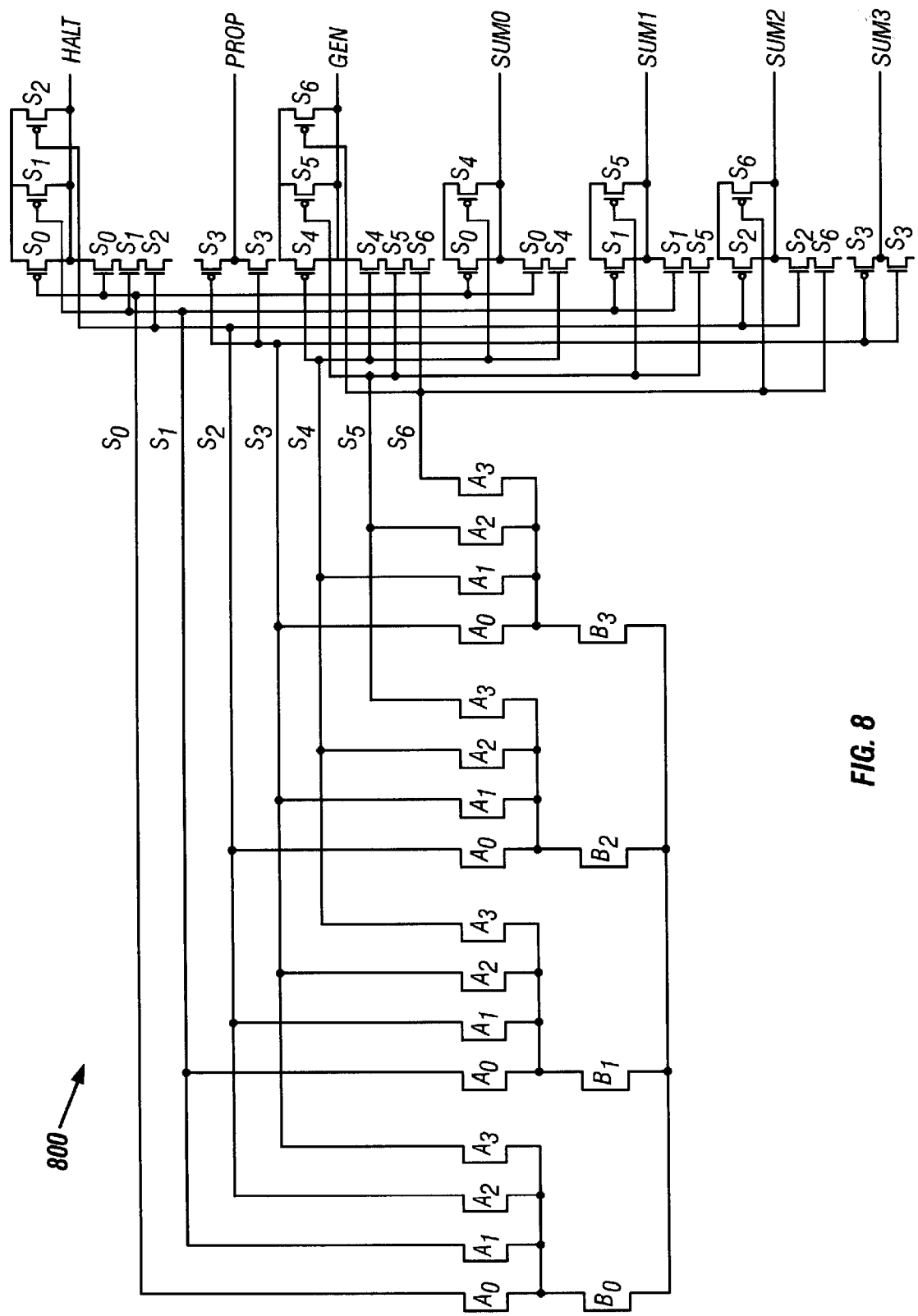
FIG. 8 is a modified shorthand representation of an N-nary sum/HPG gate having two 1-of-4 inputs.

A shorthand notation for N-nary circuit diagrams can be adopted to avoid needless repetition of elements common to all N-nary circuits. FIG. 2 illustrates these common elements. One common element is the precharge P-FET 500. Precharge P-FETs 500 are required for each evaluate node E in every 1-of-N gate. Since all N-nary gates require a pre-charge P-FET 500 for each evaluate node E, the precharge P-FETs 500 may be implied and need not be shown. The same is true for the N-FET associated with each input wire of the A and B inputs. Similarly, each evaluate node E must have its own output buffer 34, which may be implied. The N-FET associated with the evaluate node 36 may also be implied. Since these features are common to all N-nary circuits, we may use the shorthand shown in FIG. 5 to represent the N-nary circuits. Accordingly, FIG. 5 illustrates a shorthand notation of the adder gate depicted in FIG. 2. FIG. 8 uses a modified shorthand representation in which N-FETS associated with certain inputs are expressly represented, but all other elements discussed herein are implied. In each figure, the elements discussed herein should be implied accordingly.

Figures 6, 7:
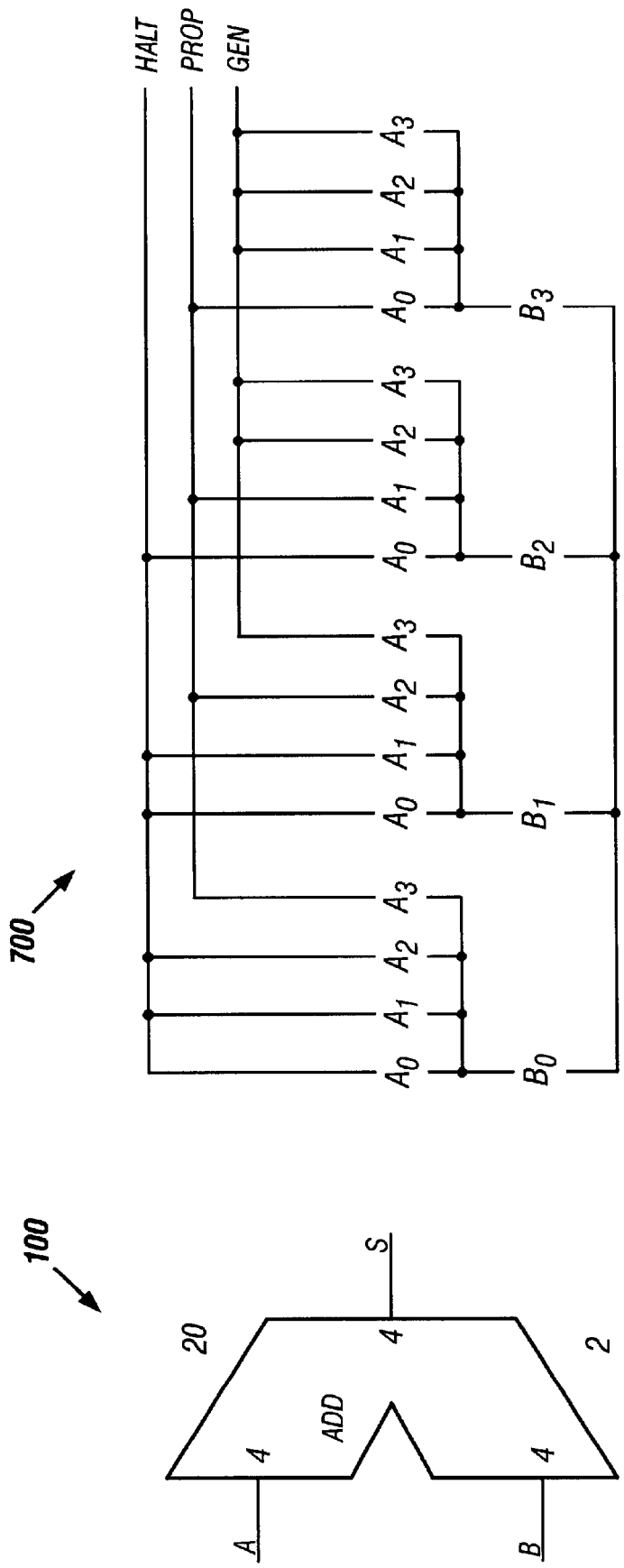
FIG. 6 is a high-level shorthand representation of an N-nary adder gate, and a further simplification to the representation of the FIG. 2 adder.
FIG. 7 is a shorthand representation of an N-nary HPG gate having two 1-of-4 inputs.

A further simplification to the representation of the FIG. 2 adder is shown in FIG. 6, where the inputs and outputs are shown as single signals that each can represent one of four signals and each implicitly comprises four wires. The number "4" shown within the add gate of FIG. 6, adjacent to the connections, indicates that each signal can represent one of four values. The number above the gate indicates the number of transistors in the evaluate stack, and the number below the FIG. 6 gate represents the maximum number of transistors in series between the evaluate node and virtual ground. This high level shorthand notation is also used in FIGS. 9–11 and 12–22, including 12A, 14A, 15A, and 18A–18C. In those figures, the elements discussed herein should be implied accordingly.

Overview of Preferred Embodiment

The present invention ("Merge Adder") 101 adds or subtracts all, or a portion of, two N-nary 32-bit input operands and produces an N-nary result. The N-nary result produced by the present invention is a 32-bit result that includes the result of the addition or subtraction operation and may also include other N-nary signals. That is, if the operation is performed on less than all 32 bits of the operands, the remaining operand bits for one of the operands are merely passed through the adder/subtractor undisturbed and will occupy the destination register along with the bits reflecting the arithmetic result of the add/subtract operation. (The same register that contains the source operand to be bypassed will also contain the result after the add/subtract operation is completed).

This concept, known as destination-result merging, is accomplished in the present invention in two separate phases. In the first phase of destination-result merging, the adder/subtractor uses control signals to identify the bits of the source operand to be bypassed and, in contrast, the bits of the source operand to be processed in the add or subtract operation. At this point, the adder/subtractor adds the requisite operands bits, depending on whether the control signals indicate that an extended register, standard register, or byte operation is to be performed. The adder/subtractor simultaneously passes the remaining operand dits through to the adder/subtractor's next logic level undisturbed. The second phase of destination-result merging addresses the concept of carry-lookahead logic, which is described more fully below. In the second phase of destination-result merging, the adder/subtractor prevents carries propagated by the addition or subtraction of the desired operand bits from inadvertently causing bypassed operand bits to be incremented.

FIG. 14 illustrates the general structure of the adder/subtractor 101 of the present invention (sometimes referred to hereinafter as "Merge Adder" or simply as "adder"). In FIG. 14, input operands and the result(s) are represented in 1-of-4 encoding such that each input and output signal represents two logical bits of information. All intermediate signals used in the adder 101 are 1-of-N encoded. The level of granularity for the input operands shown in FIG. 14 is the 1-of-4 input level or "dit" level, where one dit comprises one 1-of-4 signal, which represents two bits of information. The adder 101 was constructed in three levels of logic in the preferred embodiment, referred to in FIG. 14 as "Sum/Bypass Logic," "HPG Logic," and "Result Logic".

The broad function performed by each of the three logic levels shown in FIG. 14 is as follows. The Sum/Bypass Logic performs operation size detection to determine whether a full EX operation, or some smaller operation, is to be performed. The function of the adder is entirely determined by the five "add/subtract/pass" control inputs and the "size" control input illustrated in FIG. 14. For an EX operation, the Sum/Bypass Logic forms intermediate sums or differences and ditwise HPG indicators for all operand dits. For anything less than a full EX operation, the Sum/Bypass Logic forms intermediate sums or differences and ditwise halt-propagate-generate (HPG) indicators for selected bits of the operands. The intermediate sums do not take carry propagation into account. The Sum/Bypass Logic passes the value of the remaining operand bits of a partial register operation through to the next logic level undisturbed. The second logic level, the HPG Logic, performs block HPG signal formation. This logic generates two block HPG indicators for the HIGH and LOW portions of the adder, an architecturally correct block HPG indicator and a functionally correct HPG indicator. The functional HPG indicator forces the HPG indicator generated by the most significant block of the intermediate sum for a partial register operation to a "HALT" so that bypassed operand bits are not inadvertently incremented. In all adder portions that process operand LSD's for one or more different types of partial register operation, the HPG Logic in addition to forming a block HPG indicator, increments the value of intermediate sum dits upon propagation of a carry into the dit. For adder portions that do not process an operand LSD, this logic is performed in the Result Logic.

Finally, the Result Logic performs result resolution logic to ensure that the intermediate sum ultimately resides in the proper dits of the destination register. This result resolution logic is necessary to properly process both MIXL and LOW and both MIXH and HIGH operations within the same adder/subtractor. The MIXL, LOW, MIXH, and HIGH operations are each described in further detail below. For the TOP and HIGH portions of the adder, the Result Logic increments the intermediate sum for dits into which a carry has propagated. Following a discussion of the various partial register operations supported by the present invention, the function of each level of logic is discussed in further detail below.

Partial Register Operations

Because it supports variable-sized operands, the present invention supports a variety of add and subtract variations. For instance, the control inputs into the adder 101 may indicate that the high byte H of one operand is to be added to the high byte H of the second operand, and the result is to be stored in the high byte H of the register containing the second operand. This type of operation is a HIGH add operation. The present invention 101 supports five other categories of operations besides the HIGH operation. These six operation categories, and their functions, are set forth in Table 3.

TABLE 3

| CATEGORY | FUNCTION |
|---|---|
| LOW | AL, BL --> BL |
| HIGH | AH, BH --> BH |
| STANDARD | AX, BX --> BX |

TABLE 3-continued

| CATEGORY | FUNCTION |
|---|---|
| EXTENDED | EAX, BBX --> EBX |
| MIX-L | AH, BL --> BL |
| MIX-H | AL, BH --> BH |

For purposes of the following discussion, we will assume that the first source-operand is stored in register EAX and the second source operand is stored in register EBX. Table 3 illustrates that the present invention 101 stores the result of each operation in the register EBX in which the second operand was originally stored. In this manner, the register EBX holding the second operand also becomes the destination register EBX for the operation's final result. Table 3 illustrates that the LOW operation adds/subtracts the A operand's low byte (four least significant dits/eight least significant bits), illustrated as L in FIG. 11A, to/from the low byte L of the B operand and stores the result of such operation in the low byte L of the register EBX in which the B operand was originally stored. To generate the final result in EBX, the present invention 101 concatenates Bits 8 through 31 of the second operand with the eight-bit (four-dit) result, where the result is stored in Bits 0 through 7 of EBX. In order to facilitate the concatenation such that the original Bits 8 through 31 of the second operand are undisturbed, the HPG Logic shown in FIG. 14 generates a functional block HPG indicator that prevents a carry from propagating out of Bit 8 of the intermediate result.

Figure 11A:
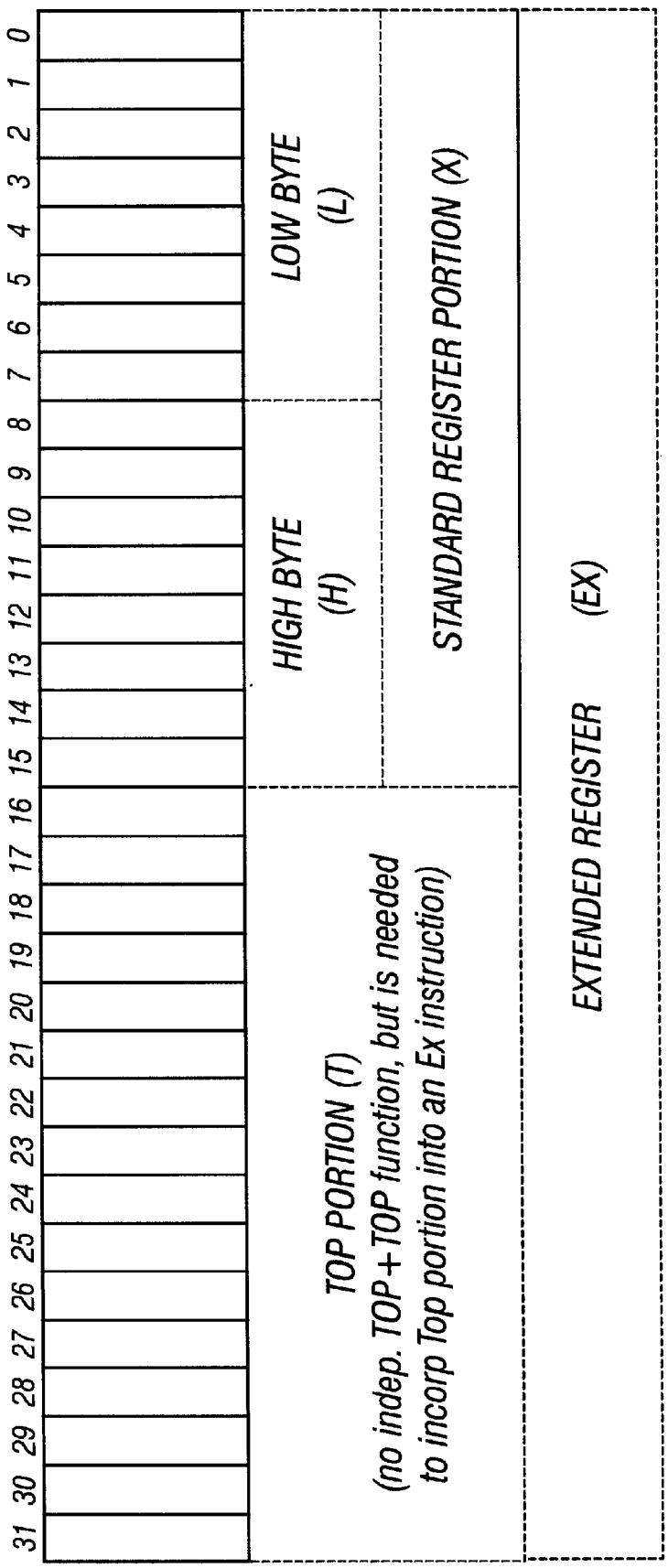
FIG. 11A is a representation of a register.

Table 3 illustrates that the HIGH operation adds/subtracts the high byte (dits 4 through 7, bits 8 through 15), illustrated as H in FIG. 11A, of the A operand to/from the high byte H of the B operand and stores the result of such operation in the high byte H of the register EBX in which the B operand was originally stored. To generate the final result in EBX, the present invention 101 concatenates Bits 0 through 7 and Bits 16 through 31 of the second operand with the eight-bit (four-dit) result, where the result is stored in Bits 8 through 15 of EBX. In order to facilitate the concatenation such that the original Bits 0 through 7 and Bits 16 through 31 of the second operand are undisturbed, the HPG Logic shown in FIG. 14 generates a functional block HPG indicator that prevents a carry from propagating out of Bit 15 of the intermediate result.

Table 3 illustrates that the STANDARD operation adds/subtracts the standard portion (dits 0 through 7, bits 0 through 15), illustrated as X in FIG. 11A, of the A operand to/from the standard portion X of the B operand and stores the result of such operation in the standard portion X of the register EBX in which the B operand was originally stored. To generate the final result in EBX, the present invention 101 concatenates Bits 16 through 31 of the second operand with the sixteen-bit (eight-dit) result, where the result is stored in bits 0 through 15 of EBX. In order to facilitate the concatenation such that the original Bits 16 through 31 of the second operand are undisturbed, the HPG Logic shown in FIG. 14 generates a functional block HPG indicator that prevents a carry from propagating out of Bit 15 of the intermediate result.

Table 3 illustrates that the EXTENDED operation adds/subtracts all 32 bits (dits 0 through 15, bits 0 through 31), illustrated as EX in FIG. 11A, of the A operand to/from all 32 bits EX of the B operand and stores the result of such operation in the register EBX in which the B operand was originally stored. In the full-register EXTENDED operation, there is no need to concatenate bits in the result register, nor suppress block HPG indicators.

Table 3 illustrates that the MIX-H operation adds/subtracts the low byte (dits 0 through 3, bits 0 through 7), illustrated as L in FIG. 11A, of the A operand to/from the high byte H (dits 4 through 7, bits 8 through 15), illustrated as H in FIG. 11A, of the B operand and stores the result of such operation in the high byte H of the register EBX in which the B operand was originally stored. As with the HIGH instruction, the present invention 101 generates the final result of a MIX-H operation in EBX by concatenating Bits 0 through 7 and Bits 16 through 31 of the second operand with the eight-bit (four-dit) result, where the result is stored in Bits 8 through 15 of EBX. In order to facilitate the concatenation such that the original Bits 0 through 7 and Bits 16 through 31 of the second operand are undisturbed, the HPG Logic shown in FIG. 14 generates a functional block HPG indicator that prevents a carry from propagating out of Bit 15 of the intermediate result.

Table 3 illustrates that the MIX-L operation adds/subtracts the high byte H (dits 4 through 7, bits 8 through 15), illustrated as H in FIG. 11A, of the A operand to/from the low byte L (four least significant dits/eight least significant bits), illustrated as L in FIG. 1A, of the B operand and stores the result of such operation in the low byte L of the register EBX in which the B operand was originally stored. To generate the final result in EBX, the present invention 101 concatenates Bits 8 through 31 of the second operand with the eight-bit (four-dit) result, where the result is stored in Bits 0 through 7 of EBX. In order to facilitate the concatenation such that the original Bits 8 through 31 of the second operand are undisturbed, the HPG Logic shown in FIG. 14 generates a functional block HPG indicator that prevents a carry from propagating out of Bit 8 of the intermediate result.

Table 3 illustrates that the bit positions within EBX where the second operand resides determine the ultimate bit positions where the 8-bit result of the operation will be stored. For example, when the present invention 101 operates upon source operand bits residing in BH, which refers to Bits 8 through 15 of the second operand, then the present invention 101 stores the result of the operation in BH, overwriting the original operand value. Similarly, when the present invention 101 operates upon BL, which refers to Bits 0 through 7 of the second operand, then the present invention 101 stores the result of the operation in BL, overwriting the original operand value.

FIG. 14 illustrates that each of the adder's 101 logic levels conceptually may be further grouped into "blocks." Blocks represent: a) certain corresponding dits of the two 32-bit 1-of-4 operands, and b) the logic gates of each logic level associated with such dits. These blocks are labeled in FIG. 14 as the MIXL, LOW, MIXH, HIGH, AND TOP blocks. FIG. 14 illustrates that the TOP block is further grouped into a least-significant sub-block, TOP0, and a most-significant sub-block, TOP1. FIG. 14 illustrates that the present invention 101 consists essentially of a 32-bit adder, similar to that disclosed in the Adder Patent, interspersed with two 8-bit adders to handle the MIX-L and MIX-H operations. FIG. 14 further illustrates that the blocks of the present invention 101 that functionally comprise the 32-bit adder comprise the LOW, HIGH, and TOP blocks. The MIXL and MIXH blocks comprise the two 8-bit adders.

The least significant block of the 32-bit adder, LOW, represents the four least significant dits of each operand, dits 0 through 3 (comprising bits 0 through 7), along with the Sum/Bypass Logic, HPG Logic, and Result Logic gates of the 32-bit adder associated with said dits. Similarly, the HIGH block represents dits 4 through 7 (bits 8 through 15) of the A and B operands and also represents the Sum/Bypass Logic, HPG Logic, and Result Logic gates of the 32-bit adder associated with dits 4 through 7. By the same token, the TOP0 block represents dits 8 through 11 (bits 16 through 23) of the A and B operands and associated 32-bit adder gates, while the TOP1 block represents dits 12 through 15 (bits 24 through 31) of the A and B operands and associated 32-bit adder gates.

The operand bits operated upon by the mixed-alignment byte blocks, MIXL and MIXH, are as follows. The MIXL block represents dits 0 through 3 of the B operand and dits 4 through 7 of the A operands. The MIXL block further represents the Sum/Bypass Logic, HPG Logic, and Result Logic gates of the MIXL 8-bit adder. The MIXH block represents dits 4 through 7 of the B operand and dits 0 through 3 of the A operands. The MIXH block further represents the Sum/Bypass Logic, HPG Logic, and Result Logic gates of the MIXH 8-bit adder.

FIG. 14 therefore illustrates that Dits 0 through 3 of the B operand are wired as inputs into two separate blocks of the present invention 101, the MIXL block and the LOW block. Similarly, FIG. 14 illustrates that Dits through 7 of the A operand are wired as inputs into two separate blocks of the present invention 101: the MIXL block and the HIGH block. FIG. 14 also illustrates that Dits 0 through 3 of the A operand are wired as inputs into two separate blocks of the present invention 101, the MIXH block and the LOW block. Similarly, FIG. 14 illustrates that Dits 4 through 7 of the B operand are wired as inputs into two separate blocks of the present invention: the MIXH block and the HIGH block. Dits 16 through 31 of both the A and B operands are only wired as inputs into the TOP block.

Table 3 illustrates that all possible 8-bit addition/subtraction operations are represented with the LOW, HIGH, MIX-L, and MIX-H categories of operations. FIG. 14 and Table 3 illustrate that one may easily correlate the categories listed in Table 3 with the block in FIG. 14 that performs the processing for that category. The MIXL block performs processing the MIX-L operation. Similarly, the LOW operation is performed by the LOW block, the MIX-H operation is performed by the MIXH block, and the HIGH operation is performed by the HIGH block. The blocks that are involved solely in byte adds, MIXL and MIXH, need not propagate carries to any other block because addition will not be performed in any more significant block. These blocks MIXL, MIXH therefore do not generate functional HPG indicators. FIG. 14 therefore illustrates that the MIXL block produces only one block carry indicator, Cmixl, and the MIXH block produces only one block carry indicator, Cmixh. Cmixl and Cmixh are architectural HPG indicators that are passed to carry out gate 970.

Conceptually, the correlation between blocks and categories is more complicated for multibyte operations: STANDARD and EXTENDED. The STANDARD operation is performed by the LOW block and the HIGH block, with any carry generated by the LOW block being propagated to the HIGH block via the LOW block's functional HPG indicator, Clow.high. The EXTENDED operation is performed by the LOW block, the HIGH, block, and the TOP block, similar to the 32-bit operation disclosed in the Adder Patent. Any carry generated by the LOW block is propagated to the HIGH block via the LOW block's functional HPG indicator, Clow.high, and also propagated to the TOP block via the LOW block's functional HPG indicator, Clow.top. (Two functional HPG indicators are provided from the LOW block because in the case of the STANDARD operation, any carry from the LOW block must propagate only to the HIGH block, without propagating into the TOP block. In this case, Clow.high may indicate a carry, while Clow.top does not.) Any carry generated by the HIGH block is propagated to the TOP block via the HIGH block's functional HPG indicator, Chigh.top. When the LOW or HIGH block is involved solely in an 8-bit operation, that block's functional HPG indicator will reflect a "HALT" value. FIG. 14 illustrates that, in addition to functional HPG indicators, the LOW and HIGH blocks also generate architectural HPG indicators, Clow.out and Chigh.out, respectively.

Before we turn to a detailed discussion of each logic level of the present invention 101, a brief discussion of the control inputs into the present invention 101 is in order. For each operation, the present invention 101 provides an entire 32-bit (sixteen dit) N-nary number, regardless of the category of operation being performed. The output of the adder 101 comprises the result of the desired operation concatenated with any bits of the second operand that were not used in the operation. We say that such unused operand bits are "bypassed." In order to indicate to a particular block of the present invention 101 that operand bits are to be bypassed by that block, the control logic asserts an input wire indicating that the block should "pass."

The function of the adder 101 is entirely determined by the values of the four 1-of-3 add/sub/pass inputs, one into each block except the HIGH block, the HIGH block's 1-of-5 ADD8/ADD1632/SUB8/SUB1632/PASS input, and the 1-of-6 carry out indicator labeled as "size" in FIG. 14. If a block is to perform part or all of an operation, the "add" or "sub" wire of its add/sub/pass input will be asserted by control logic, depending on which arithmetic operation is desired. If the block's arithmetic logic is not necessary to performance of the desired operation, then control logic will assert the "pass" wire of that block's add/sub/pass input, indicating that the block is to pass the original B operand values, unaltered, to the next logic level. (When performing a pass operation, the block behaves more like a multiplexer in which the received portion of second operand is selected.) Table 4 illustrates the state of each block's add/sub/pass control input ("a/s/p") for each of the six operation categories supported by the present invention 101.

TABLE 4

| CATEGORY | FUNCTION | TOP a/s/p | HIGH a/s/p | MIXH a/s/p | MIXL a/s/p | LOW a/s/p |
|---|---|---|---|---|---|---|
| LOW | AL, BL --> BL | pass | pass | pass | pass | add/sub |
| MIX-L | AH, BL --> BL | pass | pass | pass | add/sub | pass |
| MIX-H | AL, BH --> BH | pass | pass | add/sub | pass | pass |
| HIGH | AH, BH --> BH | pass | add/sub | pass | pass | pass |
| STANDARD | AX, BX --> BX | pass | add/sub | pass | pass | add/sub |
| EXTENDED | EAX, EBX --> EBX | add/sub | add/sub | pass | pass | add/sub |

Sum/Bypass Logic—Overview

The Sum/Bypass logic illustrated in FIG. 14 generates a one-dit intermediate sum (or difference, in the case of subtraction) from one dit of operand A and one dit of operand B. If a block is bypassing, then the first-level gates for that block generate as the intermediate sum the bypassed B operand values for that block. The gates 900, 910, 920 that generate this intermediate sum are discussed in greater detail below. The intermediate sum produced by Level One does not account for carry (or borrow) conditions, as this will be added in a later level of logic. Instead, a (H)alt, P(ropagate), and (G)enerate status is derived for each dit position. The meaning of this HPG status is discussed in greater detail below in the discussion of carry-propagate logic.

N-nary Addition Logic

The Sum/Bypass logic of the present invention implements both addition and subtraction using N-nary logic. Our discussion of Sum/Bypass logic will begin with the addition function. A truth table demonstrating the add operation using 1-of-4 encoding is set forth in Table 5. Each of the two-bit 1-of-4 inputs, A and B, in Table 5 can represent one of four values, 0 through 3 inclusive, depending on which of the four wires for each signal is set high. Table 5 discards any potential input value that includes more than one wire asserted for each 1-of-4 signal, such as 1111 and 0101. Such values are undefined for the evaluate stage of 1-of-4 logic gates. The four wires for the two-bit sum of the 1-of-4 addition operation in Table 5 are labeled $S_3$, $S_2$, $S_1$, and $S_0$.

TABLE 5

| $A_3$ | $A_2$ | $A_1$ | $A_0$ | A Dec. Value | $B_3$ | $B_2$ | $B_1$ | $B_0$ | B Dec. Value | $S_3$ | $S_2$ | $S_1$ | $S_0$ | Output Decimal Value |
|---|---|---|---|---|---|---|---|---|---|---|---|---|---|---|
| 0 | 0 | 0 | 1 | 0 | 0 | 0 | 0 | 1 | 0 | 0 | 0 | 0 | 1 | 0 |
| 0 | 0 | 0 | 1 | 0 | 0 | 0 | 1 | 0 | 1 | 0 | 0 | 1 | 0 | 1 |
| 0 | 0 | 0 | 1 | 0 | 0 | 1 | 0 | 0 | 2 | 0 | 1 | 0 | 0 | 2 |
| 0 | 0 | 0 | 1 | 0 | 1 | 0 | 0 | 0 | 3 | 1 | 0 | 0 | 0 | 3 |
| 0 | 0 | 1 | 0 | 1 | 0 | 0 | 0 | 1 | 0 | 0 | 0 | 1 | 0 | 1 |

TABLE 5-continued

| $A_3$ | $A_2$ | $A_1$ | $A_0$ | A Dec. Value | $B_3$ | $B_2$ | $B_1$ | $B_0$ | B Dec. Value | $S_3$ | $S_2$ | $S_1$ | $S_0$ | Output Decimal Value |
|---|---|---|---|---|---|---|---|---|---|---|---|---|---|---|
| 0 | 0 | 1 | 0 | 1 | 0 | 0 | 1 | 0 | 1 | 0 | 1 | 0 | 0 | 2 |
| 0 | 0 | 1 | 0 | 1 | 0 | 1 | 0 | 0 | 2 | 1 | 0 | 0 | 0 | 3 |
| 0 | 0 | 1 | 0 | 1 | 1 | 0 | 0 | 0 | 3 | 0 | 0 | 0 | 1 | 0* |
| 0 | 1 | 0 | 0 | 2 | 0 | 0 | 0 | 1 | 0 | 0 | 1 | 0 | 0 | 2 |
| 0 | 1 | 0 | 0 | 2 | 0 | 0 | 1 | 0 | 1 | 1 | 0 | 0 | 0 | 3 |
| 0 | 1 | 0 | 0 | 2 | 0 | 1 | 0 | 0 | 2 | 0 | 0 | 0 | 1 | 0* |
| 0 | 1 | 0 | 0 | 2 | 1 | 0 | 0 | 0 | 3 | 0 | 0 | 1 | 0 | 1* |
| 1 | 0 | 0 | 0 | 3 | 0 | 0 | 0 | 1 | 0 | 1 | 0 | 0 | 0 | 3 |
| 1 | 0 | 0 | 0 | 3 | 0 | 0 | 1 | 0 | 1 | 0 | 0 | 0 | 1 | 0* |
| 1 | 0 | 0 | 0 | 3 | 0 | 1 | 0 | 0 | 2 | 0 | 0 | 1 | 0 | 1* |
| 1 | 0 | 0 | 0 | 3 | 1 | 0 | 0 | 0 | 3 | 0 | 1 | 0 | 0 | 2* |

In Table 5, output values with asterisks indicate that a carry is conceptually generated into a higher-order bit representing a decimal value of 4.

Illustration: Basic N-nary Adder Gate

Figure 5A:
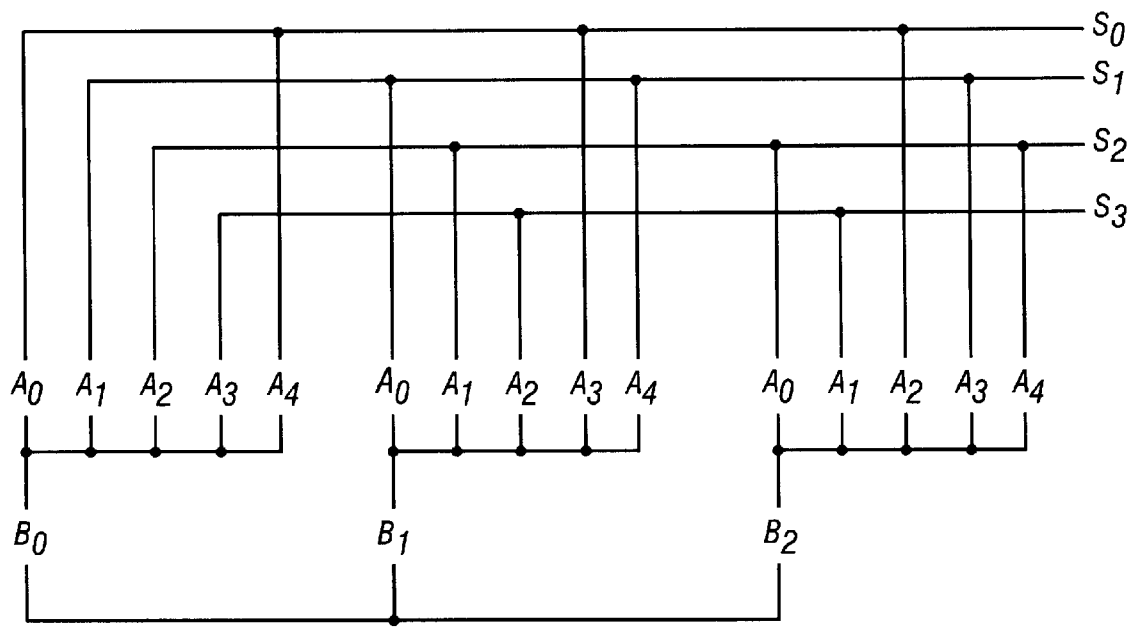
FIG. 5A is a shorthand representation of an N-nary adder gate having one 1-of-3 input and one 1-of-5 input, that generates a two-bit 1-of-4 output signal.

FIG. 5 illustrates an N-nary adder circuit 100 that uses 1-of-4 logic to perform the addition function on two two-bit 1-of-4 inputs to generate a two-bit 1-of-4 output signal conforming to Table 5. A similar function may be performed with a gate 102 that takes one 1-of-3 input and one 1-of-5 input. Such a gate 102 is illustrated in FIG. 5A. The function of the adder circuit 100 illustrated in FIG. 5 is to add two 1-of-4 inputs and produce the least significant two bits of the sum, which is also implemented as a 1-of-4 signal. Since the adder circuit 100 operates on two four-value signals it is not appropriate to refer to it as binary. The function of the adder gate 100 is quaternary, rather than binary.

The adder circuit 100 illustrated in FIG. 5 has an A input signal comprising four wires, $A_0$, $A_1$, $A_2$, and $A_3$, and a B input signal comprising four wires, $B_0$, $B_1$, $B_2$, and $B_3$. The A input signal and the B input signal can each represent any integer having a decimal value between zero and three, inclusive. Since N-nary logic requires that only one of the four wires representing the A input be asserted at any one time, and only one of the B input wires be asserted at one time, it is convenient to treat the A and B signals as individual inputs that each can represent one of four values. The adder circuit 100 therefore has eight inputs: $A_0$, $A_1$, $A_2$, $A_3$, $B_0$, $B_1$, $B_2$, and $B_3$. If the value of zero, then the $A_0$ wire is set high and all other A wires, $A_1$, $A_2$, $A_3$, are set low. By the same token, the $B_0$ wire corresponds to zero. Similarly, the $A_1$ wire and $B_1$ wire correspond to the decimal value of one. The $A_2$ wire and $B_2$ wire correspond to the decimal value of two. Finally, the $A_3$ wire and $B_3$ wire correspond to the decimal value of three. The adder circuit 100 illustrated in FIG. 5 performs the following logic functions:

$S_0 = B_0 A_0 | B_1 A_3 | B_2 A_2 | B_3 A_1$ (all cases that equal 0 or 4), $S_1 = B_0 A_1 | B_1 A_0 | B_2 A_3 | B_3 A_2$ (all cases that equal 1 or 5), $S_2 = B_0 A_2 | B_1 A_1 | B_2 A_0 | B_3 A_3$ (all cases that equal 2 or 6), and $S_3 = B_0 A_3 | B_1 A_2 | B_2 A_1 | B_3 A_0$ (all cases that equal 3).

Carry Propagate Logic

The adder gate in FIG. 5 is not complete for the purposes of the present invention because it does not provide any information as to whether the sum is too large to represent in two bits of information. In other words, the FIG. 5 adder does not support the carry conditions denoted by asterisks in Table 5. For the addition function of the present invention, what is required is an adder gate that can not only sum two one-dit numbers, but can utilize carry-propagate techniques to account for carry conditions. This is accomplished through the use of carry propagate logic, as described below.

Carry propagate logic takes carry conditions into account. For any two binary numbers A and B, the sum, $S_n$, and the carry, $C_n$, for a given bit position, n, are:

$S_n = A_n \oplus B_n \oplus C_{n-1}$, where $C_{n-1}$ is the carry in from the previous bit, $n-1$. (1)

$C_n = A_n B_n | A_n C_{n-1} | B_n C_{n-1}$, where $C_n$ is the carry out from bit $n$ (2)

The binary truth tables for Equation 1 and Equation 2 are set forth in Table 6.

TABLE 6

| $A_n$ | $B_n$ | $C_{n-1}$ | $A_n B_n$ (1) | $A_n C_{n-1}$ (2) | $B_n C_{n-1}$ (3) | $A_n \oplus B_n$ (4) | $S_n =$ (4) $\oplus$ $C_{n-1}$ | $C_n =$ (1)\|(2)\|(3) |
|---|---|---|---|---|---|---|---|---|
| 0 | 0 | 0 | 0 | 0 | 0 | 0 | 0 | 0 |
| 0 | 0 | 1 | 0 | 0 | 0 | 0 | 1 | 0 |
| 0 | 1 | 0 | 0 | 0 | 0 | 1 | 1 | 0 |
| 0 | 1 | 1 | 0 | 0 | 1 | 1 | 0 | 1 |
| 1 | 0 | 0 | 0 | 0 | 0 | 1 | 1 | 0 |
| 1 | 0 | 1 | 0 | 1 | 0 | 1 | 0 | 1 |
| 1 | 1 | 0 | 1 | 0 | 0 | 0 | 0 | 1 |
| 1 | 1 | 1 | 1 | 1 | 1 | 0 | 1 | 1 |

In formulating carry propagate logic, one must recognize that the critical path in any adder is along the carry chain. The most significant bit of the sum depends not only on the two most significant addend bits, but also the addend bits of every other bit position via the carry chain. Simply allowing carries to ripple from the least significant end would result in a compact but very slow adder, since the worst-case carry propagation delay would be approximately as many gate delays as the bit width of the adder.

Fast carry-propagate techniques can dramatically decrease the carry propagation delay, and therefore decrease the overall delay of the adder. Adders employing such techniques are sometimes referred to as carry-propagate adders or carry-lookahead adders. Conventional carry propagate adder structures speed up the carry chain by computing the individual carry propagate (P) and carry generate (G) signals for each bit position.

For any two binary numbers A and B, the P and G signals for a given bit position, n, are:

$$P_n = A_n \oplus B_n \quad (3)$$

$$G_n = A_n B_n. \quad (4)$$

P and G may also be generated for 1-of-4 numbers. G indicates that the given dit position, n, generates a carry that will have to be accounted for in the higher dits of the sum. G will be set when the sum of two 1-of-4 numbers is greater than 3. P indicates that any carry generated in lower dits will propagate across the given dit position, n, to affect the higher dits of the sum. P will be set when the sum of two 1-of-4 numbers is exactly three. If neither G nor P is true for a given dit position, then a carry halt signal (H) is implied. An H signal indicates that any carry generated in lower dits will not propagate across the given dit position, n. H will be set if the sum of two 1-of-4 numbers is less than three. Restated, if the sum of two operand dits in a given dit position is greater than 3, G is true. If the sum is exactly 3, P is true. Otherwise, H is true. Final carry and sum computations proceed following exactly the same logic as is followed for the bitwise case.

Figure 7A:
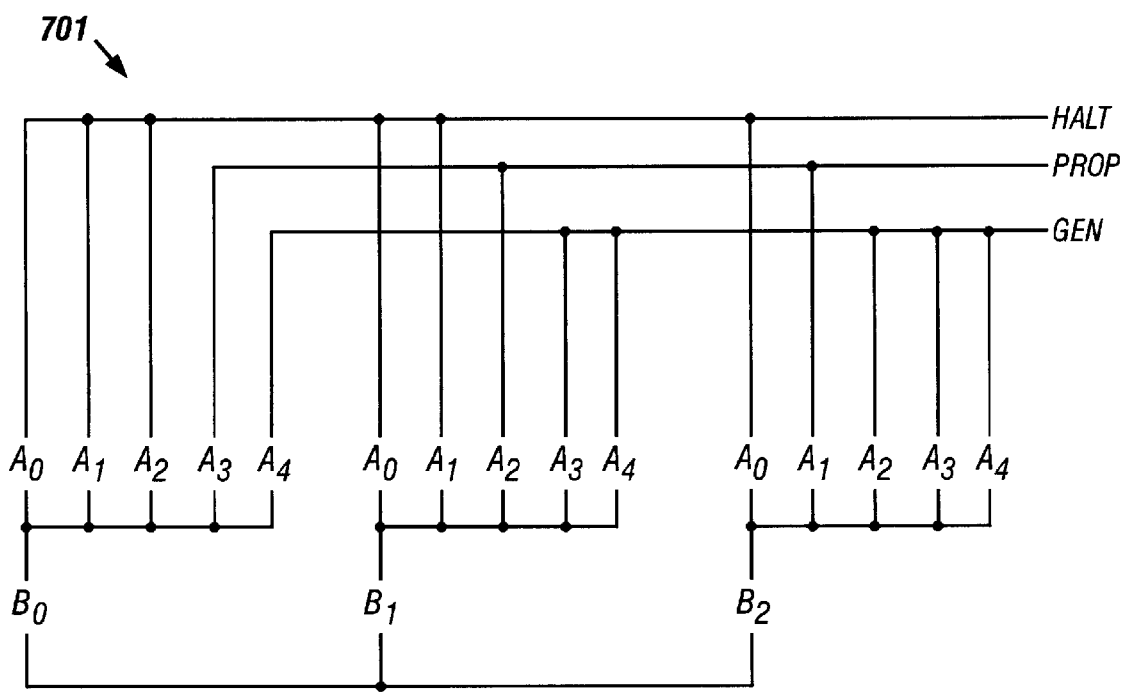
FIG. 7A is a shorthand representation of an N-nary HPG gate having one 1-of-3 input and one 1-of-5 input.

FIG. 7 illustrates an N-nary HPG gate 700 that utilizes carry propagate logic to generate an H, P, or G indication for two two-bit 1-of-4 addends. A similar function may be performed using one 1-of-3 addend and one 1-of-5 addend. Such a gate 701 is illustrated in FIG. 7A. The output of the HPG gate 700 conforms to Table 7. The output of the FIG. 7 gate is a 1-of-3 N-nary signal, such that one, and only one, of the H, P, or G wires is set high during a given evaluate cycle.

TABLE 7

| $A_3$ | $A_2$ | $A_1$ | $A_0$ | A Dec. Value | $B_3$ | $B_2$ | $B_1$ | $B_0$ | B Dec. Value | $H_n$ | $P_n$ | $G_n$ |
|---|---|---|---|---|---|---|---|---|---|---|---|---|
| 0 | 0 | 0 | 1 | 0 | 0 | 0 | 0 | 1 | 0 | 1 | 0 | 0 |
| 0 | 0 | 0 | 1 | 0 | 0 | 0 | 1 | 0 | 1 | 1 | 0 | 0 |
| 0 | 0 | 0 | 1 | 0 | 0 | 1 | 0 | 0 | 2 | 1 | 0 | 0 |
| 0 | 0 | 0 | 1 | 0 | 1 | 0 | 0 | 0 | 3 | 0 | 1 | 0 |
| 0 | 0 | 1 | 0 | 1 | 0 | 0 | 0 | 1 | 0 | 1 | 0 | 0 |
| 0 | 0 | 1 | 0 | 1 | 0 | 0 | 1 | 0 | 1 | 1 | 0 | 0 |
| 0 | 0 | 1 | 0 | 1 | 0 | 1 | 0 | 0 | 2 | 0 | 1 | 0 |
| 0 | 0 | 1 | 0 | 1 | 1 | 0 | 0 | 0 | 3 | 0 | 0 | 1 |
| 0 | 1 | 0 | 0 | 2 | 0 | 0 | 0 | 1 | 0 | 1 | 0 | 0 |
| 0 | 1 | 0 | 0 | 2 | 0 | 0 | 1 | 0 | 1 | 0 | 1 | 0 |
| 0 | 1 | 0 | 0 | 2 | 0 | 1 | 0 | 0 | 2 | 0 | 0 | 1 |
| 0 | 1 | 0 | 0 | 2 | 1 | 0 | 0 | 0 | 3 | 0 | 0 | 1 |
| 1 | 0 | 0 | 0 | 3 | 0 | 0 | 0 | 1 | 0 | 0 | 1 | 0 |
| 1 | 0 | 0 | 0 | 3 | 0 | 0 | 1 | 0 | 1 | 0 | 0 | 1 |
| 1 | 0 | 0 | 0 | 3 | 0 | 1 | 0 | 0 | 2 | 0 | 0 | 1 |
| 1 | 0 | 0 | 0 | 3 | 1 | 0 | 0 | 0 | 3 | 0 | 0 | 1 |

Referring back to Equ. 1, above, the Carry into a bit, $C_{n-1}$, is calculated as: $C_{n-1} = G_{n-1} + P_{n-1}G_{n-2} + P_{n-1}P_{n-2}G_{n-3} + \ldots + P_{n-1}P_{n-2}\ldots+P_{n-1}P_{n-2}\ldots P_1G_1$. To reduce the complexity of the carry computation, the scope of the computation is often constrained to a block of a fixed number of bits. In such a case, block-level propagates and generates are computed recursively.

Combined Sum/HPG Function

The function of the HPG gate illustrated in FIG. 7 differs from that of the adder gate illustrated in FIG. 5, but the two gates share the same input terms. The sum/HPG adder gate shown for illustrative purposes in FIG. 8 combines the two functions to generate outputs conforming with Table 8.

TABLE 8

| $A_3$ | $A_2$ | $A_1$ | $A_0$ | A Dec. Value | $B_3$ | $B_2$ | $B_1$ | $B_0$ | B Dec. Value | Sum | H | P | G |
|---|---|---|---|---|---|---|---|---|---|---|---|---|---|
| 0 | 0 | 0 | 1 | 0 | 0 | 0 | 0 | 1 | 0 | 0 | 1 | 0 | 0 |
| 0 | 0 | 0 | 1 | 0 | 0 | 0 | 1 | 0 | 1 | 1 | 1 | 0 | 0 |
| 0 | 0 | 0 | 1 | 0 | 0 | 1 | 0 | 0 | 2 | 2 | 1 | 0 | 0 |
| 0 | 0 | 0 | 1 | 0 | 1 | 0 | 0 | 0 | 3 | 3 | 0 | 1 | 0 |
| 0 | 0 | 1 | 0 | 1 | 0 | 0 | 0 | 1 | 0 | 1 | 1 | 0 | 0 |
| 0 | 0 | 1 | 0 | 1 | 0 | 0 | 1 | 0 | 1 | 2 | 1 | 0 | 0 |
| 0 | 0 | 1 | 0 | 1 | 0 | 1 | 0 | 0 | 2 | 3 | 0 | 1 | 0 |
| 0 | 0 | 1 | 0 | 1 | 1 | 0 | 0 | 0 | 3 | 0 | 0 | 0 | 1 |
| 0 | 1 | 0 | 0 | 2 | 0 | 0 | 0 | 1 | 0 | 2 | 1 | 0 | 0 |
| 0 | 1 | 0 | 0 | 2 | 0 | 0 | 1 | 0 | 1 | 3 | 0 | 1 | 0 |
| 0 | 1 | 0 | 0 | 2 | 0 | 1 | 0 | 0 | 2 | 0 | 0 | 0 | 1 |
| 0 | 1 | 0 | 0 | 2 | 1 | 0 | 0 | 0 | 3 | 1 | 0 | 0 | 1 |
| 1 | 0 | 0 | 0 | 3 | 0 | 0 | 0 | 1 | 0 | 3 | 0 | 1 | 0 |
| 1 | 0 | 0 | 0 | 3 | 0 | 0 | 1 | 0 | 1 | 0 | 0 | 0 | 1 |
| 1 | 0 | 0 | 0 | 3 | 0 | 1 | 0 | 0 | 2 | 1 | 0 | 0 | 1 |
| 1 | 0 | 0 | 0 | 3 | 1 | 0 | 0 | 0 | 3 | 2 | 0 | 0 | 1 |

Figure 8A:
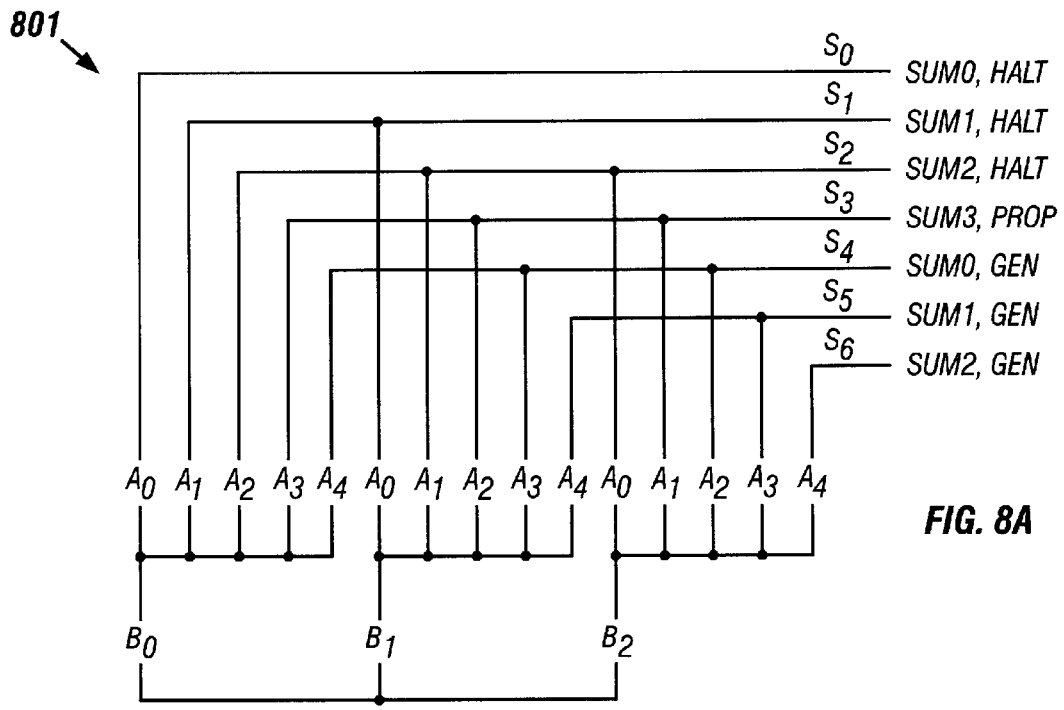
FIG. 8A is a shorthand representation of an N-nary sum/HPG gate having one 1-of-3 addend input and one 1-of-5 addend input.

The function of the sum/HPG adder gate illustrated in FIG. 8 is to add two two-bit 1-of-4 inputs and generate the sum and the H, P, and G values set forth in Table 8. The two operands A and B are two-bit 1-of-4 values, as is the sum S. The H, P, and G outputs represent the three wires for a 1-of-3 output. A similar function may be performed using one 1-of-3 input and one 1-of-5 input, as illustrated in FIG. 8A.

FIG. 8 illustrates that it is not necessary to construct multiple identical output signals from an evaluate node, even when a gate comprises two output signals. FIG. 8 illustrates that it is instead possible to construct multiple output signals from a single set of evaluate nodes. In FIG. 8, the evaluate nodes are identified as S0, S1, S2, S3, S4, S5, and S6. In order for the two different output signals to conform to the 1-of-N signal definition, additional processing is performed on the evaluate nodes. In this processing, each evaluate node S0–S6 drives more than one output, and the outputs are different. FIG. 8 illustrates that for the HALT output, the S0, S1, and S2 evaluate nodes are NAND'ed together. (Because the evaluate nodes are asserted low and the outputs are high, the effect of NAND'ing is to OR the evaluate terms.) The PROP output is pulled high if the S3 evaluate node is asserted. For the GEN output, the S4, S5, and S6 evaluate nodes are NAND'ed together. The Sum 0 output is pulled high if the NAND'ed S0 or S4 evaluate nodes are asserted. For Sum 1, the S1 and S5 evaluate nodes are NAND'ed together. For Sum 2, the S2 and S6 evaluate nodes are NAND'ed together. Finally, the Sum 3 output is pulled high if the S3 evaluate node is asserted.

Sum/Bypass Logic Gates

Figure 9:
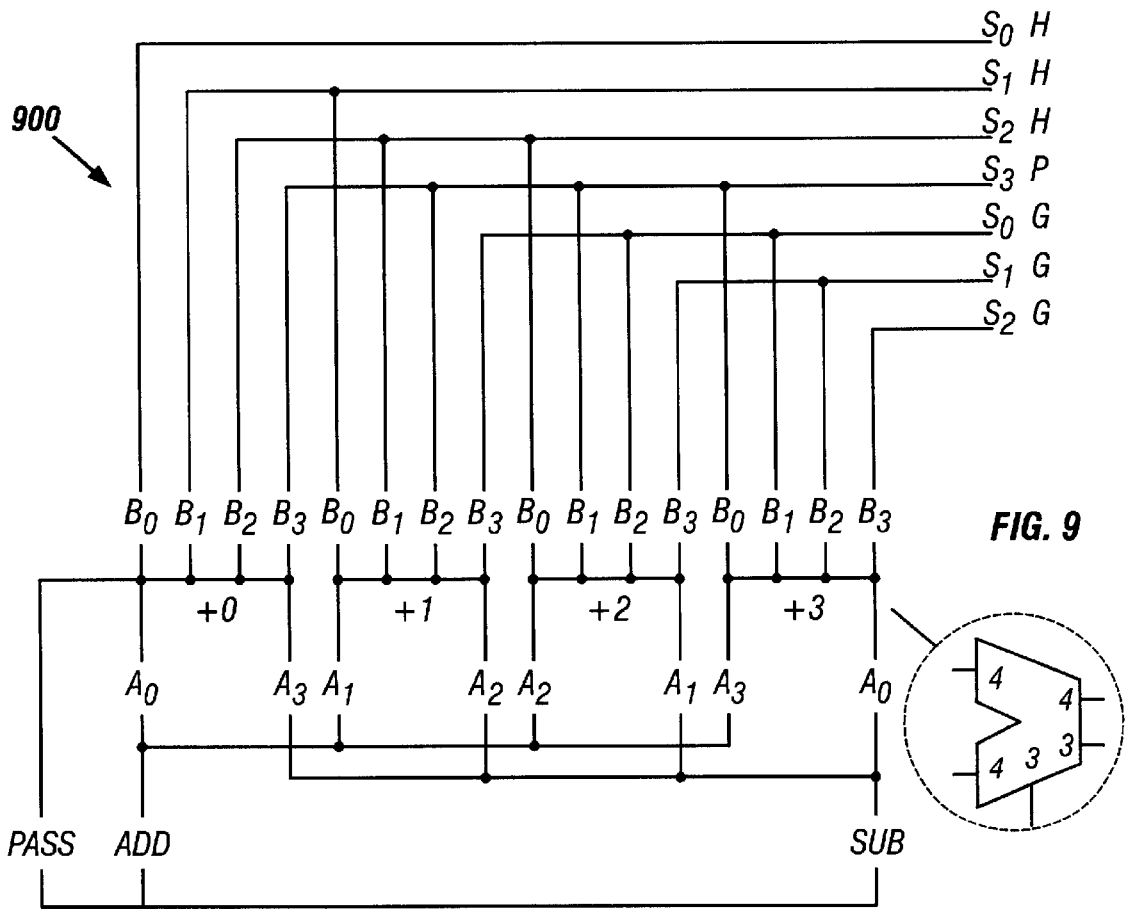
FIG. 9 is a shorthand representation of a adder/subtractor/ bypass/HPG gate, configured to take as inputs two 1-of-4 addends, A and B, and a 1-of-3 ADD/SUB/PASS selector.
Figure 10:
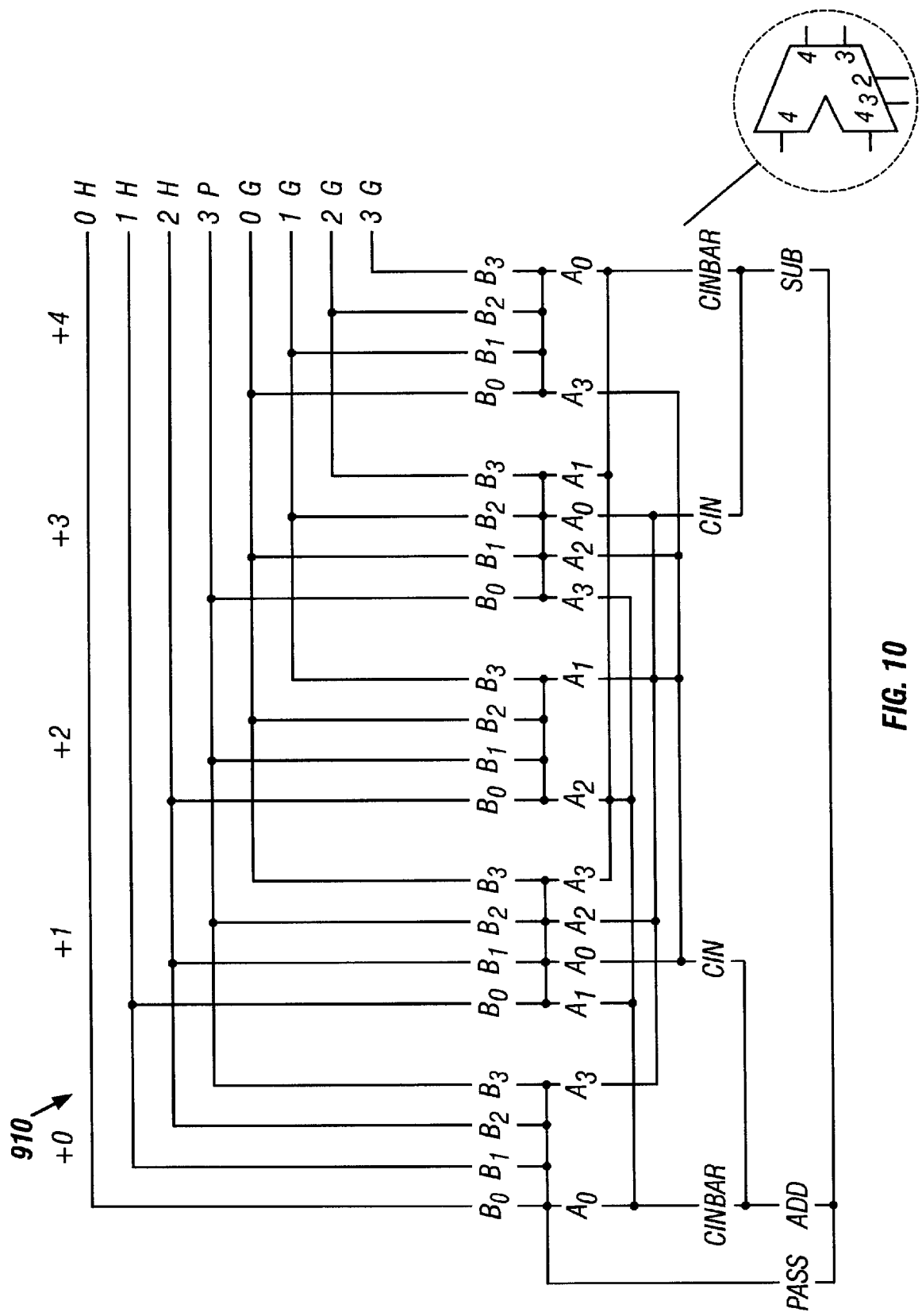
FIG. 10 is a shorthand representation of an LSD adder/ subtractor/bypass/HPG gate that implements dual-mode addition logic (straight and increment), carry propagate logic, dual-mode subtraction logic (three's complement and four's complement), and borrow propagate functions.

The Sum/Bypass logic gates 900, 910, 920 combine the sum and HPG functions described above with bypass logic and subtraction logic, which are discussed below. FIG. 14 illustrates that the Sum/Bypass Logic comprises three different variants of combined adder/subtractor/bypass/HPG logic gates 900, 910, 920. FIGS. 9, 10, and 11 depict the Sum/Bypass Logic's combined adder/subtractor/bypass/HPG logic gates 900, 910, 920, respectively.

FIGS. 9 through 11 illustrate that all Sum/Bypass Logic gates 900, 910, 920 take at least the following as inputs: two 1-of-4 input operands, A and B, and an ADD/SUB/PASS control signal that controls whether addition, subtraction, or bypass logic is performed. (For Gates 900 and 910, the ADDS/SUB/PASS control signal is a 1-of-3 signal; Gate 920 receives a 1-of-5 control signal.) Because the LSD adder/subtractor/bypass/HPG gates 910, 920 support add-with-carry and subtract-with-borrow operations, they receive an additional carry-in input. These Sum/Bypass Logic gates 900, 910, 920 all combine the following functions: addition, carry propagate logic, subtraction, borrow propagate logic, and bypass logic.

Although it is not expressly represented in FIGS. 9 through 11, these gates 900, 910, 920 perform logic that drives two output signals from the same evaluate nodes, much like the gate 800 shown in FIG. 8. FIGS. 9–11 show the outputs of the basic adder/subtractor/bypass/HPG gate 900, 910, 920, comprising S and HPG, in an expanded form for clarity. Gates 900, 910, 920 comprise seven (Gate 900) or eight (Gates 910, 920) evaluate nodes, S0 through S7. These nodes are NAND'ed together as described above and shown in FIG. 8 to form the two discrete output signals: a 1-of-4 sum, SUM, and a 1-of-3 HPG indicator.

All of the Sum/Bypass Logic gates 900, 910, 920 perform the same bypass logic. If the PASS value of the ADD/SUB/PASS control input is asserted, then the value of the B operand is passed through as the gate's output. FIGS. 9, 10, and 11 illustrate that each gate 900, 910, 920 performs this operation the same way. If the PASS value is asserted, then the outputs associated with the "+0" node of the B inputs are enabled. (The "+0" node is discussed below in connection with the add function) In essence, a PASS is logically the same as the B+0 addition operation. The additional operation of each Level One gate 900, 910, 920, including subtraction, is discussed separately below.

Gate 900 is a standard combined adder/subtractor/bypass/HPG gate that selectably adds, subtracts, or bypasses the A and B operands. The standard combined adder/subtractor/bypass HPG gate 900 is illustrated in FIG. 9. Gate 900 is used for each dit of the input operands A and B that will never fall as the least significant dit for any of the six operation categories set forth in Table 3. FIG. 14 illustrates that gate 900 is therefore used in the 32-bit adder (i.e., LOW, HIGH, and TOP) to process the following dits of the A and B operands, where each 32-bit operand comprises dits 0 through 15: 1–3, 5–7, and 8–15. FIG. 14 illustrates that the standard adder/subtractor/bypass/HPG gate 900 for each such dit is labeled, respectively, as 900d–900f, 900j–900l, and 900m–900t. FIG. 14 illustrates that Gate 900 is also used for each dit of the MIXL and MIXH 8-bit adders, except the LSD's of each adder. FIG. 14 illustrates that Gates 900a–900c process the three most significant dits of the MIXL block and that Gates 900g–900i process the three most significant dits of the MIXH block.

FIG. 9 illustrates that the standard adder/subtractor/bypass/HPG gate 900 takes as inputs two 1-of-4 addends, A and B, and the 1-of-3 ADD/SUB/PASS selector. Gate 900 produces as outputs a 1-of-4 intermediate sum, SUM, and a 1-of-3 HPG signal that reflects the carry/borrow status of the intermediate sum. Because the gate 900 possesses selectable add/subtract/bypass capability, the SUM output can comprise either an addition sun, a subtraction difference, or a bypassed B operand value (discussed above).

For addition, gate 900 computes the intermediate sum of one dit of the A and B operands and also computes the HPG status for this dit of the intermediate sum. FIG. 9 illustrates that, for addition, the standard adder/subtractor/bypass/HPG gate 900 adds A and B together. The standard gate 900 operates more simply regarding addition than do the LSD gates 910, 920, described below, because gate 900 does not support carry-in logic. For addition, gate 900 derives the intermediate sum as the simple sum of the two addend dits. FIG. 9 illustrates that the logic path for the ADD wire connects to four sets, referred to as "nodes", of the four wires comprising the B input, $B_3$, $B_2$, $B_1$, $B_0$. In FIG. 9, each node of B input wires has been labeled with the conceptual value of the A input associated with that node for the addition function. For instance, the leftmost node of B input wires in FIG. 9, corresponding to an addition value of "0" for A, is labeled as the "+0" node. From left to right in FIG. 9, the remaining nodes of B input wires have been labeled as the "+1", "+2", "+3" nodes, respectively. If the ADD value is asserted for the ADD/SUB/PASS selector, the $A_0$ input value will lead to the "+0" node and the value of B will therefore will be NAND'ed with zero to produce the "+0" node output. Thus, the value of B will be added to zero. Similarly, the $A_1$ input value will lead, for addition, to the "+1" node and will therefore cause the value of one to be NAND'ed with the B input value for that dit. The $A_2$ input value will lead, for addition, to the "+2" node and will therefore cause the value of two to be NAND'ed with the B input value for that dit. Finally, the $A_3$ input value will lead, for addition, to the "+3" node and will therefore cause the value of three to be NAND'ed with the B input value for that dit. For each intermediate result generated as the result of an addition operation, gate 900 sets the HPG indicator appropriately, as set forth above in Table 7. FIGS. 10 and 11 illustrate that this same processing is performed in Gates 910 and 920 when there is no carry into the LSD.

FIG. 9 illustrates that, for subtraction, gate 900 complements the minuend. That is, the standard adder/subtractor/bypass/HPG gate 900, for subtraction, adds the 3's complement of the A operand to the B operand. This subtraction logic is discussed below in further detail.

The operation of the two LSD gates, gate 910 and gate 920, is more complex than that of the standard gate 900. FIG. 14 illustrates that the present invention 101 uses Gates 910 and 920 in LSD positions. Gate 910 is used as the LSD gate for the MIXL, LOW, and MIXH blocks. FIG. 14 further illustrates that gate 920 is used as the LSD gate for the HIGH block. Gate 910 is therefore used to process the LSD for the blocks MIXL, MIXH that perform one-byte operations, and for LOW block, whose LSD will always be the LSD for an entire operation.

FIG. 10 illustrates that Gates 910 and 920, because they process the LSD for a block, must support dual modes of addition and subtraction. These LSD gates 910, 920 support the add-with-carry and subtract-with-borrow functions that are supported in the x86 instruction set. (This varies considerably from the operation of the LSD gate disclosed in the Adder Patent, which assumes that a carry will never propagate into the LSD.) They possess selectable subtract behavior (three's complement vs. four's complement) and addition behavior (straight addition vs. increment addition) based on the value of the carry-in signal.

FIGS. 10 and 11 illustrate that, for an addition operation, the mode of addition is selected by the value of the Cin input. If the Cinbar input wire is asserted, then no carry has propagated into the gates 910, 920. In such a case, the gates 910, 920 perform "straight" addition of A+B, as described above in connection with gate 900. In contrast, when the Cin wire is asserted, the gates 910, 920 perform "increment" addition, adding A+B+1, to account for the carry into the gate. That is, FIGS. 10 and 11 illustrate that, if an input value of $A_0$ is asserted, an incremented value of one, rather than zero, is added to the B operand. Similarly, the $A_1$ input is routed to the "+2" node, the $A_2$ input is routed to the "+3" node, and the $A_3$ input is routed to the "+4" node.

Similar dual-mode processing occurs for subtraction in the LSD gates 910, 920. Gates 910 and 920 possess the add and subtract capabilities of gate 900, discussed above. In addition, Gates 910 and 920 address the need to increment the three's complement of the minuend in order to form the four's complement for LSD subtraction. That is, the A operand is not only complemented, but, if the gate is used in the LSD position, the A operand is then incremented by one to form the four's complement. For any dit acting as the LSD for an operation, four's complement addition must be performed.

For LSD subtract processing, FIGS. 10 and 11 illustrate that, If the Cinbar input wire is asserted (indicating that no carry has propagated into the gate) that gates 910, 920 will perform four's complement addition to effect the desired subtraction operation (except, as explained below, when Dit 4 of the 32-bit adder is not acting as the LSD). Because they perform four's complement arithmetic, gates 910 and 920 have an additional evaluate node, S7, that gate 900 does not have, since gate 900 only performs three's complement arithmetic. The S7 evaluate node pulls the GEN output and the SUM3 output high.

Gates 910 and 920 do not always perform four's complement arithmetic for subtraction. When the Cin input wire is asserted for an LSD, Gates 910 and 920 must perform a subtraction operation that effects a borrow out of the LSD. To do so, the gates 910, 920 must subtract B–A–1. As is explained below, four's complement addition adds one to the A operand before it is subtracted from the B operand. In essence, then, the borrow-in subtraction operation of B–A–1 in an LSD gate is a three's complement operation. As a result, Gates 910 and 920 selectably perform three's or four's complement addition for a subtraction operation, depending on the value of the carry-in input. Both three's and four's complement subtraction are discussed in further detail below.

FIG. 10 illustrates the Sum/Bypass Logic's LSD gate 910. FIG. 14 illustrates that the Sum/Bypass Logic's LSD gate 910 is used to process all operand dits that do or may act as the least significant dit ("LSD") of an operation, except that gate 910 is not used to process Dit 4, the LSD of the HIGH block. FIG. 14 illustrates that gate 910 is therefore used to process Dit 0 of the 32-bit adder and to process the LSD's of MIXH and MIXL. Specifically, FIG. 14 illustrates that gate 910b processes Dit 0, gate 910a processes the LSD of MIXL, and gate 910c processes the LSD of MIXH.

FIG. 10 illustrates that gate 910 takes as inputs the 1-of-4 LSD's of the A and B operands and the 1-of-3 ADD/SUB/PASS indicator. Gate 910 produces as outputs a 1-of-4 intermediate sum, SUM, and a 1-of-3 HPG indicator. FIG. 10 illustrates that, when the PASS input wire is asserted, gate 910 passes the B operand values through as the intermediate sum output, and generates the corresponding HPG indicator value as set forth in Table 7.

FIG. 10 illustrates that, for addition, the gate 910 performs either straight addition or increment addition, depending on the value of the Cin input. If Cin is asserted, then the A input wires, $A_0$–$A_3$, are routed to, respectively, the "+1", "+2", "+3", and "+4" B input nodes. In contrast if Cinbar is asserted, then the A input wires, $A_0$–$A_3$, are routed to, respectively, the "+0", "+1", "+2, and "+3" B input nodes.

FIG. 10 further illustrates that, for subtraction, gate 910 selectably performs four's complement subtraction or three's complement subtraction, based on the value of the Cin input. Gate 910 performs four's complement subtraction, and not three's complement subtraction, when there is no borrow propagated into the LSD (i.e., Cinbar is asserted). When Cin is asserted, gate 910 performs three complement subtraction. The discussion of subtraction within the Sum/Bypass Logic gates 900, 910, 920 is set forth below.

The third Sum/Bypass adder/subtractor/bypass/HPG gate 920 is illustrated in FIG. 11. Gate 920 is a specialized LSD combined adder/subtractor/bypass HPG gate that, like gate 910, also possesses dual subtraction (three's complement vs. four's complement) and dual addition (straight vs. increment) capabilities. The gate 920 also performs bypass logic as described above. The gate 920 is a "specialized" gate because it performs differently depending on the size of the operands.

FIG. 14 illustrates that gate 920 is used only to process the LSD of the HIGH block. Unlike gate 910, gate 920 has two levels of select controls that determine whether gate 920 will perform three's or four's complement subtraction and whether gate 920 will perform straight or increment addition. This multi-level subtraction and addition control stems from the fact that the HIGH block may act as an LSD block for some operation categories (i.e., HIGH), but as an intermediate block for others (i.e., STANDARD and EXTENDED).

FIG. 11 illustrates that, depending on the value of the partition size control signal, gate 920 acts either as a non-LSD gate or acts as an LSD gate for an 8-bit operation. In order to dynamically select between its LSD and non-LSD functionality, FIG. 14 illustrates that gate 920 receives a specialized control input. The control input to gate 920, rather than a 1-of-3 ADD/SUB/PASS input, must give gate 920 more information. That is, gate 920 must determine not only whether addition or subtraction is the selected operation, but whether gate 920 is acting as an LSD gate for the selected operation. To impart this information to gate 920, the control logic produces a 1-of-5 control signal labeled in FIG. 14 as ADD8/ADD1632/SUB8/SUB1632/PASS.

The ADD8/ADD1632 wires of the gate 920 control input indicate to gate 920 whether the selected operation category is a HIGH addition operation (for which gate 920 acts as the LSD) or is either a 16-bit addition operation (i.e., a STANDARD operation) or a 32-bit addition operation (i.e., an EXTENDED). The control logic compresses the 16-bit and 32-bit indicators because gate 920 functions the same way in either case: it does not act as the LSD gate for such operations.

Similarly, the SUB8/SUB1632 wires of the gate 920 control input indicate to gate 920 whether the selected operation category is a HIGH subtraction operation (for which gate 920 acts as the LSD) or is either a 16-bit subtraction operation (STANDARD) or a 32-bit operation (EXTENDED). The control logic compresses the 16- and 32-bit subtraction indicators for the same reason that it does so for the addition indicators.

FIG. 11 illustrates that the specialized Sum/Bypass Logic gate 920 performs addition as follows. If the ADD8 wire of the input is asserted, then the gate 920 is acting as the LSD. For this reason, the gate 920 must evaluate the state of the Cin input, because the LSD must support the add-with-carry function. FIG. 11 therefore illustrates that gate 920 performs straight addition if the ADD8 wire is asserted and the Cinbar wire is asserted. FIG. 11 further illustrates that gate 920 performs increment addition if the gate is acting as an LSD gate (i.e., ADD8 is asserted) and there is a carry into the gate (i.e., Cin is asserted). FIG. 11 illustrates that gate 920 disregards the Cin input when the ADD1632 input wire is asserted, since there is no need to support the add-with-carry function when the gate 920 is not acting as an LSD gate. Gate 920 therefore performs straight addition when the ADD1632 input wire is asserted.

Gate 920 possesses similar dual-subtraction capabilities that also require two levels of controls. The first level of control, similar to addition, comprises the SUB8/SUB1632 control input wires. The second level of control, also similar to addition, is the Cin input. FIG. 11 illustrates that two things happen within gate 920 when the SUB8 input wire is asserted. First, the gate is acting as an LSD gate, so the baseline assumption is that the gate 920 will perform four's complement addition. Second, the gate 920 must evaluate the Cin input, since the LSD must support subtraction-with-borrow functionality when the HIGH block processes the LSD in 8-bit operations. FIG. 11 therefore illustrates that the A input is routed to the "+4" node of B inputs when SUB8 and Cinbar are asserted. When SUB8 and Cin are both asserted, the increment for four's complement is effectively canceled by the borrow in, so the gate 920 performs three's complement addition by routing the A input to the "+3" node of B inputs. When SUB1632 is asserted, the gate 920 does not act as the LSD gate, and therefore bypasses the Cin input wires and simply performs three's complement addition.

Level One N-nary Subtraction Logic

As stated above, the Sum/Bypass Logic gates 900, 910, 920 possess selectable subtract capability, and may be used for either addition or subtraction, based on the value of the ADD/SUB/PASS control inputs. FIGS. 9 through 11 illustrate that the Sum/Bypass Logic gates 900, 910, 920 not only implement the combined Sum/HPG functions discussed above, but also implement the subtraction and borrow propagate logic discussed herein.

For subtraction, the Sum/Bypass Logic gates 900, 910, 920 subtract the value of the A operand from the B operand to produce a result in a specialized format discussed below. For illustrative purposes, a truth table generally demonstrating the subtraction operation, B−A, using 1-of-4 encoding is set forth in Table 9. Each of the two-bit 1-of-4 inputs, A and B, in Table 9 can represent one of four values, 0 through 3 inclusive, depending on which of the four wires for each signal is set high. The four wires for the two-bit 1-of-4 representation of the decimal difference of the subtraction operation in Table 9 are labeled $D_3$, $D_2$, $D_1$, and $D_0$.

In performing subtract logic within a processor, it is useful to implement subtraction as a form of complement addition. An adder may be made to subtract by forming the radix complement of the subtrahend and adding it to the minuend, where "radix" refers to the base of the number system being used. The radix complement of a number is formed by adding one to the least significant bit of the diminished radix complement of the number. The diminished radix complement is formed by subtracting every digit of the subtrahend from a number y, where y=base−1. In binary systems, subtraction is often implemented using the radix complement, or two's complement. Two's complement is formed by incrementing a one's complement number (the diminished radix complement). One's complement is formed by subtracting each bit of the subtrahend from 1, which is one less than the base (2). Formation of the 1's complement effects an inversion of each digit of the subtrahend.

The preferred embodiment of the Sum/Bypass Logic gates 900, 910, 920, because they operate on 1-of-4 inputs, are not binary. Instead, the addition system of the present invention is quaternary, with a base of four. Accordingly, the subtraction of the present invention is implemented as a form of four's complement addition. In the present invention, therefore, the subtrahend is converted to three's complement, the diminished radix complement, by novel circuitry that emulates the effect of subtracting each dit of the subtrahend from three. In the LSD Sum/Bypass Logic gates 910, 920, when processing dits that fall as the LSD for an operation category, the subtrahend is converted from three's complement to four's complement, the radix complement, by novel circuitry that emulates the effect of incrementing the least significant dit of the three's complement number. (Unless, of course, the Cin input indicates that there is a carry into the LSD). Table 10 illustrates the three's complement for each of the four possible values of a 1-of-4 dit.

TABLE 9

| 0 | $B_2$ | $B_1$ | $B_0$ | B Dec. Value | $A_3$ | $A_2$ | $A_1$ | $A_0$ | A Dec. Value | $D_3$ | $D_2$ | $D_1$ | $D_0$ | B − A Decimal Value |
|---|---|---|---|---|---|---|---|---|---|---|---|---|---|---|
| 0 | 0 | 0 | 1 | 0 | 0 | 0 | 0 | 1 | 0 | 0 | 0 | 0 | 1 | 0 |
| 0 | 0 | 0 | 1 | 0 | 0 | 0 | 1 | 0 | 1 | 0 | 0 | 1 | 0 | −1 |
| 0 | 0 | 0 | 1 | 0 | 0 | 1 | 0 | 0 | 2 | 0 | 1 | 0 | 0 | −2 |
| 0 | 0 | 0 | 1 | 0 | 1 | 0 | 0 | 0 | 3 | 1 | 0 | 0 | 0 | −3 |
| 0 | 0 | 1 | 0 | 1 | 0 | 0 | 0 | 1 | 0 | 0 | 0 | 1 | 0 | 1 |
| 0 | 0 | 1 | 0 | 1 | 0 | 0 | 1 | 0 | 1 | 0 | 0 | 0 | 1 | 0 |
| 0 | 0 | 1 | 0 | 1 | 0 | 1 | 0 | 0 | 2 | 1 | 0 | 0 | 0 | −1 |
| 0 | 0 | 1 | 0 | 1 | 1 | 0 | 0 | 0 | 3 | 0 | 1 | 0 | 0 | −2 |
| 0 | 1 | 0 | 0 | 2 | 0 | 0 | 0 | 1 | 0 | 0 | 1 | 0 | 0 | 2 |
| 0 | 1 | 0 | 0 | 2 | 0 | 0 | 1 | 0 | 1 | 1 | 0 | 0 | 0 | 1 |
| 0 | 1 | 0 | 0 | 2 | 0 | 1 | 0 | 0 | 2 | 0 | 0 | 0 | 1 | 0 |
| 0 | 1 | 0 | 0 | 2 | 1 | 0 | 0 | 0 | 3 | 0 | 0 | 1 | 0 | −1 |
| 1 | 0 | 0 | 0 | 3 | 0 | 0 | 0 | 1 | 0 | 1 | 0 | 0 | 0 | 3 |
| 1 | 0 | 0 | 0 | 3 | 0 | 0 | 1 | 0 | 1 | 0 | 1 | 0 | 0 | 2 |
| 1 | 0 | 0 | 0 | 3 | 0 | 1 | 0 | 0 | 2 | 0 | 0 | 1 | 0 | 1 |
| 1 | 0 | 0 | 0 | 3 | 1 | 0 | 0 | 0 | 3 | 0 | 0 | 0 | 1 | 0 |

In Table 9, negative output values in the "B−A" column indicate that a borrow from the next higher-order dit must occur. As is discussed below, the present invention produces output values that are based on the assumption that such a borrow will occur in every case. In cases where such a borrow is not necessary, the present invention compensates accordingly.

TABLE 10

| x (decimal) | x (1-of-4) | 3's Comp. (3-x) | 3-x (1-of-4) |
|---|---|---|---|
| 0 | 0001 | 3 | 1000 |
| 1 | 0010 | 2 | 0100 |

TABLE 10-continued

| x (decimal) | x (1-of-4) | 3's Comp. (3-x) | 3-x (1-of-4) |
|---|---|---|---|
| 2 | 0100 | 1 | 0010 |
| 3 | 1000 | 0 | 0001 |

Since four's complement is generated by adding one to the least significant dit of a three's complement number, the present invention provides subtraction capability with minimal additional cost by providing a path that converts each dit of the subtrahend to the three's complement. In the least significant dit for each category of subtraction operation, the present invention converts the subtrahend to a four's complement representation if there is no carry into the LSD.

Subtraction using Three's Complement—All Dits Except LSD with no Borrow in

Table 11 sets forth the truth table for the subtraction portion of the N-nary circuit illustrated in FIG. 9, which performs subtraction on two 1-of-4 numbers, A and B, by adding the three's complement of A to B in order derive the two-bit difference of B−A. This processing is performed on all dits, except the LSD for each operation category, during a subtract operation. This processing is also performed on LSD's that a receive a borrow-in indication (i.e., Cin asserted for subtraction). In Table 11, A and B are represented in both decimal and 1-of-4 representations. The "~A" column of Table 11 represents the three's complement value of the subtrahend, A. The "~A (1-of-4)" column represents the three's complement of A in 1-of-4 representation. The "Pre-corr. Diff." column represents the difference of B−A, represented in a pre-correction format discussed in detail below. The "Diff." column represents the difference in post-correction decimal format.

TABLE 11

| B | B (1-of-4) | A | A (1-of-4) | ~A | ~A (1-of-4) | Pre-Corr. Diff (B − A) | Diff |
|---|---|---|---|---|---|---|---|
| 0 | 0001 | 0 | 0001 | 3 | 1000 | 3 | 0 |
| 1 | 0010 | 0 | 0001 | 3 | 1000 | 0* | 1 |
| 2 | 0100 | 0 | 0001 | 3 | 1000 | 1* | 2 |
| 3 | 1000 | 0 | 0001 | 3 | 1000 | 2* | 3 |
| 0 | 0001 | 1 | 0010 | 2 | 0100 | 2 | −1 |
| 1 | 0010 | 1 | 0010 | 2 | 0100 | 3 | 0 |
| 2 | 0100 | 1 | 0010 | 2 | 0100 | 0* | 1 |
| 3 | 1000 | 1 | 0010 | 2 | 0100 | 1* | 2 |
| 0 | 0001 | 2 | 0100 | 1 | 0010 | 1 | −2 |
| 1 | 0010 | 2 | 0100 | 1 | 0010 | 2 | −1 |
| 2 | 0100 | 2 | 0100 | 1 | 0010 | 3 | 0 |
| 3 | 1000 | 2 | 0100 | 1 | 0010 | 0* | 1 |
| 0 | 0001 | 3 | 1000 | 0 | 0001 | 0 | −3 |
| 1 | 0010 | 3 | 1000 | 0 | 0001 | 1 | −2 |
| 2 | 0100 | 3 | 1000 | 0 | 0001 | 2 | −1 |
| 3 | 1000 | 3 | 1000 | 0 | 0001 | 3 | 0 |

The values in the "Pre-Corr. Diff" column of Table 11 denoted by asterisks are mod 4 values of a difference that is too large to be represented in two bits. Conceptually, these cases generate a carry into the next higher-order dit, where such carry represents a value of four.

FIG. 9 illustrates a gate 900 that performs three's complement subtraction in the following manner. FIG. 9 illustrates that each node of B inputs in gate 900 has been labeled with the conceptual value of the A input. The left most node of B inputs in FIG. 9, corresponding to an addition value of "0" for A and a three's complement subtraction value of "3" for A has been labeled "+0." From left to right, the remaining nodes have been labeled as the "+1", "+2", and "+3" nodes, respectively. For subtraction, the $A_0$ input is coupled to the "+3" node. Because the three's complement of zero is three, the addition of three to the B input when the value of $A_n$ is zero effectuates the conversion of A to a three's complement value before it is added to B. Similarly, the $A_1$ input for subtraction is coupled to the "+2" node because the three's complement of one is two. Likewise, the $A_2$ input is coupled to the "+1" node and the $A_3$ input is coupled to the "+0" node. Through this novel circuitry approach, A is simply and elegantly converted to its three's complement representation.

Pre-correction Format for Three's Complement Subtraction

The values set forth in the "Pre-Corr. Diff" column of Table 11 represent the present invention's pre-correction format for three's complement subtraction. Rather than producing an intermediate difference (hereinafter referred to as "Diff") value that represents B−A for a given bit n, the format of the pre-corrected Diff in Table 11 is : $(b-1)+B_n-A_n$, where b is the base. In the preferred embodiment of the present invention, the base is four. Such format is based on the following two assumptions.

Assumptions:

I) a borrow from dit x by the dit of next-lowest significance is implied for each dit except the least significant dit of the intermediate difference; and II) every dit x will require a borrow from the dit of next-higher significance.

Considering the first assumption in isolation, the borrow results in 1 being subtracted ("borrowed") from dit n. This first borrow conceptually adds the base to dit n−1. The first assumption therefore results in subtraction of 1 from the intermediate difference for dit n, providing a pre-correction format of $(-1)+(B_n-A_n)$. The latter assumption results in the base, b, being subtracted ("borrowed") from dit n+1 and added to dit n. Combining the second assumption with the first, the pre-correction format of the present invention therefore becomes $(b-1)+(B_n-A_n)$. The "Pre-Corr. Diff" column of Table 11 illustrates that the output of gate 900 conforms to this pre-correction format.

Subtraction using Four's Complement—Least Significant Dit with no Borrow in

Table 12 sets forth the subtraction truth table for the four's complement subtraction circuit of gates 910 and 920, which perform subtraction of two 1-of-4 numbers, A and B, by adding the four's complement of A to B in order derive the two-bit difference of B−A. In Table 12, A and B are represented in both decimal and 1-of-4 representations. The "~A" column of Table 12 represents the three's complement value of the subtrahend, A, and the "~A+1" column represents the four's complement value of A. The "~A+1 (1-of-4)" column represents the four's complement of A in 1-of-4 representation. The "Pre-corr. Diff." column represents the difference of B−A, represented in a pre-correction format discussed in detail below. The "Diff." column represents the difference in post-correction decimal format.

TABLE 12

| B | B (1-of-4) | A | A (1-of-4) | ~A | ~A + 1 | ~A + 1 (1-of-4) | Pre-Corr. Diff (B − A) | Diff (B − A) |
|---|---|---|---|---|---|---|---|---|
| 0 | 0001 | 0 | 0001 | 3 | 4 | 0001* | 0* | 0 |
| 1 | 0010 | 0 | 0001 | 3 | 4 | 0001* | 1* | 1 |

TABLE 12-continued

| B | B (1-of-4) | A | A (1-of-4) | ~A | ~A + 1 | ~A + 1 (1-of-4) | Pre-Corr. Diff (B – A) | Diff (B – A) |
|---|---|---|---|---|---|---|---|---|
| 2 | 0100 | 0 | 0001 | 3 | 4 | 0001* | 2* | 2 |
| 3 | 1000 | 0 | 0001 | 3 | 4 | 0001* | 3* | 3 |
| 0 | 0001 | 1 | 0010 | 2 | 3 | 1000 | 3 | –1 |
| 1 | 0010 | 1 | 0010 | 2 | 3 | 1000 | 0* | 0 |
| 2 | 0100 | 1 | 0010 | 2 | 3 | 1000 | 1* | 1 |
| 3 | 1000 | 1 | 0010 | 2 | 3 | 1000 | 2* | 2 |
| 0 | 0001 | 2 | 0100 | 1 | 2 | 0100 | 2 | –2 |
| 1 | 0010 | 2 | 0100 | 1 | 2 | 0100 | 3 | –1 |
| 2 | 0100 | 2 | 0100 | 1 | 2 | 0100 | 0* | 0 |
| 3 | 1000 | 2 | 0100 | 1 | 2 | 0100 | 1* | 1 |
| 0 | 0001 | 3 | 1000 | 0 | 1 | 0010 | 1 | –3 |
| 1 | 0010 | 3 | 1000 | 0 | 1 | 0010 | 2 | –2 |
| 2 | 0100 | 3 | 1000 | 0 | 1 | 0010 | 3 | –1 |
| 3 | 1000 | 3 | 1000 | 0 | 1 | 0010 | 0* | 0 |

The values in the "Pre-Corr. Diff" and "~A+1 (1-of-4)" columns denoted by asterisks are mod 4 values of a difference that is too large to be represented in two bits. Conceptually, these cases generate a carry into the next higher-order dit, where such carry represents a value of four. Gates 910 and 920 perform four's complement subtraction in the following manner. Each node of B inputs in FIGS. 10 and 11 have been labeled with the conceptual value of the A input. The leftmost node of B inputs in FIGS. 10 through 13, corresponding to a normal addition value of "0" for A and a three's complement addition value of "3" for A and unused for four's complement addition, has been labeled as the "+0" node. From left to right, the remaining nodes have been labeled as the "+1", "+2", "+3", and "+4" nodes, respectively. For subtraction, the $A_0$ input is coupled to the "+4" node. Because the four's complement of zero is four (i.e., 3–0=3; 3+1=4), the addition of four to the B input when the value of $A_n$ is zero effectuates the conversion of A to a four's complement value before it is added to B. Table 12 illustrates that the output of Gates 910 and 920 in such a case will be the value of B, with a carry generated. Therefore, it is apparent that the novel four's complement subtraction circuits depicted in FIGS. 10 and 11 properly perform four's complement subtraction in gates 910 and 920 when a dit is acting as the LSD for an operation and there is no borrow into the LSD.

Pre-correction Format for Four's Complement Subtraction

The values set forth in the "Pre. Corr. Diff" column of Table 12 represent the present invention's pre-correction format for four's complement subtraction. Rather than three's complement subtraction, gates 910 and 920 perform four's complement subtraction to implement the least significant dit (LSD) of the subtraction operation when there is no borrow propagated into the LSD. When there is a borrow out of the LSD for a subtraction operation, Gates 910 and 920 effectively perform three's complement arithmetic and therefore implement both Assumption I and Assumption II, as discussed above for the three's complement pre-correction format. In contrast, when there is no borrow out of the LSD, Gates 910 and 920 only implement Assumption II listed above, and not Assumption I. Assumption II results in the base, b, being subtracted ("borrowed") from dit n+1 and added to dit n. The pre-correction format for the intermediate difference for gates 910 and 920 when there is no borrow propagated into the LSD, represented in the "Pre-Corr. Diff" column of Table 12, is therefore $b+B_n-A_n$, where b is the base, which is 4. Table 12 illustrates that the output of four's complement subtraction logic paths for Gates 910 and 920 conform to this pre-correction format.

Level One Borrow Propagate Logic

FIGS. 9, 10 and 11 illustrate that, during subtraction, the Sum/Bypass Logic gates 900, 910, 920 generate a (H)alt-(P)ropagate-G(enerate) signal for each dit in addition to the intermediate difference in the pre-correction formats discussed above. In order to understand the present invention's operation regarding the setting of the H, P, and G signals for subtraction, it is useful to keep in mind the various conceptual transfers of data that may occur during a subtract operation. Example 1 sets forth these conceptual transfers among three dits in a subtract operation, the LSD, dit n, and dit n+1.

EXAMPLE 1

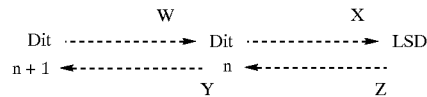

In Example 1, W represents a borrow from Dit n+1 into Dit n. Such borrow will conceptually subtract one from the value of Dit n+1 and will conceptually add a value equal to the base (in this case, four) to the value of Dit n. The borrow depicted by W in Example 1 illustrates the application of Assumption I discussed above to Dit n+1. Likewise, data transfer W also illustrates the application of Assumption II to Dit n. Similarly, X represents a borrow from Dit n into the LSD. Data transfer X therefore represents the application of Assumption I to Dit n and the application of Assumption II to the LSD.

Still referring to Example 1, data transfer Y represents a carry from Dit n into Dit n+1. Such carry will decrement the base (four) from the value of Dit n and will add one to Dit n+1. The carry represented in Y will occur whenever the intermediate difference for Dit n is too large to be represented with two bits. Similarly, Z represents a carry from the LSD into Dit n.

Example 1 also illustrates that there ordinarily will not be a borrow out of the LSD because there is no dit to the right of the LSD. This is the reason that the four's-complement subtraction circuits of Gates 920 and 920 apply only Assumption II, and not Assumption I, to generate the four's complement pre-correction format when there is no Cin indication.

Keeping the foregoing assumptions and data transfers in mind, we now turn to the present invention's setting of the H, P, and G indicators for subtract operations. In the subtraction operation of the present invention, an H signal relates to the concept of "borrowing." A borrow is the complement of a generate associated with addition. Conceptually, the action of a borrow from dit n is to decrement the value of the difference for dit n in the final level of logic in a subtractor, after all borrows have been propagated—just as a G signal that propagates to a given dit position in addition will increment the value of the sum for dit n.

Regarding the H signal, it is important to note that, as stated in Assumption II above, the present invention assumes that the intermediate difference generated for any dit n will be incremented via a borrow. In other words, there is an implied assumption that there will be a borrow by dit n from the dit of next-higher significance (n+1). Assumption II therefore assumes that the data transfer denoted by W in Example 1 will always occur. Accordingly, the intermediate difference for dit n created by the present invention contains an "implied borrow." The H(alt) signal associated with the subtraction operation on dit n simply means that, for a dit n, the implied borrow out of the dit of next-higher significance (n+1) will indeed take place as assumed. The H signal will be set when the intermediate sum of dit n is a negative number, indicating that a borrow must occur. H will be set when $B_n < A_n$.

A G signal in subtraction corrects the implied borrow described above, if the borrow was unnecessary, by indicating that the intermediate difference for dit n should be incremented by one. In other words, a G signal indicates that the carry denoted by Y in Example 1 should occur to offset the unnecessary borrow denoted by data transfer W in Example 1. For elaboration, consider the example set forth in Table 13 below. Table 13 shows two consecutive dits in a subtract operation, the LSD and the dit of next-higher significance, dit n. The value of $B_{LSD}$ is 3, the value of $B_n$ is 1, the value of $A_{LSD}$ is 1, and the value of $A_n$ is 2.

TABLE 13

|  | Step 1 | | Step 2 | | Step 3 | | Step 4 | | Step 5 | |
| --- | --- | --- | --- | --- | --- | --- | --- | --- | --- | --- |
|  | n | LSD | n | LSD | n | LSD | n | LSD | n | LSD |
| B | 1 | 3 | 11 | 3 | 10 | 13 | 10 | 13 | 10 | 13 |
| -A | 2 | 1 | 2 | 1 | 2 | 1 | 2 | 1 | 2 | 1 |
| Int. Diff. | — | | — | | — | | 2 | 12 | 3 | 2 |

The first step of Table 13 shows the two dits to be subtracted. Step 2 illustrates the borrow into dit n from the next-higher dit, dit n+1 (not shown), which results in a value of 11 for $B_n$. The value of 11 is the base four representation of 5 (i.e., 5 MOD 4), and 5 is the result of adding the borrowed four to the original value (1) of $B_n$. Step 2 therefore corresponds to the application of Assumption II to dit n, which is depicted as data transfer W in Example 1. Step 2 also corresponds to the application of Assumption I to dit n+1 (not shown).

The third step of Table 13 illustrates the borrow into LSD from dit n and shows that such borrow has two effects. First, the borrow decrements one from $B_n$, resulting in a value of 10 for $B_n$. This first effect corresponds to the application of Assumption I to dit n. Second, the borrow illustrated in Step 3 also results in the addition of four to the original value of $B_{LSD}$, with a resultant value of 7, which has a base four representation of 13. This second effect corresponds to the application of Assumption II to the LSD. Both effects are illustrated by data transfer X in Example 1.

The fourth step of Table 13 illustrates the result of ditwise subtraction on dit n and the LSD after the borrow assumptions have been applied. The intermediate difference for the LSD generates a carry because the result of the subtraction results in a value for the LSD that is greater than the base. The intermediate difference for the LSD is 12, which is the base four representation of 6.

Step 5 illustrates the carry from the LSD back into dit n. This carry corresponds to data transfer Z shown in Example 1. This carry will correct the initial borrow out of dit n that was illustrated in Step 1, and depicted as data transfer X in Example 1. In Step 5, the carry results in 1) the intermediate difference for dit n being incremented by one; and 2) the intermediate difference for the LSD being decremented by four, which is the base. The borrow from dit n into the LSD is unnecessary any time that $B_n > A_n$ ($B_n \geq A_n$ in the case of the LSD). Accordingly, the present invention sets the G bit to generate a carry any time $B_n > A_n$ ($B_n \geq A_n$ in the case of the LSD), thereby correcting unnecessary Assumption I borrows.

The P signal, for subtraction, means the same thing as it does for addition. That is, whether or not a carry will be generated out of dit n depends on whether there is a carry into dit n. P will be set when $B_n = A_n$.

The state of the H, P, and G bits for each combination of inputs into any dit of the present invention not acting as an LSD is set forth in Table 14. FIG. 9 illustrates a gate 900 that does not ever act as an LSD and whose outputs always conform to Table 14. FIGS. 10 and 10 and 11 illustrate that the outputs of the circuits of the present invention that implement subtraction and borrow propagate logic for LSD's that receive a borrow-in also conform to Table 14.

TABLE 14

| B | B (1-of-4) | A | A (1-of-4) | ~A | ~A (1-of-4) | Pre-Corr. Diff(B−A) | Diff | H $B_n < A_n$ | P $B_n = A_n$ | G $B_n > A_n$ |
| --- | --- | --- | --- | --- | --- | --- | --- | --- | --- | --- |
| 0 | 1000 | 0 | 1000 | 3 | 0001 | 3 | 0 | 0 | 1 | 0 |
| 1 | 0100 | 0 | 1000 | 3 | 0001 | 0* | 1 | 0 | 0 | 1 |
| 2 | 0010 | 0 | 1000 | 3 | 0001 | 1* | 2 | 0 | 0 | 1 |
| 3 | 0001 | 0 | 1000 | 3 | 0001 | 2* | 3 | 0 | 0 | 1 |
| 0 | 1000 | 1 | 0100 | 2 | 0010 | 2 | −1 | 1 | 0 | 0 |
| 1 | 0100 | 1 | 0100 | 2 | 0010 | 3 | 0 | 0 | 1 | 0 |
| 2 | 0010 | 1 | 0100 | 2 | 0010 | 0* | 1 | 0 | 0 | 1 |
| 3 | 0001 | 1 | 0100 | 2 | 0010 | 1* | 2 | 0 | 0 | 1 |
| 0 | 1000 | 2 | 0010 | 1 | 0100 | 1 | −2 | 1 | 0 | 0 |
| 1 | 0100 | 2 | 0010 | 1 | 0100 | 2 | −1 | 1 | 0 | 0 |
| 2 | 0010 | 2 | 0010 | 1 | 0100 | 3 | 0 | 0 | 1 | 0 |
| 3 | 0001 | 2 | 0010 | 1 | 0100 | 0* | 1 | 0 | 0 | 1 |
| 0 | 1000 | 3 | 0001 | 0 | 1000 | 0 | −3 | 1 | 0 | 0 |
| 1 | 0100 | 3 | 0001 | 0 | 1000 | 1 | −2 | 1 | 0 | 0 |
| 2 | 0010 | 3 | 0001 | 0 | 1000 | 2 | −1 | 1 | 0 | 0 |
| 3 | 0001 | 3 | 0001 | 0 | 1000 | 3 | 0 | 0 | 1 | 0 |

It is apparent from Table 14 that the H signal is set for each situation where $B_n < A_n$, so that every instance where the "Diff" column of Table 14 shows a negative number, a borrow is indicated because the H bit is set for that row. Table 14 also shows that any time the "Pre-corr. Diff" column of Table 10 indicates a carry, the G bit is set in Table 14 for that row. That is, G is set every time $B_n > A_n$.

Table 15 illustrates the outputs of the four's complement subtraction logic paths for gates 910 and 920, when there is no borrow propagated into the LSD. FIGS. 10 and 11 illustrate Gates 910 and 920, respectively. The outputs of the four's complement logic paths of Gates 910 and 920, comprising the pre-corrected intermediate difference, H, P, and G, conform to Table 15.

TABLE 15

| B | B (1-of-4) | A | A (1-of-4) | ~A | ~A + 1 | ~A + 1 (1-of-4) | Pre-Corr. Diff (B − A) | Diff (B − A) | H | P | G |
|---|---|---|---|---|---|---|---|---|---|---|---|
| 0 | 0001 | 0 | 0001 | 3 | 4 | 0001* | 0* | 0 | 0 | 0 | 1 |
| 1 | 0010 | 0 | 0001 | 3 | 4 | 0001* | 1* | 1 | 0 | 0 | 1 |
| 2 | 0100 | 0 | 0001 | 3 | 4 | 0001* | 2* | 2 | 0 | 0 | 1 |
| 3 | 1000 | 0 | 0001 | 3 | 4 | 0001* | 3* | 3 | 0 | 0 | 1 |
| 0 | 0001 | 1 | 0010 | 2 | 3 | 1000 | 3 | −1 | 0 | 1 | 0 |
| 1 | 0010 | 1 | 0010 | 2 | 3 | 1000 | 0* | 0 | 0 | 0 | 1 |
| 2 | 0100 | 1 | 0010 | 2 | 3 | 1000 | 1* | 1 | 0 | 0 | 1 |
| 3 | 1000 | 1 | 0010 | 2 | 3 | 1000 | 2* | 2 | 0 | 0 | 1 |
| 0 | 0001 | 2 | 0100 | 1 | 2 | 0100 | 2 | −2 | 1 | 0 | 0 |
| 1 | 0010 | 2 | 0100 | 1 | 2 | 0100 | 3 | −1 | 0 | 1 | 0 |
| 2 | 0100 | 2 | 0100 | 1 | 2 | 0100 | 0* | 0 | 0 | 0 | 1 |
| 3 | 1000 | 2 | 0100 | 1 | 2 | 0100 | 1* | 1 | 0 | 0 | 1 |
| 0 | 0001 | 3 | 1000 | 0 | 1 | 0010 | 1 | −3 | 1 | 0 | 0 |
| 1 | 0010 | 3 | 1000 | 0 | 1 | 0010 | 2 | −2 | 1 | 0 | 0 |
| 2 | 0100 | 3 | 1000 | 0 | 1 | 0010 | 3 | −1 | 0 | 1 | 0 |
| 3 | 1000 | 3 | 1000 | 0 | 1 | 0010 | 0* | 0 | 0 | 0 | 1 |

Table 15 shows that the H signal is set for four's complement addition any time that (B+1)<A. If B=A−1, then the P signal is set. Table 15 also shows that the G signal is set when A=B. These three conditions for setting H, P, and G are true, and differ from the conditions shown in Table 11, because four's complement addition increments the three's complement before adding the minuend to the subtrahend. Table 15 shows that, in all cases where a carry is generated, the G signal is set for four's complement addition.

In sum, the Sum/Bypass Logic gates, 900, 910, 920 utilize N-nary logic to perform both addition and subtraction within one gate. FIG. 9 illustrates an embodiment of a Level One combined sum/HPG gate 900 that implements the add, carry propagate, subtract (three's complement), and borrow propagate functions, discussed above, into one gate. This gate 900 may be used for any dit that will never act as the LSD for an operation. Gate 900 always performs three's complement arithmetic for subtraction and always performs straight addition. FIGS. 10 and 11 illustrate LSD Sum/Bypass Logic gates 910, 920 that implement dual-mode addition logic (straight and increment), carry propagate logic, dual-mode subtraction logic (three's complement and four's complement), and borrow propagate functions. It will be noted from FIGS. 9, 10, and 11 that the inputs into the Level One gates 900, 910, 920, at the least, comprise two two-bit (one-dit) operands, A and B. Gates 900 and 910 each receive a 1-of-3 ADD/SUB/PASS control input while gate 920 receives a 1-of-5 ADD8/ADD1632/SUB8/SUB1632/PASS control input. The value of these control signals determine whether the gate 900, 910, 920 will perform subtraction or addition. FIGS. 10 and 11 further illustrate that Gates 910 and 920 also receive as inputs a 1-of-2 Cin input control, which the gates 910, 920 use to determine whether an LSD gate should perform straight or increment addition and whether an LSD gate should perform three's or four's complement subtraction.

The combined add/subtract function of the Sum/Bypass Logic gates 900, 910, 920 is performed as follows. The standard adder/subtractor/bypass/HPG gate 900 comprises four sets, referred to as "nodes", of the four wires comprising the B input, $B_3$, $B_2$, $B_1$, $B_0$. Each of the other two adder/subtractor/bypass/HPG gates 910, 920 comprise five sets of the four-wire nodes comprising the B input, since they must have the capability to perform four's complement subtraction. In gate 900, each of the wires $A_3$, $A_2$, $A_1$, $A_0$, for input A are connected to two separate nodes of the B input wires. In FIGS. 9 through 11, each node of B input wires has been labeled with the conceptual value of the A input associated with that node for the addition function. For instance, the leftmost node of B input wires in FIGS. 9 through 11, corresponding to an addition value of "0" for A, is labeled as the "+0" node. From left to right in FIG. 9, the succeeding nodes of B input wires have been labeled as the "+1", "+2", "+3" blocks, respectively. Finally, the remaining nodes of B inputs for Gates 910 and 920 have been labeled as Block "+4."

In gate 910, the value of the ADD/SUB/PASS input will determine which A input line corresponds to each node of B input wires. For instance, in gate 900, although the $A_0$ wire is coupled to the "+0" node for addition, the three's complement of zero, $A_3$, is coupled to the "+0" node for subtraction. FIG. 9 and Tables 8 and 14 illustrate that this novel scheme produces the desired results for both addition and subtraction. For instance, consider the add and subtract functions for $A_0$, which corresponds to an A input value of zero. If the ADD value is enabled for the ADD/SUB selector, the $A_0$ input value will be NAND'ed with the "+0" node B inputs. Thus, the value of B will be added to zero. In contrast, for subtraction the $A_0$ input is NAND'ed with the "+3" node of B inputs, representing the three's complement of A. If SUB value is enabled for the ADD/SUB selector, the three's complement of zero will therefore be added to the B input.

For gate 910, the values of the ADD/SUB/PASS input and the Cin input will determine which A input line corresponds to each node of B input wires. For gate 920, this correspondence is determined by the values of the ADD8/ADD1632/SUB8/SUB1632/PASS input and the Cin input. In Gates 910 and 920, the $A_0$ input is NAND'ed with the "+4" node of B inputs, representing the four's complement of $A_0$, when an LSD subtraction with no borrow in is indicated.

Sum/Bypass Logic Configuration

FIG. 14 illustrates that the 16-dit operands are each processed by at least one of the present invention's 101 six functional blocks: MIXL, LOW, MIXH, HIGH, TOP0, and TOP1. The Sum/Bypass Logic for each block contains three standard adder/subtractor/bypass/HPG gates 900 to process the three most significant dits within each block. Within each block except the TOP block, an LSD gate, 910 or 920, is placed to process the least significant dit within each block. The LSD of the MIXL block is processed by gate 910a. The LSD of the LOW block is processed by gate 910b. The LSD of the MIXH block is processed by gate 910c. The LSD of the HIGH block is processed by the specialized LSD gate 920. The LSD of the TOP0 and TOP1 blocks are processed by additional standard adder/subtractor/bypass/HPG gates 900*m* and 900*q*, respectively. The Sum/Bypass Logic for the LSD's of the TOP sub-blocks does not comprise LSD gates because neither TOP0 nor TOP1 will ever process the LSD for an operation category. Instead, TOP will only ever process the sixteen most significant dits of an EXTENDED operation.

Figure 15:
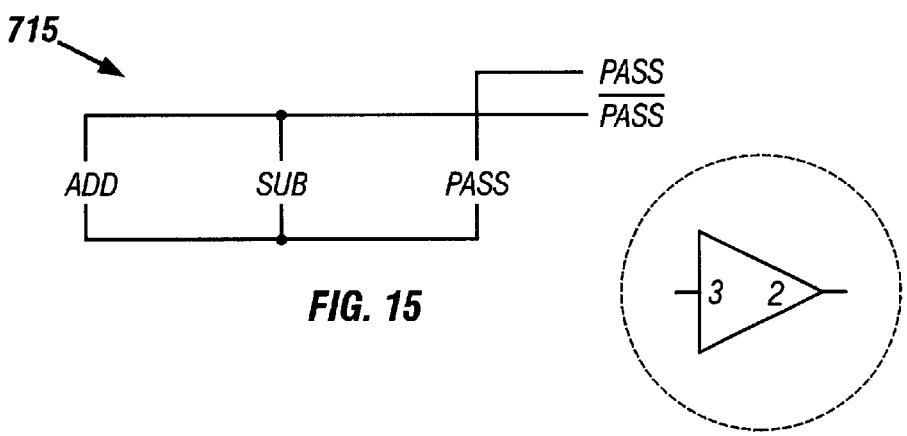
FIG. 15 is a shorthand representation of a compression buffer.

In addition to the adder/subtractor/bypass/HPG gates 900*a*–910*t*, 910*a*–911*c*, 920 discussed above, FIG. 14 illustrates that the Sum/Bypass Logic also comprises a TOP block compression buffer 715. This TOP block compression buffer 715 is illustrated in FIG. 15 and is used as part of the present invention's logic that determines whether the HIGH block's functional HPG indicator should be forced to a HALT or should be allowed to propagate, if appropriate, a carry into the TOP block. FIG. 15 illustrates that the TOP block compression buffer receives as an input the ADD/SUB/PASS control input for the TOP block. If the ADD or SUB wire is asserted, then the TOP block will not be bypassing, and the $\overline{\text{PASS}}$ output wire is asserted. In contrast, if the TOP block's PASS control input wire is asserted, the gate 715 asserts the Pass output wire. FIG. 14 illustrates that this PASS/$\overline{\text{PASS}}$ output is passed from the TOP block compression buffer 715 to the HPG Logic, discussed below. (The compression feature is not necessary to the practice of this invention, although such compression is an efficiency feature. The following discussion illustrates that the HPG Logic may also utilize 1-of-3 ADD/SUB/PASS indicators to perform the same basic function as the PASS/$\overline{\text{PASS}}$ indicator generated by Buffer 715).

HPG Logic—Overview

Generally, the HPG Logic performs block HPG processing. In the TOP block, the intermediate sums generated by the Sum/Bypass Logic are merely held by the HPG Logic in buffers for later use by the next level of logic, the Result Logic. In contrast, handling of the carry logic in the lower (less significant) blocks of the HPG Logic is complicated by the need to support various result-merging modes. In particular, it is necessary to inhibit carry propagation into any adder section that is bypassing, while allowing carry propagation to occur between sections during 16- and 32-bit operations.

FIG. 14 illustrates that the HPG Logic for blocks that only act as the least significant block of an operation (i.e., LOW, MIXL, and MIXH) comprise adder cells. Because a carry generated by the intermediate sum of a dit of lesser significance can never propagate into the LSD of an operation, the ultimate result of such blocks may be generated in the second logic level. In contrast, the TOP block may receive a carry propagated by the HIGH block.

Even more complicated is the processing for the HIGH block. In some circumstances (i.e., HIGH operation) the HIGH block acts as the least significant block for an operation. In those circumstances, the ultimate result may be calculated in the second logic level. The HPG Logic for the HIGH block therefore comprises adder gates. However, in a 16- or 32-bit operation, a carry may propagate into the HIGH block from the LOW block. For this reason, additional processing for the HIGH block occurs in the Result Logic, discussed below.

Further complicating the HPG Logic, the carry out of the Merge Adder 101 must reflect the appropriate size of the operation being performed.

Level Two Logic Gates

Figure 12:
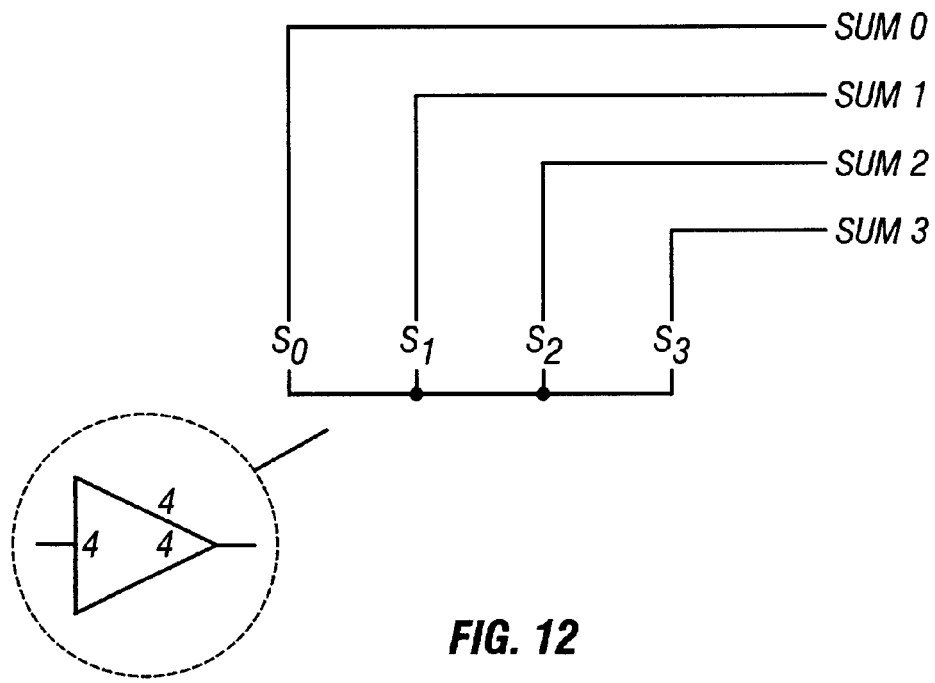
FIG. 12 is a shorthand representation of a sum buffer.
Figure 12A:
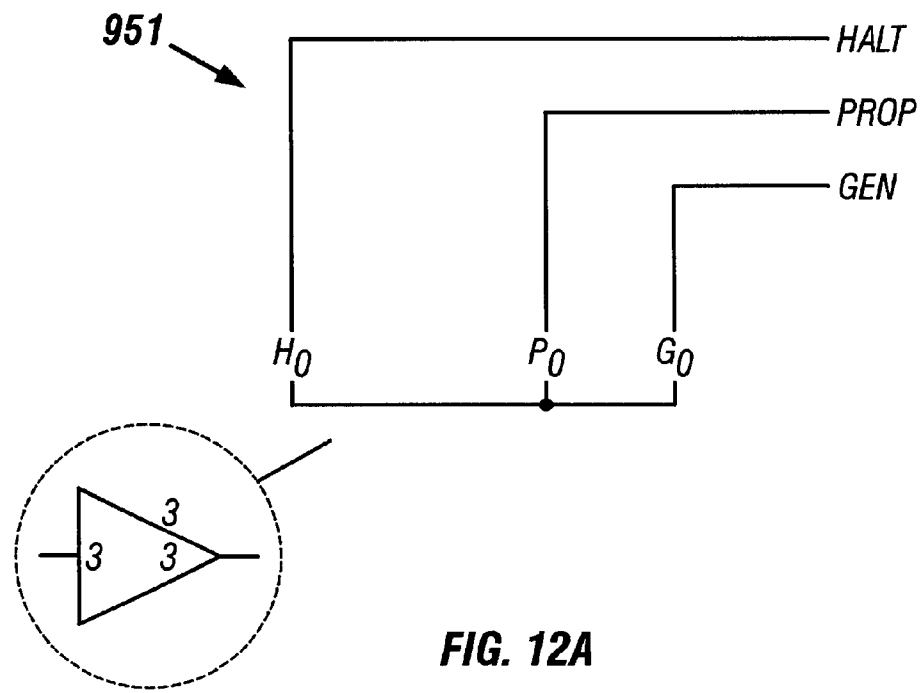
FIG. 12A is a shorthand representation of an HPG buffer.

FIG. 14 illustrates that the HPG Logic comprises adder gates 931*a*–*d*, 932*a*–*e*, 930*a*–*h*, 933*a*–*c*, block HPG gates, 714*a*–*b*, 716, 952*a*–*b*, 953*a*–*b*, 954*a*–*f*, a compression buffer 715*b*, a HIGH/MIXH mux 718, and other buffers 950*a*–*l*, 951*a*–*c*. The adder gates 930, 931, 932, 933, are illustrated in FIGS. 18, 18B, 18A, and 18C, respectively. The block HPG gates 952, 953, 954, 714, 716, are illustrated in FIGS. 14A, 15A, 16, 17, and 13, respectively. The compression buffer 715 is illustrated in FIG. 15. The HIGH/MIXH mux 718 is illustrated in FIG. 19. The other buffers 950, 951 are illustrated in FIGS. 12 and 12A, respectively.

As stated above, the HPG Logic for the TOP block involves storing the intermediate sum for each dit in a sum buffer 950. FIG. 14 illustrates that Gates 900*m* through 900*t* route their intermediate sum values to Buffers 950*e* through 950*l*, respectively. The operation of the sum buffer 950 illustrated in FIG. 12 is simply to store a 1-of-4 value without disturbing its value.

FIG. 14 illustrates that the HPG Logic comprises a compression buffer 715*b*, which compresses the ADD/SUB/PASS control input for the MIXL block into a 1-of-2 PASS/$\overline{\text{PASS}}$ value. This PASS/$\overline{\text{PASS}}$ value is passed to Result Logic gates 720*a*–720. The compression buffer 715 is illustrated in FIG. 15.

FIG. 14 illustrates that HPG Logic processing for the MIXL, LOW, MIXH, and HIGH blocks differs from that for the TOP block. This is true because a carry from a block of lesser significance will never propagate into the MIXL, LOW, or MIXH blocks, nor into the HIGH block when a HIGH operation is being performed. For this reason, the final output values for Dits 0 through 7 and for Dits 8 through 15 are generated at the HPG Logic level. The final result for Dits 0 through 7 for a MIXL operation are generated by Gates 931*a*, 932*a*, and 930*a*, respectively. The final result for Dits 0 through 7 for a LOW operation are generated by Gates 931*b*, 932*b*, and 930*b*, respectively. The final result for Dits 8 through 15 of a MIXH operation are generated by Gates 931*c*, 932*c*, and 930*c*, respectively. The final result for Dits 8 through 15 of a HIGH operation are generated by Gates 931*d*, 932*d*, and 930*d*, respectively. The operation of gates 930 and 932 is set forth below in the section entitled "Result Logic Incrementor Gates." Because gate 931 is only used in the HPG Logic, its operation is set forth immediately below.

Gate 931 increments the value of a particular dit of the intermediate sum, if there is a carry or propagate into said dit. This logic utilizes the HPG signals generated by the Sum/Bypass Logic to determine whether to increment the intermediate sum values generated by Gates 910*a*–*c* and 900*a*–*l*. FIG. 18B illustrates the simplest incrementor gate. FIG. 18B illustrates that the inputs into the simple incrementor gates are the 1-of-4 intermediate sum for the dit of interest, computed in the first level of logic, and one 1-of-3 HPG signal, computed in the first logic level for the dit immediately less significant that the dit whose intermediate sum is being processed by the simple incrementor gate 931. The output of the simple incrementor gate 931 is a final 1-of-4 sum for the dit of interest. (Resolution of whether the LOW vs MIXL and HIGH vs. MIXH final result should be used is determined in the Result Logic by gates 720 and 719).

For illustrative purposes, the operation of gate 931 is presented in the context of Dit 1 processing. FIG. 18B illustrates that SUM (for Dit 1) and the HPG signal for the LSD, HPG0, are inputs into the simple incrementor gate 931*a*. Gate 931*a* is illustrated in FIG. 18B. The HPG0 signal is a 1-of-2 signal generated by the Level One LSD gate, which is labeled as 910*a* in FIG. 14. The value of the HPG0 signal indicates whether a Halt, Propagate, or Generate signal is generated by the LSD. FIG. 18B illustrates that the simple incrementor gate 931a takes this 1-of-3 HPG0 signal and the 1-of-4 SUM signal and increments SUM by one, if the G0 signal is asserted, to generate the final output for dit 1, DIT1. Otherwise, a carry into the dit of interest, Dit 1, has not occurred. Accordingly, when the H0 or P0 wires are asserted, the simple incrementor gate 931a does not increment the value of SUM, but merely passes it through as the final output, DITX.

Our discussion of HPG Logic gates now turns to the sum buffers 950a–950d. FIG. 14 illustrates that the HPG Logic LSD of each of the MIXL, LOW, MIXH, and HIGH blocks operate differently than the three most significant dits of each said block. The intermediate sum generated by the Sum/Bypass Logic for each said block is stored by the HPG Logic in a sum buffer 950a, 950b, 950c, 950d, respectively.

FIG. 14 illustrates that the HPG Logic comprises, in addition to the logic gates already discussed, various block HPG gates 952a–b, 953a–b, 954a–f, 714a–b, and 716. The HPG Logic computes block-level HPG signals. This step is executed to reduce the complexity of the "carry in" computation for each block of dits that occurs in the third level of logic.

The basic function of the block HPG gates is to perform "block HPG" logic to determine if a carry into a particular dit of the intermediate sum will occur. This block HPG logic takes into account any carry into the dit of interest that is generated by dits of lesser significance within the same block. The block HPG signals generated by the HPG Logic are used by the Result Logic to do two things. First, the Result Logic determines if the intermediate difference for each dit should be incremented before final output. The block HPG signals used to do this are called "functional" HPG indicators. Second, the Result Logic uses the block HPG indicators to generate "architectural" HPG indicators that are passed to the control logic's status register to indicate whether or not a carry was generated by the requested operation.

The efficiency of block-level HPG logic in the second logic level is revealed when the carry-in calculation for each dit is examined. Referring back to Equ. 1, above, the Carry into a bit, $C_{n-1}$, is calculated as:

$$C_{n-1} = G(n-1) | P(n-1)G(n-2) | P(n-1)P(n-2)G(n-3) | \ldots | P(n-1)P(n-2) \ldots P(1)G(0). \quad (5)$$

Equation 5 illustrates that any carry can theoretically be determined from propagate and generate signals using a single level of logic. To do so, however, becomes impractical for any substantial adder because the size of the carry gate becomes impractical for one level of logic. For instance, in a 32-bit adder, Equation 5 indicates that 31 AND terms would be required with the largest term containing 31 literals. To reduce the complexity of the carry computation, the Second Level of the present invention constrains the scope of the computation to blocks of 4 dits each. This simplifies the gates required in return for the cost of adding more levels of logic to the critical path.

The block HPG gates of the TOP block are illustrated in FIG. 14 as 952a–b, 953a–b, and 954e–f. FIG. 14 illustrates that a four-input block HPG gate 954 is used to process the block HPG indicator for the TOP0 (954e) and TOP1 (954f) sub-blocks. The block HPG indicator generated by gate 954e is used by the Result Logic to determine whether to increment each intermediate sum dit of the TOP1 block before final output. FIG. 14 illustrates that gate 954 is also used in the MIXL block (954a), LOW block (954b), the MIXH block (954c), and the HIGH block (954d). The lower block gates 954a–d and the TOP1 gate (954f) generate block HPG indicators that are used for the same purpose—they are used by the carry out gate 970 to determine the architectural HPG indicator for the requested operation. (FIG. 14 illustrates that, in addition to its sum increment function, the HPG indicator generated by gate 954e is also used by the carry out gate 970 to determine the architectural HPG indicator).

FIG. 14 illustrates that the remaining block HPG gates of the TOP block are of varying sizes. These gates 952, 953 are smaller and are used within a block to compute the carry into dit positions not on block boundaries. The smallest Level Two HPG gate 952 calculates the carry into a particular dit based on the HPG signals for the two dits of lesser significance within the sub-block block in which the dit of interest lies. FIG. 14A further illustrates this two-input Level Two HPG gate 952. The two-input Level Two HPG gate 952 receives as inputs two 1-of-3 HPG signals. The first signal, noted as HPG1 in FIG. 14A, comprises three wires labeled as H1, P1, and G1. FIG. 11 illustrates that the HPG1 signal delivers to gate 952 the HPG signal for the dit immediately adjacent (less significant) than the dit of interest. The second HPG input into the two-input Level Two HPG gate 952, noted as HPG0 in FIG. 14A, comprises three wires labeled as H0, P0, and G0. FIG. 11 illustrates that the HPG0 signal delivers to gate 952 the HPG signal from the second dit less significant than the dit of interest. FIG. 14A illustrates that if the H1 signal is asserted, signifying a halt signal from the adjacent dit, then the HALT output signal is asserted. If the G1 signal is asserted, signifying a generate signal from the adjacent dit, then a GEN signal output signal is asserted. If the P1 input signal is asserted, then the HPG0 signal must be evaluated. FIG. 14A illustrates that if P1 and H0 are asserted, a halt signal has propagated, from the dit of second lesser significance, across the immediately adjacent dit. In such a case, the two-input block HPG gate 952 asserts the HALT output signal. If P1 and G0 are asserted, then a generate signal has propagated, from the dit of second lesser significance, across the immediately adjacent dit. In such a case, the two-input block HPG gate 952 asserts the GEN signal output. If P1 and P0 are both asserted, then a PROP output is asserted by gate 952.

FIG. 14 illustrates that the remaining block HPG gates of the TOP block are of varying sizes. These gates 952, 953 are smaller and are used within a block to compute the carry into dit positions not on block boundaries. The smallest Level Two HPG gate 952 calculates the carry into a particular dit based on the HPG signals for the two dits of lesser significance within the sub-block block in which the dit of interest lies. FIG. 14D further illustrates this two-input Level Two HPG gate 952. The two-input Level Two HPG gate 952 receives as inputs two 1-of-3 HPG signals. The first signal, noted as HPG1 in FIG. 14D, comprises three wires labeled as H1, P1, and G1. FIG. 11 illustrates that the HPG1 signal delivers to gate 952 the HPG signal for the dit immediately adjacent (less significant) than the dit of interest. The second HPG input into the two-input Level Two HPG gate 952, noted as HPG0 in FIG. 14D, comprises three wires labeled as H0, P0, and G0. FIG. 11 illustrates that the HPG0 signal delivers to gate 952 the HPG signal from the second dit less significant than the dit of interest. FIG. 14D illustrates that if the H1 signal is asserted, signifying a halt signal from the adjacent dit, then the HALT output signal is asserted. If the G1 signal is asserted, signifying a generate signal from the adjacent dit, then a GEN signal output signal is asserted. If the P1 input signal is asserted, then the HPG0 signal must be evaluated. FIG. 14D illustrates that if P1 and H0 are asserted, a halt signal has propagated, from the dit of second lesser significance, across the immediately adjacent dit. In such a case, the two-input block HPG gate 952 asserts the HALT output signal. If P1 and G0 are asserted, then a generate signal has propagated, from the dit of second lesser significance, across the immediately adjacent dit. In such a case, the two-input block HPG gate 952 asserts the GEN signal output. If P1 and P0 are both asserted, then a PROP output is asserted by gate 952.

Figure 15A:
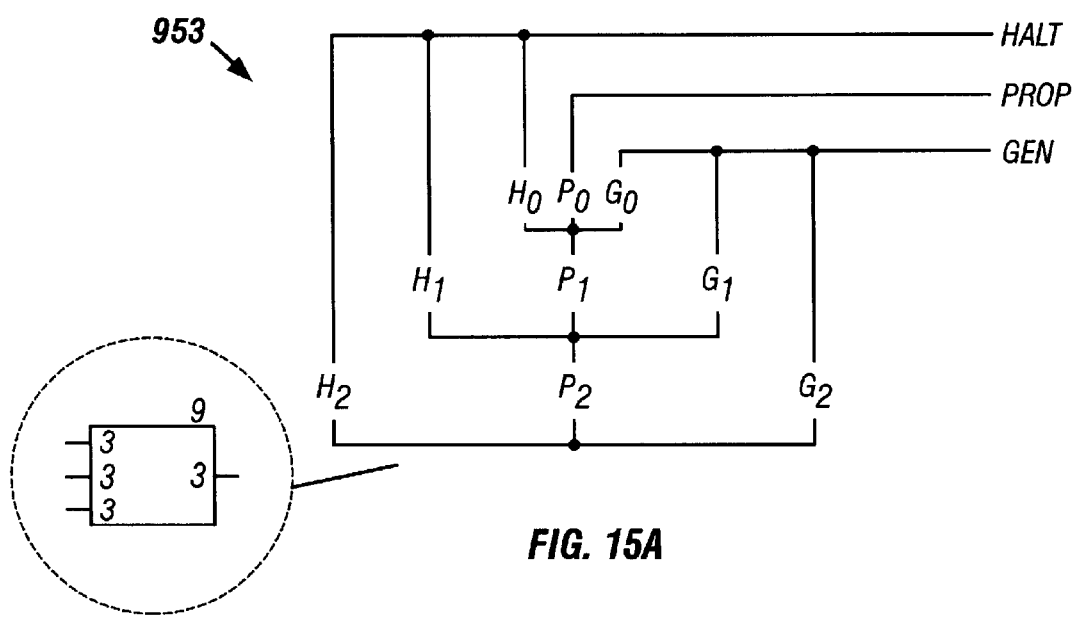
FIG. 15A is a a shorthand representation of a three-input block HPG gate that receives as inputs three 1-of-3 HPG signals.
Figure 16:
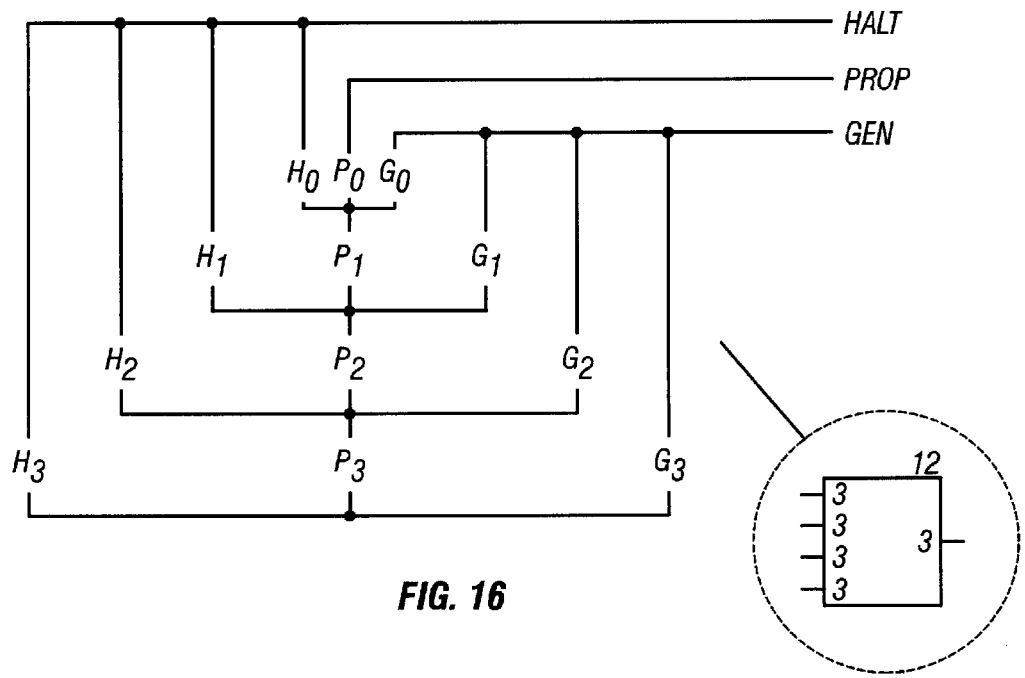
FIG. 16 is a shorthand representation of a four-input block HPG gate that receives four 1-of-3 HPG inputs.

FIG. 15A illustrates that the operation of the three-input block HPG gate 953 is essentially the same as that of the two-input block HPG gate 952 discussed above, except that the three-input block HPG gate 953 receives as inputs three 1-of-3 HPG signals instead of two. Similarly, the four-input Level Two HPG gate 954 illustrated in FIG. 16 receives four 1-of-3 HPG inputs. As with the two-input gate 952, the three-input 953 and four-input 954 block HPG gates generate a HALT output if they encounter an H input, generate a GEN output if they encounter a G input, and go on to evaluate the HPG signal for a dit of lesser significance if they encounter a P input.

Before turning to a discussion of the lower block HPG gates, one should note an additional feature of the TOP block's block HPG processing. The HPG signal generated for Dit 8 by Sum/Bypass Logic gate 900*m* and for Dit 12 by Sum/Bypass Logic gate 900*q* are stored in HPG buffers as well as being processed by block HPG gates. For the carry-in calculations for Dit 9 and Dit 13, only a single HPG indicator need be consulted. Accordingly, the Dit 8 HPG indicator is stored in Buffer 951*a* for use by the Result Logic to determine whether the Dit 9 intermediate sum should be incremented before final output. Similarly, the Dit 9 HPG indicator is stored in Buffer 951*b* for use by the Result Logic to determine whether the Dit 13 intermediate sum should be incremented before final output. FIG. 12A illustrates that the HPG buffer merely passes through its 1-of-3 input as its output.

Figure 17:
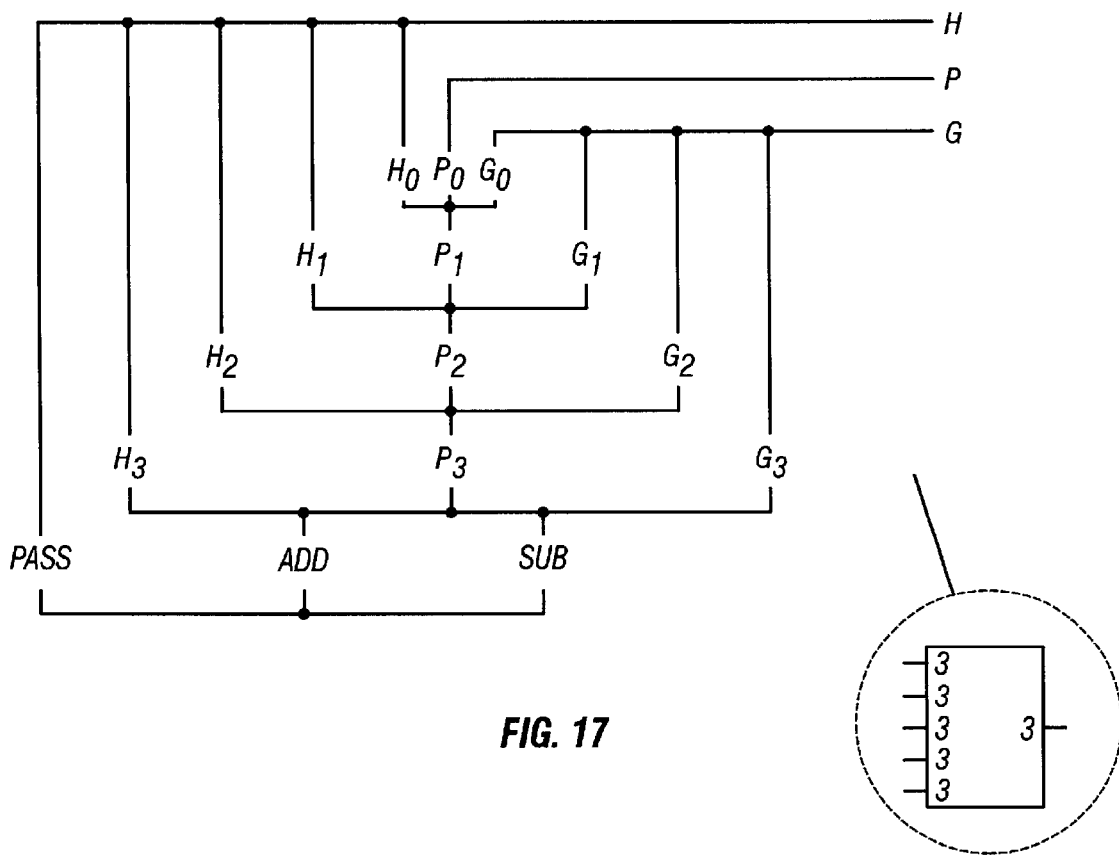
FIG. 17 is a shorthand representation of a lower-block 4-input block HPG gate that receives a 1-of-3 ADD/PASS/SUB input.

Our discussion now turns to the remaining block HPG gates 714*a,* 714*b,* 716 of the lower blocks. Handling of the carry logic in the lower blocks (MIXL, LOW, MIXH, HIGH) is complicated by the need to support the result-merge requirements of the six operation categories supported by the present invention. In particular, it is necessary to inhibit carry propagation in the functional HPG indicators generated by Gates 714*a,* 714*b,* and 716 when such indicators are passed to a higher block that is bypassing. Coincidentally, however, such indicators must allow carry propagation, when necessary, for 16-bit and 32-bit operations. This problem is handled, in part, by incorporating the bypass control into the block-HPG gates shown in FIGS. 13 and 17. The two block HPG gates shown therein, 716 and 714, respectively, are basically identical except that gate 716 receives a compressed PASS/$\overline{\text{PASS}}$ input from the first-level compression buffer 715*a,* whereas gate 714 receives a 1-of-3 ADD/PASS/SUB input. In either case, the gate 714, 716 generates a HALT output when the PASS wire of such input is asserted. For instance, FIG. 14 illustrates that gate 714*a* generates the functional HPG indicator from the LOW block to the HIGH block. One would expect this HPG signal to be set to HALT any time the HIGH block is bypassing. Further examination of FIG. 17 shows this to be true. FIG. 14 illustrates that the control for the HIGH block, ADD/SUB/PASS HIGH, is an input into gate 714*a*. FIG. 17 illustrates that, if the HIGH block's control is set such that the PASS wire is asserted, then the output from gate 714*a* is a H(alt) indicator. Otherwise, the gate 714*a* goes on to evaluate the HPG signals for each dit, beginning with the MSD, within the LOW block. If an H indicator is met, then an H output is generated. If a G indicator is met, then a G output is generated. If a P indicator is met, the HPG signal for the dit of next-lesser significance within the LOW block is evaluated. If all dits in the LOW block have generated a P indicator, then gate 714*a* generates a P output as well.

Figure 13:
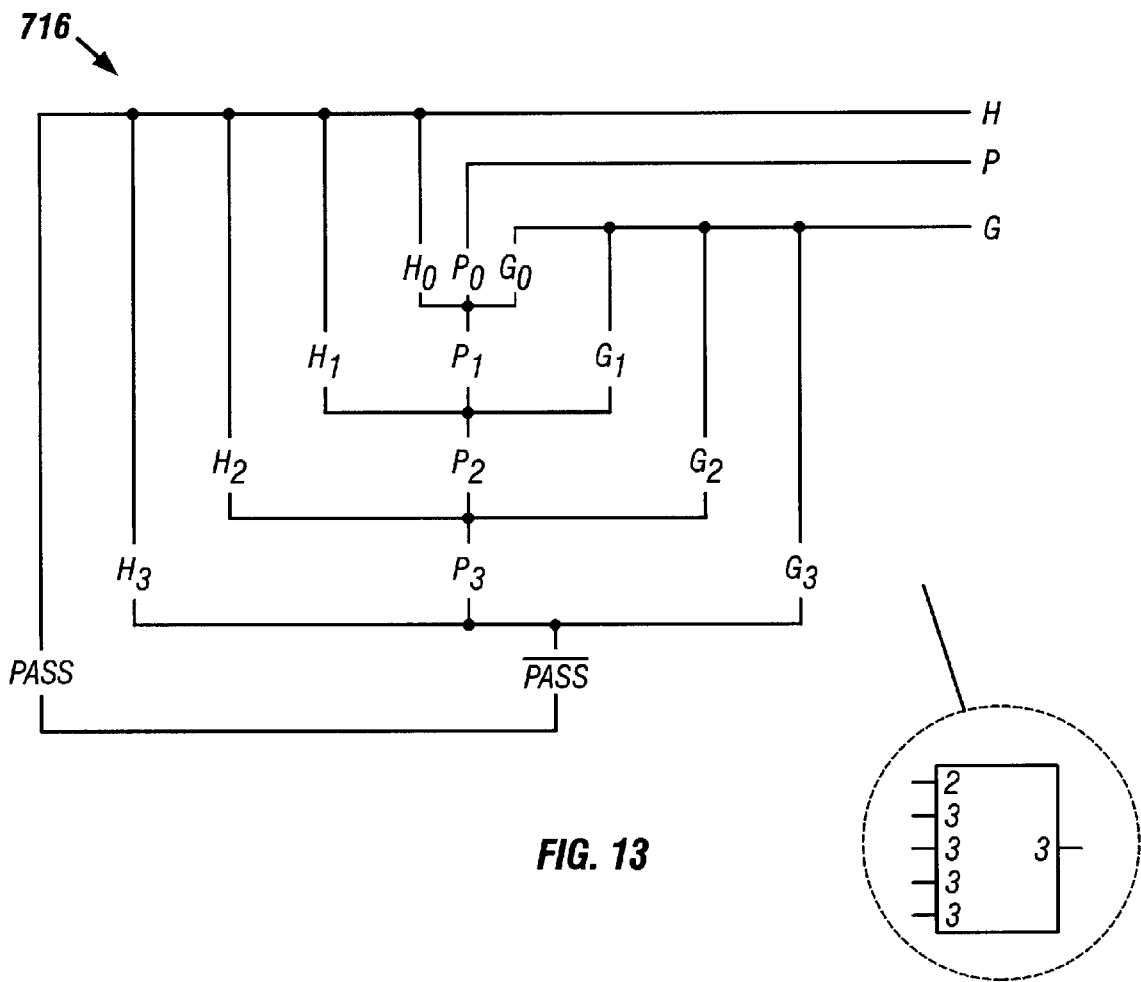
FIG. 13 is a shorthand representation of a lower-block 4-input block HPG gate that receives a compressed PASS/$\overline{\text{PASS}}$ input.
Figure 14A:
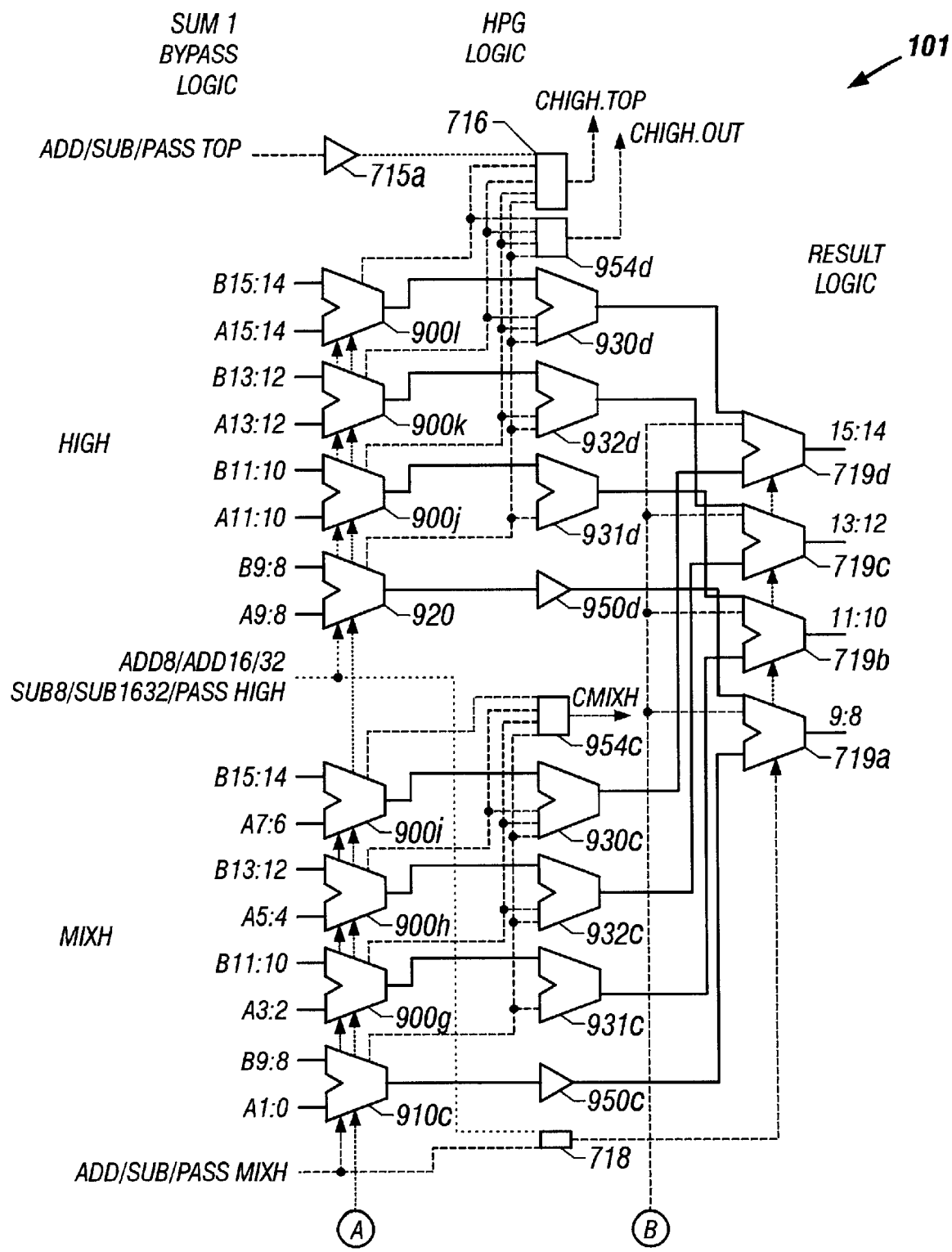
FIG. 14A is a shorthand representation of a two-input block HPG gate that receives as inputs two 1-of-3 HPG signals.
Figure 14B:
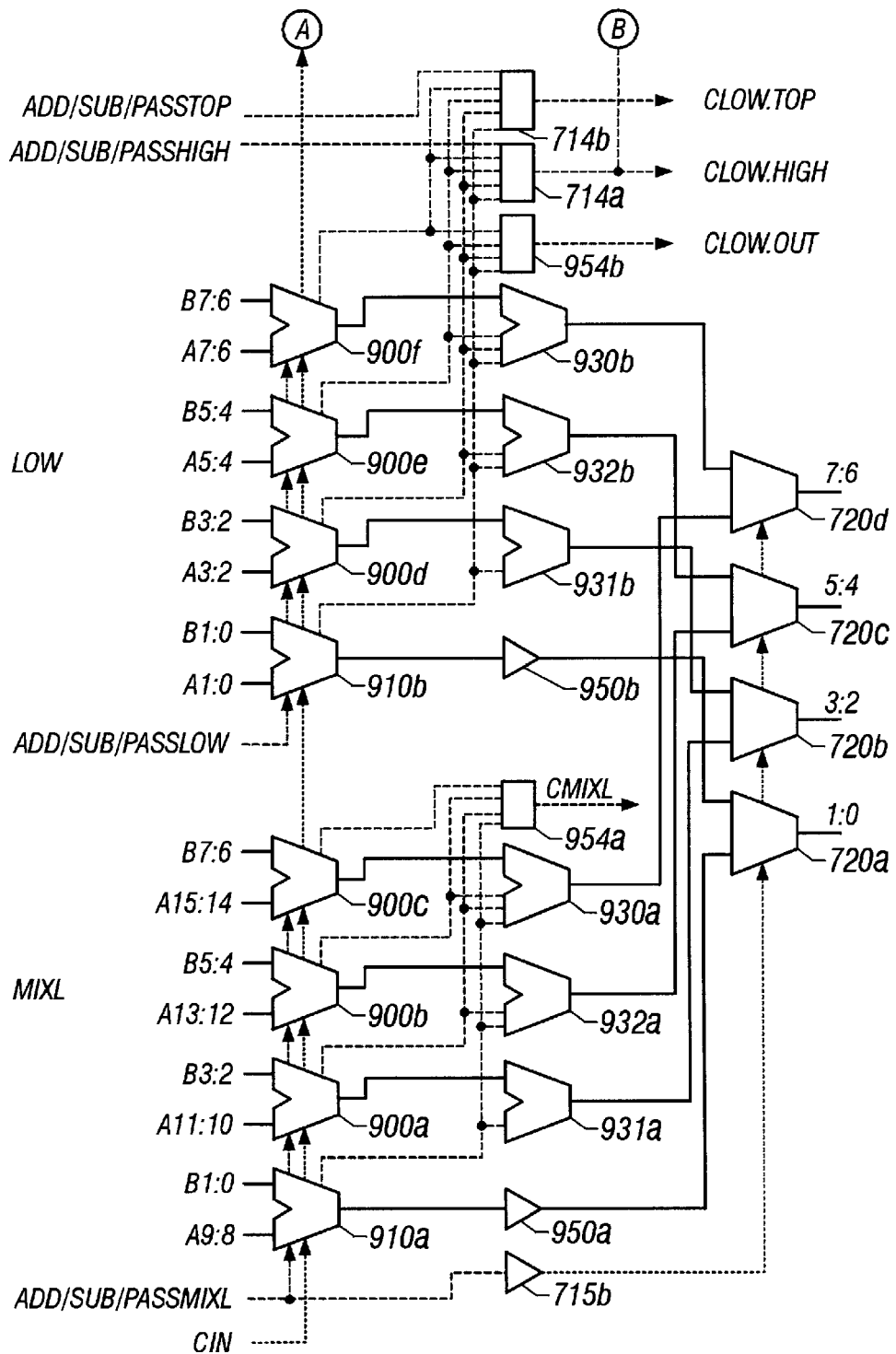
FIGS. 14B–14C is a high-level shorthand representation of the general structure of the present invention.
Figure 14C:
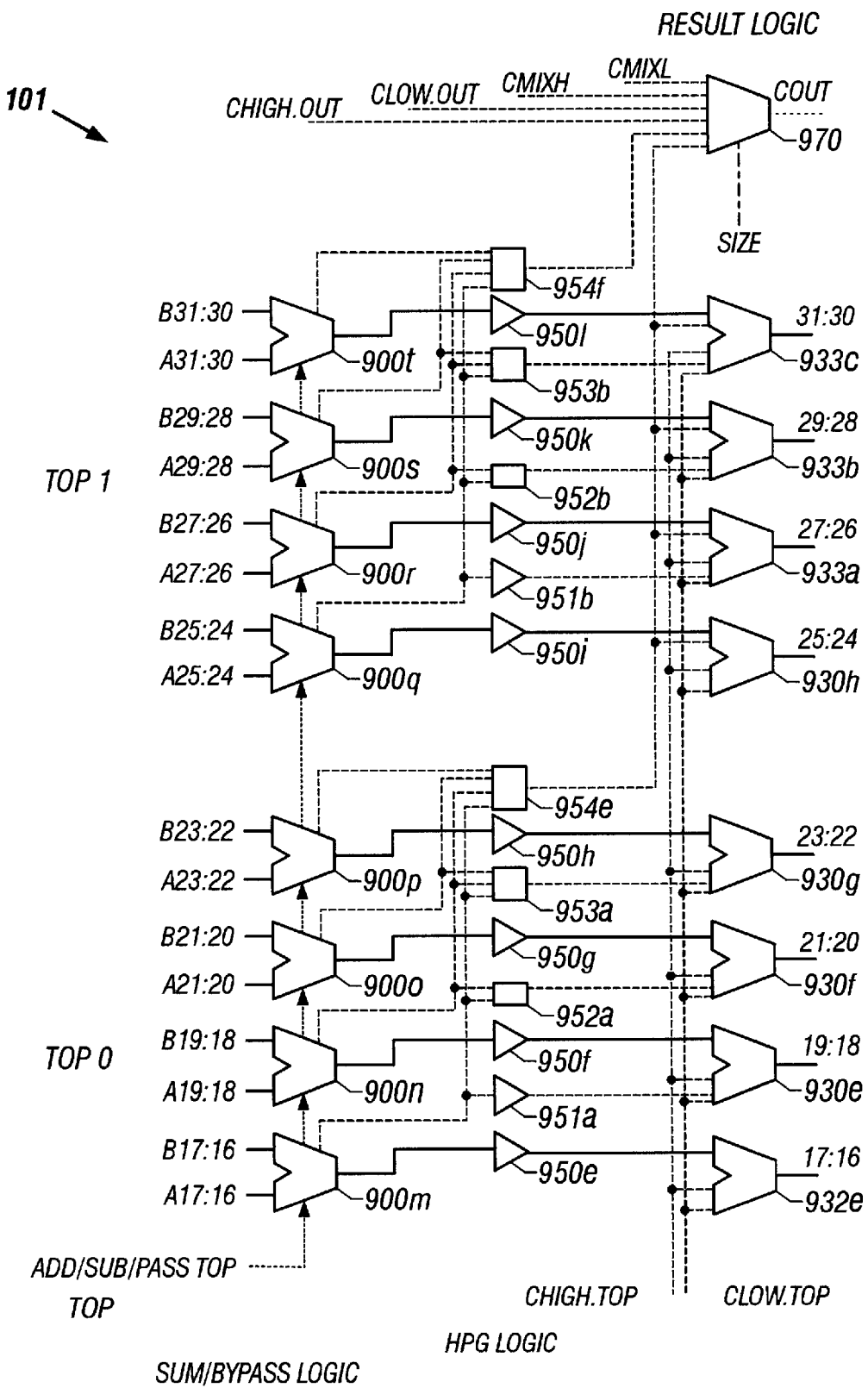
Figure 14D:
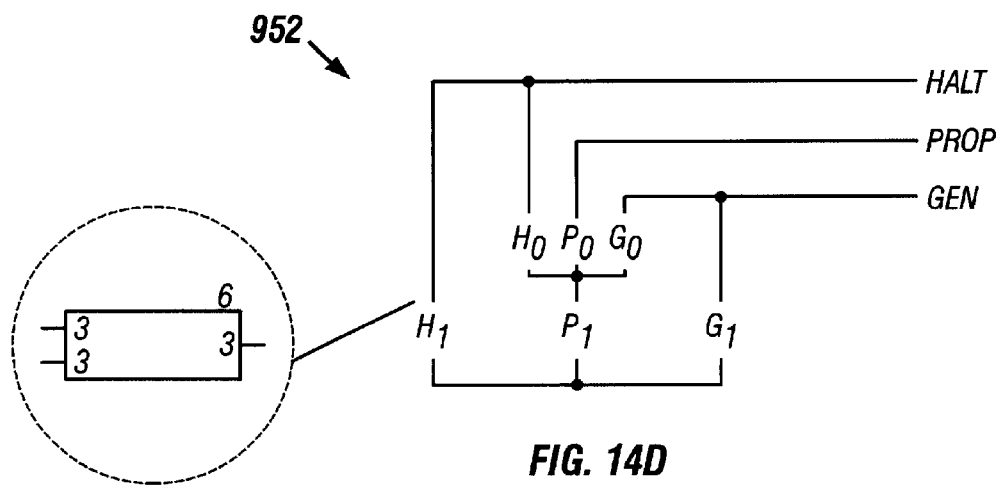
FIG. 14D is a shorthand representation of a two-input block HPG gate that receives as inputs two 1-to-3 HPG signals.

FIG. 14 illustrates that gate 714*b* generates the block HPG indicator, Clow.top, in the same manner. Whereas gate 714*a* generates the functional HPG indicator, from the LOW block as in input to the HIGH block, gate 714*b* generates the block HPG indicator, Clow.top, from the LOW block to the TOP block. The latter is necessary because incrementing of the intermediate sum, if necessary, for the TOP block dits does not occur until the third logic level, much as described in the Adder Patent. For this reason, the HIGH block must also pass a functional HPG indicator to the TOP block. FIG. 14 illustrates that gate 716 generates the HIGH-to-TOP functional HPG indicator, Chigh.top. If gate 716 receives a PASS indicator from gate 715*a,* then the TOP block is bypassing. FIG. 13 illustrates that, in such a case, gate 716 generates a H(alt) output. Otherwise, when the TOP block is either adding or subtracting for the selected operation (i.e., EXTENDED), then gate 716 generates a block HPG signal as described above, examining the HPG indicator for the MSD of the HIGH block first, and examining the HPG indicators for successively less significant dits within the HIGH block as long as a P indicator is encountered.

Our discussion of the HPG Logic gates now turns to the portions of the MIXL/LOW and MIXH/HIGH result resolution logic that takes place in the second logic level. FIG. 14 illustrates that the adder 101 does not determine until the final logic level whether to form Dits 0 through 7 of the final result from the MIXL intermediate sum or from the LOW intermediate sum. Similarly, FIG. 14 also illustrates that the same determination takes place at the third logic level for the MIXH and HIGH intermediate results. In order to allow this determination to be made at the third level, Gates 715*b* and 718 perform mux logic at the second level.

FIG. 15 illustrates the compression buffer 715 discussed above. FIG. 14 illustrates that the output from compression buffer 715*b* is an input into the third level logic gates for the bits 0 through 7 of the final result. Gate 715*b* acts as a simple 1-of-2 mux that selects the result of the MIXL section (i.e., asserts the $\overline{\text{PASS}}$ output wire) when the ADD/SUB/PASS MIXL control is set to either ADD or SUB. Otherwise, gate 715*b* will assert the PASS output wire, which will be used by gate 720 of the result logic to select the intermediate result of the LOW block as the final result of the selected operation.

FIG. 19 illustrates the mux logic gate 718 used to select between the intermediate results of the MIXH and HIGH blocks in forming 8 through 15 of the final result. Gate 718 selects the intermediate result of the MIXH block, by asserting the MIX output wire, when the ADD or SUB wires of the MIXH control, ADD/SUB/PASS MIXH, are asserted. If the MIXH control's PASS wire is asserted, then the 1-of-5 control for the HIGH block must be consulted. If an add (any size) or subtract (any size) is indicated by the HIGH block control, ADD8/ADD1632/SUB8/SUB1632/PASS HIGH, then gate 718 selects the intermediate sum of the HIGH block by asserting the ADD wire, which indicates that the final result will be the intermediate result of the HIGH block after it is added to any carry generated by the LOW block. If the PASS wires of the controls for both the MIXH and HIGH blocks are asserted, then gate 718 selects to pass the HIGH result.

Result Logic

The final logic level, the Result Logic, performs two basic functions. For the least significant dits of the final result (Dits 0 through 15), the Result Logic selects either the MIXL or LOW intermediate results and selects either the MIXH intermediate result or selects the HIGH intermediate result and increments that result, if necessary, with a carry from the LOW block. For the TOP block, the Result Logic uses incrementor gates to determine whether there is a carry into a particular dit of the intermediate sum and to increment the value in the dit, if necessary. The gates that perform the latter function will be discussed below first.

Result Logic Incrementor Gates

Figure 18:
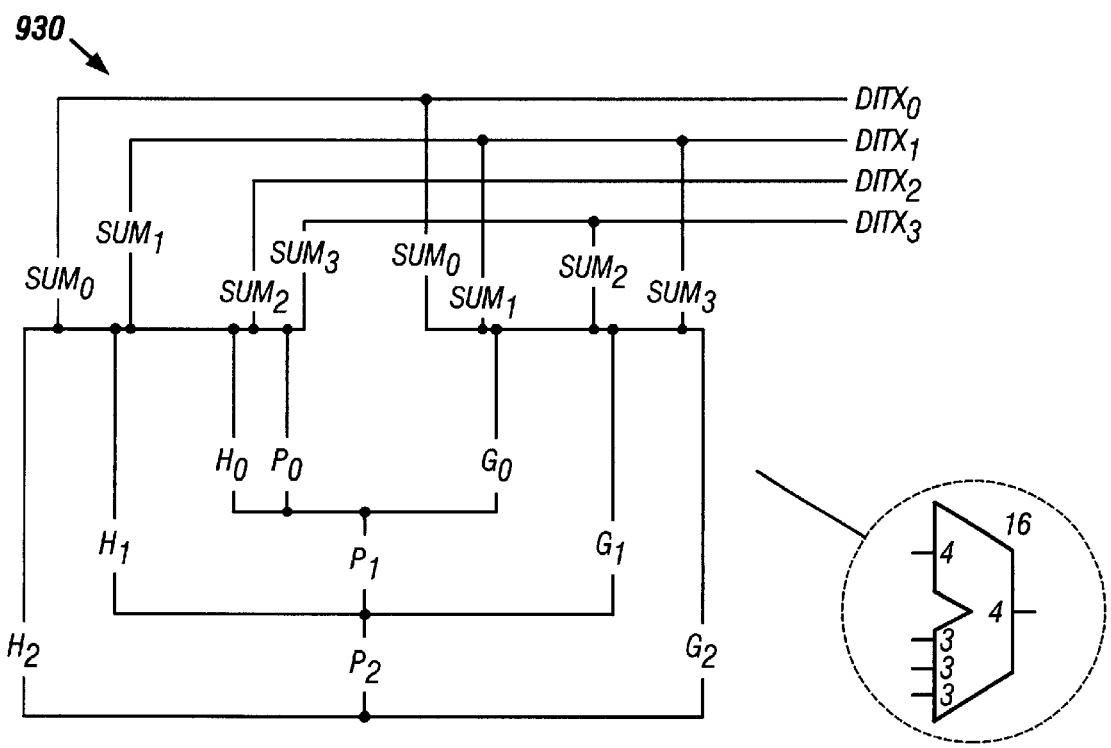
FIGS. 18, 18A, 18B, and 18C are shorthand representation of different incrementor gates in the final logic-level of the present invention.
Figure 18A:
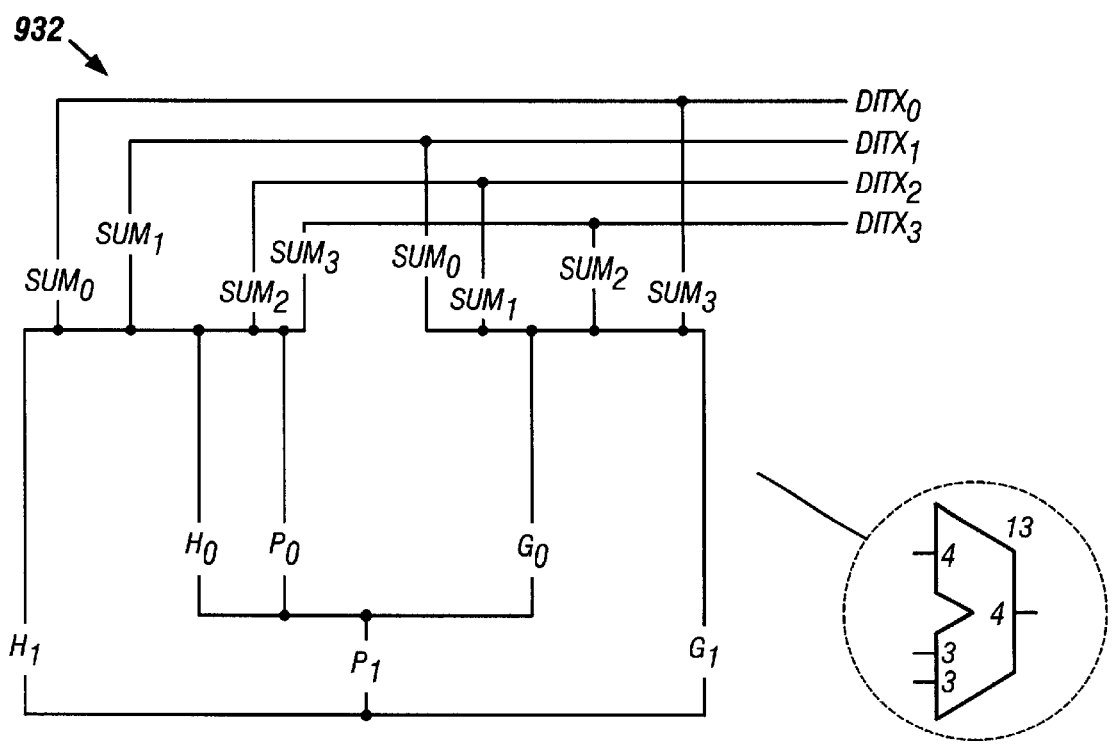
Figure 18B:
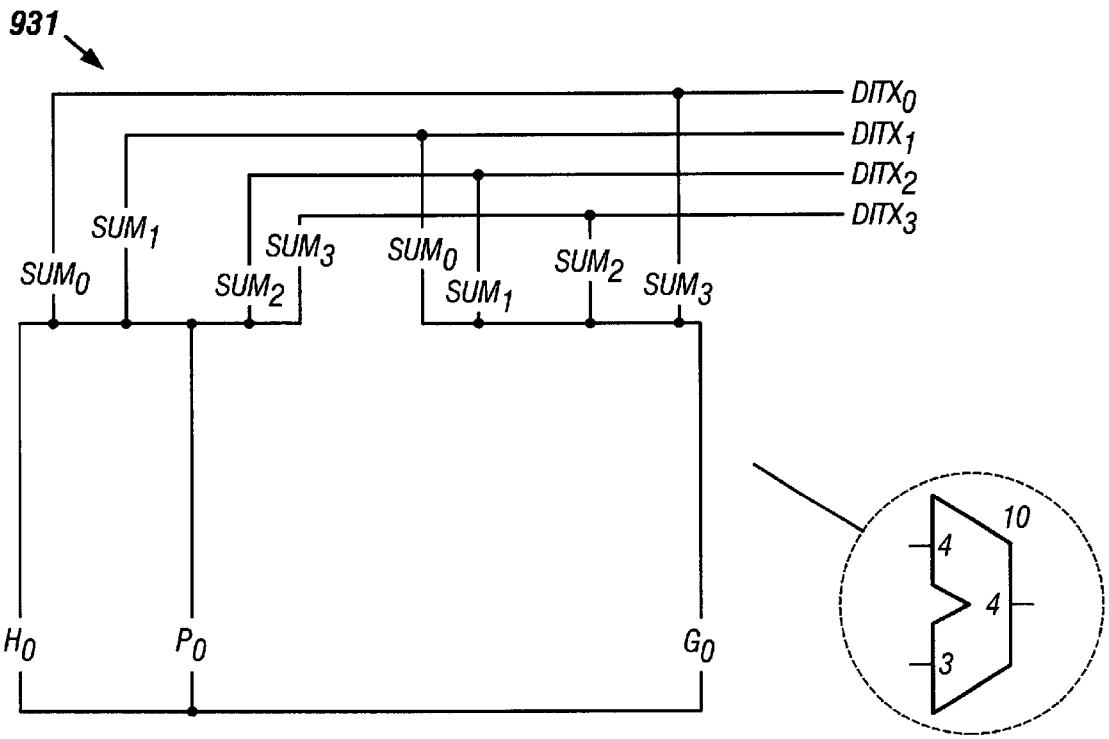
Figure 18C:
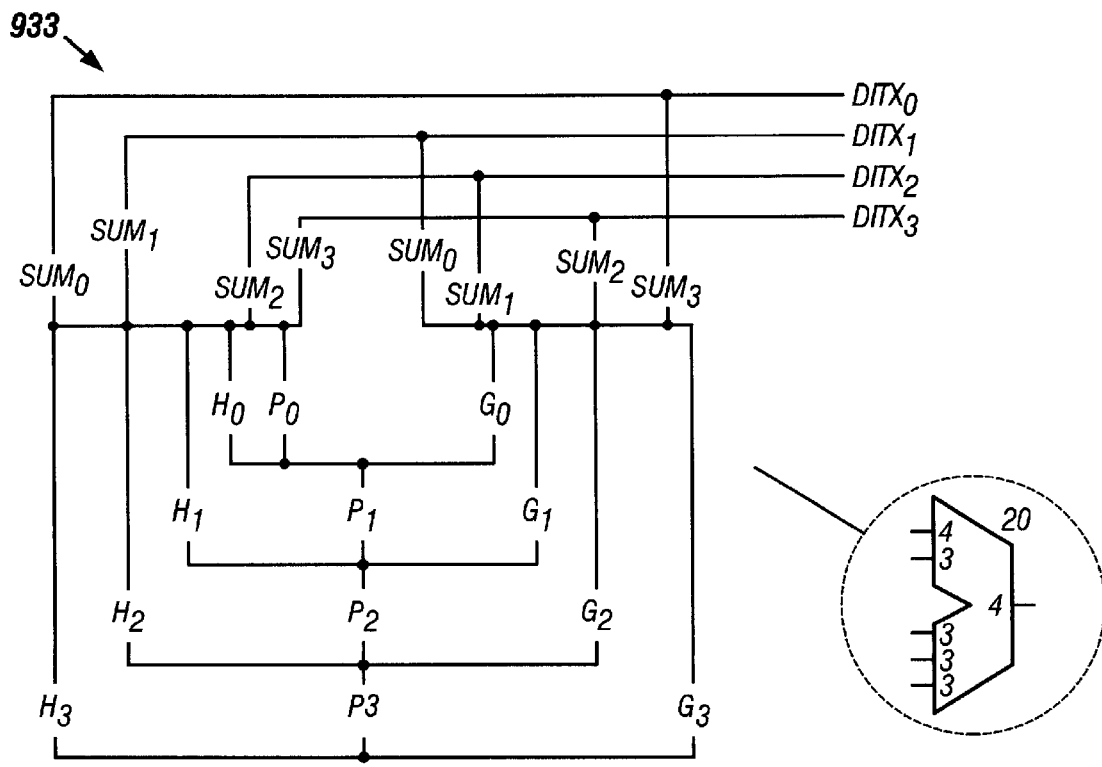
Figure 19:
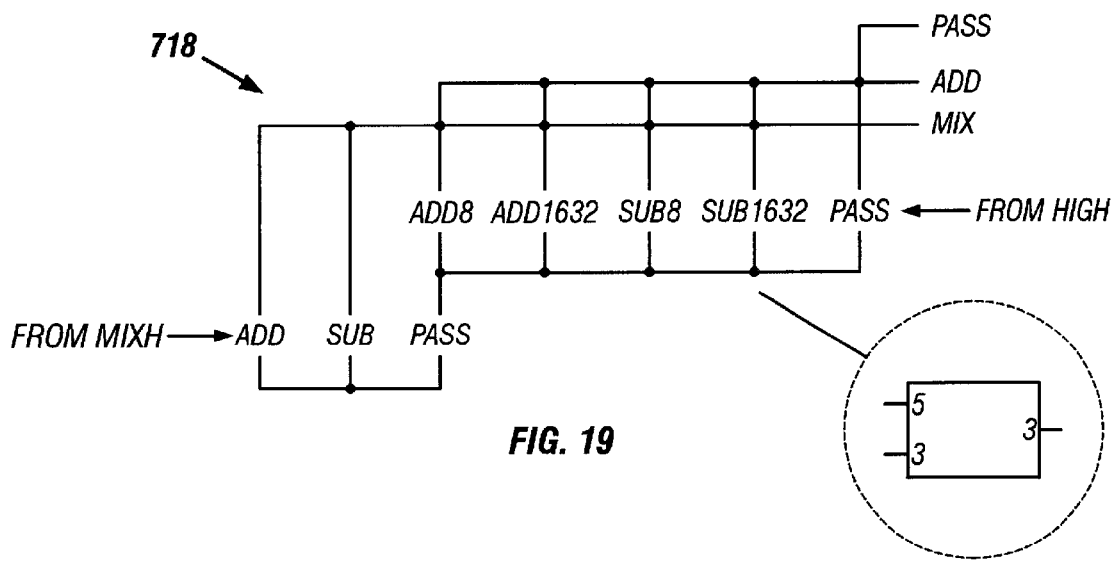
FIG. 19 is a shorthand representation of a MIXH-HIGH selection gate used to select between the intermediate results of the MIXH and HIGH blocks in forming bits 8 through 15 of the final result.

The incrementor gates 930, 932, and 933 of the final level are shown in FIGS. 18, 18B, and 18C. The inputs into the incrementor gates 930, 932, and 933 are the 1-of-4 intermediate sum for the dit of interest, computed in the first level of logic, and up to three 1-of-3 block HPG signals computed in the second level. The output of the incrementor gates 930, 932, and 933 is a final 1-of-4 sum for the dit of interest. In the third logic level, if there is a carry into the dit position for the dit of interest, then 1 is added to the intermediate sum to form the final sum. A carry into the dit of interest is signified by a generate in an adjacent dit or a more distant generate propagated through adjacent dits. If there is no carry in, then the intermediate sum for the dit of interest is passed through the incrementor gates 930, 932, 933 unmodified.

FIG. 18A illustrates an incrementor gate 932 that is slightly more complex than the simple incrementor gate 931, discussed above in connection with the HPG Logic, because it takes two block HPG signals as inputs, rather than one. Such gate 932 is referred to herein as the "two-block incrementor gate." The two-block incrementor gate 932 receives as inputs the intermediate sum, SUM, for a particular dit, as well as two block HPG signals, HPG0 and HPG1. HPG1, comprising H1, P1, and G1, is the 1-of-3 functional block HPG signal generated by the HIGH block, Chigh.top. HPG0, comprising H0, P0 and G0, is the 1-of-3 HPG signal for the LOW block, Clow.top. FIG. 18A illustrates that the two-block incrementor gate 932 first evaluates the HPG1 signal. If H1 is asserted, then the intermediate sum, SUM, for the dit of interest is simply passed through as the final output, DITX. If G1 is set, then a carry has been generated by the block of lesser significance closest (HIGH) to the block in which the dit of interest lies (TOP). FIG. 18A illustrates that, if G1 is asserted, then the intermediate sum, SUM, is incremented by one before being delivered as the final output for the dit of interest, DITX. If P1 is asserted, then SUM will only be incremented if a carry from the next-further block (i.e., LOW) propagates across the HIGH block to dit of interest. HPG0 must therefore be examined if P1 is asserted. FIG. 18A illustrates that when P1 is asserted, the two-block incrementor gate 932 increments the intermediate sum, SUM, if G0 is asserted. If P1 and either H0 or P0 are asserted, then the two-block incrementor gate 932 simply passes SUM through as the final output, DITX.

FIG. 18 illustrates that similar processing occurs in incrementor gate 930, referred to herein as the "three-block incrementor gate." The three-block incrementor gate 930 is slightly more complex than the two-block incrementor gate 932 because it receives three block HPG signals as inputs, rather than two. The three-block incrementor gate 930 receives as inputs the 1-of-4 intermediate sum, SUM, for the dit of interest. FIG. 18 illustrates that SUM is a 1-of-4 input comprising 4 wires: $SUM_3$, $SUM_2$, $SUM_1$, and $SUM_0$. FIG. 18 also illustrates that gate 930 also receives as inputs three block HPG signals, HPG0, HPG1, and HPG2. HPG2, comprising H2, P2, and G2, is the 1-of-3 block HPG signal generated by the dit(s) of lesser significance within the TOP sub-block in which the dit of interest lies. HPG1, comprising H1, P1, and G1, is the 1-of-3 block HPG signal for the immediately adjacent block of lesser significance, HIGH. HPG0, comprising H0, P0 and G0, is the 1-of-3 block HPG signal for the LOW block. FIG. 18 illustrates that the three-block incrementor gate 930 first evaluates the HPG2 signal. If H2 is asserted, then the intermediate sum, SUM, for the dit of interest is simply passed through as the final output, DITX. If G2 is asserted, then a carry has been generated by the HIGH block. FIG. 18 illustrates that, if G2 is asserted, then the intermediate sum, SUM, is incremented by one before being delivered as the final output for the dit of interest, DITX. If P2 is set, then SUM will only be incremented if a carry has generated into the adjacent dit or has propagated from a more distant dit across all intervening dits. HPG1 must therefore be examined if P2 is asserted. FIG. 18 illustrates that, if P2 is asserted, the three-block incrementor gate 930 next evaluates the HPG1 signal. If H1 is asserted, then the intermediate sum, SUM, for the dit of interest is simply passed through as the final output, DITX. If G1 is set, then a carry has been generated by the block of lesser significance closest to the block in which the dit of interest lies. FIG. 18 illustrates that, if G1 is asserted, then the intermediate sum, SUM, is incremented by one before being delivered as the final output for the dit of interest, DITX. If P1 is set, then SUM will only be incremented if there is a carry into the dit of interest. HPG0 must therefore be examined if P1 is asserted. FIG. 18 illustrates that when P1 is set, the three-block incrementor gate 930 increments the intermediate sum, SUM, if G0 is set. If P1 and either H0 or P0 are set, then the three-block incrementor gate 930 simply passes SUM through as the final output, DITX.

As one can glean from the foregoing discussion, gate 933 operates in a similar fashion, receiving as inputs the LOW and HIGH block functional HPG indicators as well as the TOP0 functional HPG indicator generated by gate 954e. Gate 933 also receives as a final input the HPG indicator generated by the dit(s) of lesser significance within the TOP1 sub-block. As with the other incrementor blocks, gate 933 examines the HPG indicators from dits within the sub-block first, then the TOP0 block, then the HIGH block, then the LOW block, and increments the intermediate sum if necessary.

Result Resolution Gates

Figure 21:
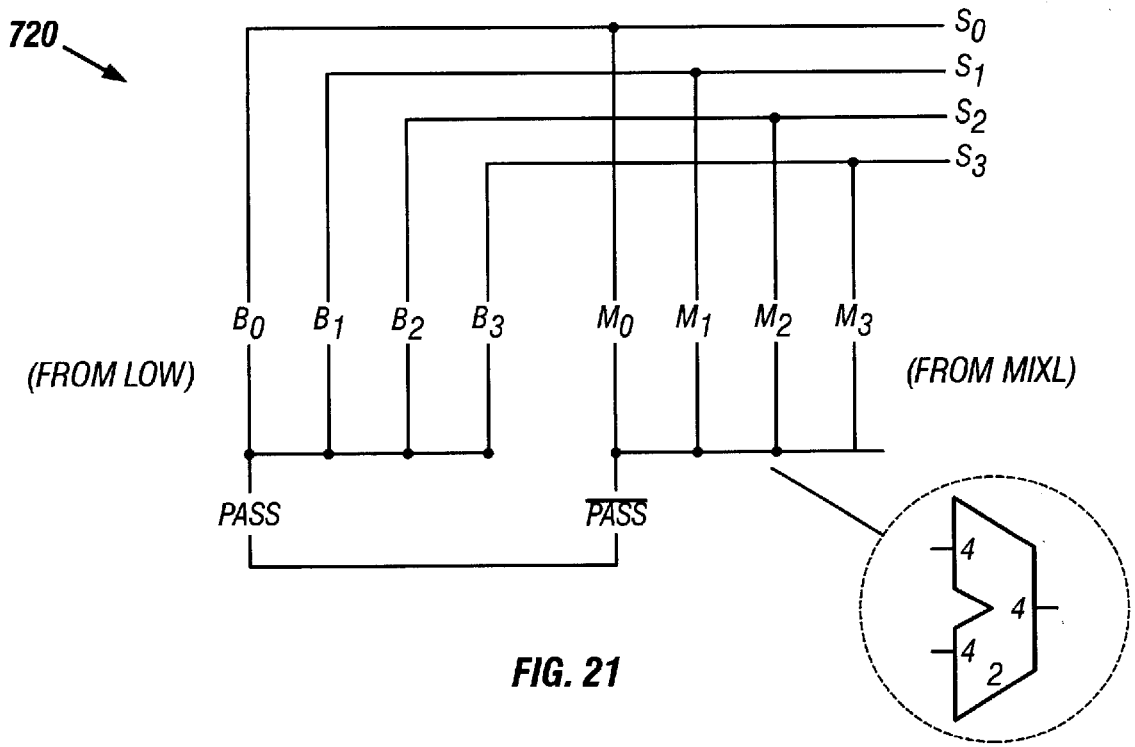
FIG. 21 is a shorthand representation of a MIXL/LOW selection gate.

As stated above, the other main function of the Result Logic, besides incrementing the intermediate sums, is to select the proper output for the lower sixteen bits. FIG. 14 illustrates that this function is performed by Gates 719 and 720. The MIXL/LOW selection gate 720 is illustrated in FIG. 21. FIG. 21 shows that, if the PASS input has been asserted by gate 715b, then gate 720 passes the LOW block's intermediate sum through as the output for gate 720. In contrast, when the $\overline{PASS}$ input wire has been asserted by gate 715b, then gate 720 passes the MIXL block's intermediate sum through as the output for gate 720.

Figure 20:
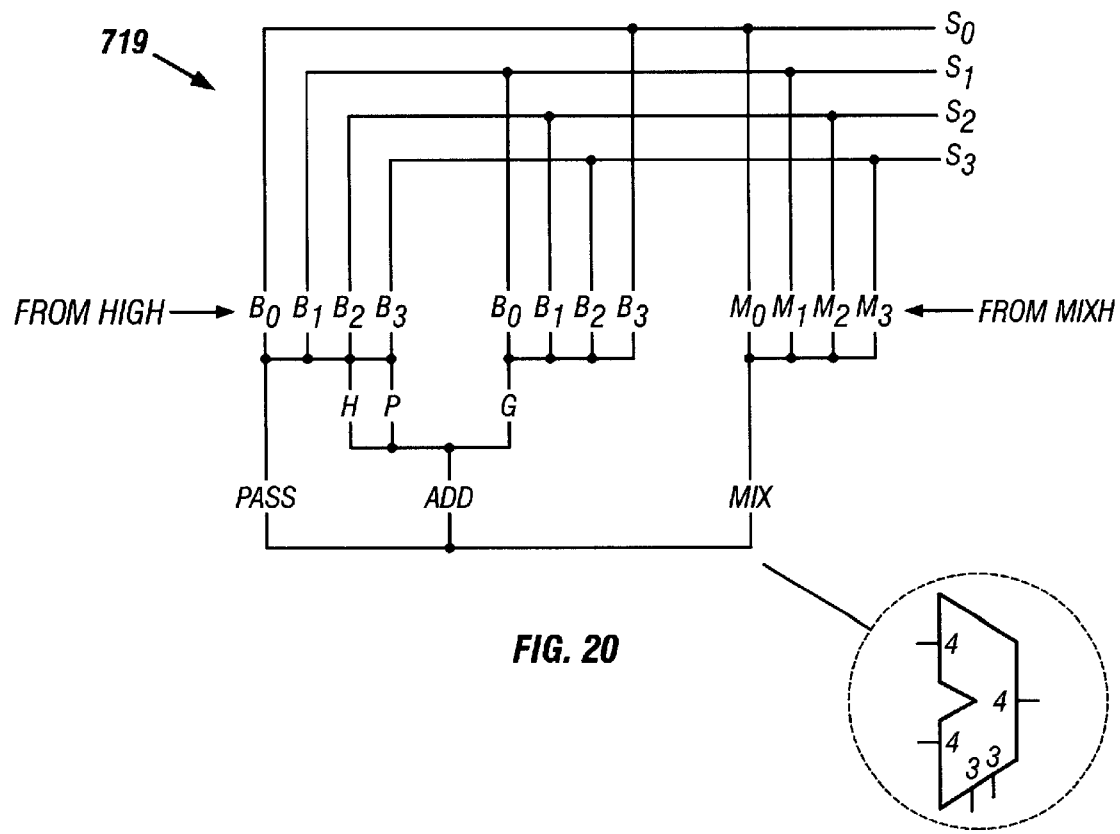
FIG. 20 is a shorthand representation of a MIXH/HIGH selection gate.

FIG. 20 illustrates that the operation of the MIXH/HIGH selection gate 719 is more complex than that of the MIXL/LOW selection gate 720. This is due to the fact that the gate 719 must increment the value of the HIGH block's intermediate sum before final output if a carry has been generated by the LOW block. FIG. 20 illustrates that, if the PASS input has been asserted by gate 718, then the value of the HIGH block's intermediate sum is passed through as the output of the gate 719. (This value will reflect unaltered bypassed bits) FIG. 20 illustrates that, if the MIX input has been asserted by gate 718, then the MIXH block's intermediate sum is passed through as the output of gate 719. FIG. 20 illustrates that, if the ADD input is asserted by gate 718, the additional processing must be performed. FIG. 14 illustrates that gate 719 receives as an input the LOW block's functional block HPG indicator generated by gate 714a. FIG. 20 illustrates that, when the ADD input wire into gate 719 is asserted, the intermediate sum from the HIGH block will be passed through as the gate's 719 output when the H or P wire of the LOW block's functional HPG indicator is asserted. If the G wire is asserted, then gate 719 increments the value of one dit of the HIGH block's intermediate sum before output.

Carry Out Gate

The final gate of the Result Logic to be discussed is the carry out gate 970. This gate 970 generates the carry out of the adder. The carry out of the adder must be selected from the position appropriate to size of the operation being performed. To this end, FIG. 14 illustrates that the carry out gate 970 receives a 1-of-6 control labeled "size." The size input indicates to the carry out gate 970 which block's architectural carry is to be reported. The possible values for the 1-of-6 size control are:

LOW (i.e., the LOW block's architectural carry is to be reported for a LOW operation)

MIXL (i.e., the MIXL block's architectural carry is to be reported for a MIXL operation)

MIXH (i.e., the MIXH block's architectural carry is to be reported for a MIXH operation)

HIGH8 (i.e., the HIGH block's architectural carry is to be reported for a HIGH operation)

HIGH1632 (i.e., the HIGH block's architectural carry is to be generated for a STANDARD or EXTENDED operation)

TOP (i.e., the TOP block's architectural carry is to be generated)

Figure 22:
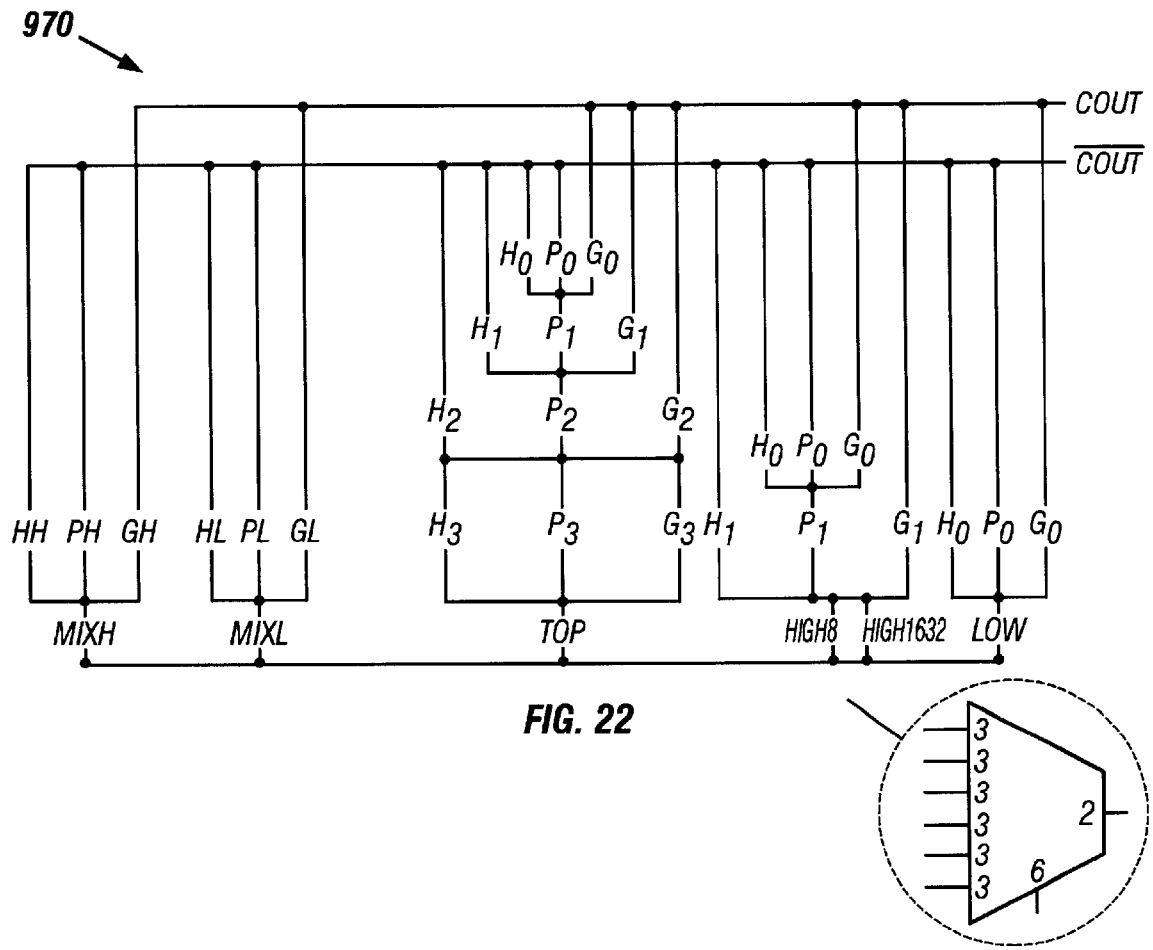
FIG. 22 is a shorthand representation of a carry out gate that generates the carry out of the present invention.

FIG. 22 illustrates that the carry out for the 8-bit LOW, MIXL, and MIXH operations is a trivial function of the functional HPG signal. If the H or P wire for the block HPG signal for these blocks, then gate 970 asserts the no carry indicator. Otherwise, when the G wire is asserted in the block HPG signal for the LOW, MIXL, or MIXH operation, then gate 970 asserts the carry indicator.

FIG. 22 illustrates that, for the HIGH and TOP blocks, the carry out must be generated from the various dependent block HPG indicators, which are not available until the second level of logic.

In sum, the present invention comprises a 32-bit result-merge adder that is constructed in three logic levels. In order to perform the bypass function necessary for result merging, the carry from one block of the adder to another may be forced to a Halt in order to avoid altering bypassed operand bits.

Other embodiments of the invention will be apparent to those skilled in the art after considering this specification in conjunction with the N-nary Patent or after practicing the disclosed invention. The specification and examples above are exemplary only, with the true scope of the invention being indicated by the following claims.

We claim the following invention:

1. An apparatus that performs an arithmetic operation on two N-nary operands including a 1-of-P first operand and a 1-of-Q second operand, comprising:

a sum/bypass logic that performs an arithmetic operation on one or more groupings of two or more bits of the 1-of-P first operand and one or more groupings of two or more bits of the 1-of-Q second operand to generate an intermediate sum and an HPG indicator;

a control logic, coupled to said sum/bypass logic, that selects one or more said groupings of two or more bits of the 1-of-P first operand and one or more said groupings of two or more bits of the 1-of-Q second operand for said arithmetic operation;

an HPG logic, coupled to said sum/bypass logic, that generates a block HPG indicator; and a result logic, coupled to said HPG logic, that generates a 1-of-R final result, wherein said 1-of-R final result comprises said intermediate sum, and wherein said final result further comprises additional bits of said second operand when said intermediate sum comprises bits than said second operand, such that said final result and said second operand comprise an equal number of bits, said additional bits of said second operand being selected according to said control logic.

2. The apparatus of claim 1 further comprises:

a 1-of-S operation selector input, coupled to said sum/bypass logic, that receives a 1-of-S operation selector, wherein said operation selector comprises one of a predetermined plurality of select values comprising an add selection and a subtract selection.

3. The apparatus of claim 2 wherein said arithmetic operation comprises one of a predetermined plurality of operations comprising an add operation, to be performed when said operation selector comprises said add selection, and a subtract operation to be performed when said operation selector comprises said subtract selection.

4. The apparatus of claim 3 wherein said add operation comprises adding said selected grouping(s) of two or more bits of the first operand to said selected grouping(s) of two or more bits of the second operand to produce said intermediate sum.

5. The apparatus of claim 3 wherein said subtract operation comprises subtracting said selected grouping(s) of two or more bits of the first operand from said selected grouping(s) of two or more bits of the second operand to produce said intermediate sum.

6. A system for performing an arithmetic operation on two N-nary operands including a 1-of-P first operand and a 1-of-Q second operand, comprising:

a sum/bypass logic means for performing an arithmetic operation on one or more groupings of two or more bits of the 1-of-P first operand and one or more groupings of two or more bits of the 1-of-Q second operand to generate an intermediate sum and an HPG indicator;

a control logic means, coupled to said sum/bypass logic means, for selecting said one or more groupings of two or more bits of the 1-of-P first operand and said one or more groupings of two or more bits of the 1-of-Q second operand for said arithmetic operation;

an HPG logic means, coupled to said sum/bypass logic means, for generating a block HPG indicator; and a result logic means, coupled to said HPG logic means, for generating a 1-of-R final result, wherein said 1-of-R final result comprises said intermediate sum, and wherein said final result further comprises additional bits of said second operand when said intermediate sum comprises fewer bits than said second operand, such that said final result and said second operand comprise an equal number of bits, said additional bits of said second operand being selected according to said control logic.

7. The system of claim 6 further comprises:

a 1-of-S input means, coupled to said sum/bypass logic means, for receiving a 1-of-S operation selector, wherein said operation selector comprises one of a predetermined plurality of select values comprising an add selection and a subtract selection.

8. The system of claim 7 wherein said arithmetic operation comprises one of a predetermined plurality of operations comprising an add operation, to be performed when said operation selector comprises said add selection, and a subtract operation to be performed when said operation selector comprises said subtract selection.

9. The system of claim 8 wherein said add operation comprises adding said selected grouping(s) of two or more bits of the first operand to said selected grouping(s) of two or more bits of the second operand to produce said intermediate sum.

10. The system of claim 8 wherein said subtract operation comprises subtracting said selected grouping(s) of two or more bits of the first operand from said selected grouping(s) of two or more bits of the second operand to produce said intermediate sum.

11. A method to manufacture an apparatus that performs an arithmetic operation on two N-nary operands including a 1-of-P first operand and a 1-of-Q second operand, comprising:

provniding a sum/bypass logic that performs an arithmetic operation on one or more groupings of two or more bits of the 1-of-P first operand and one or more groupings of two or more bits of the 1-of-Q second operand to generate an intermediate sum and an HPG indicator;

providing a control logic that selects said one or more groupings of two or more bits of the 1-of-P first operand and said one or more groupings of two or more bits of the 1-of-Q second operand for said arithmetic operation;

coupling said sum/bypass logic to said control logic;

providing an HPG logic that generates a block HPG indicator;

coupling said HPG logic to said sum/bypass logic;

providing a result logic that generates a 1-of-R final result, wherein said 1-of-R final result comprises said intermediate sum, and wherein said final result further comprises additional bits of said second operand when said intermediate sum comprises fewer bits than said second operand, such that said final result and said second operand comprise an equal number of bits, said additional bits of said second operand being selected according to said control logic; and coupling said result logic to said HPG logic.

12. The method of claim 11 further comprises:

providing a 1-of-S input that receives a 1-of-S operation selector, wherein said operation selector comprises one of a predetermined plurality of select values comprising an add selection and a subtract selection; and coupling said 1-of-S input to said sum/bypass logic.

13. The method of claim 12 further comprises:

configuring said sum/bypass logic such that said arithmetic operation comprises one of a predetermined plurality of operations comprising an add operation, to be performed when said operation selector comprises said add selection, and a subtract operation to be performed when said operation selector comprises said subtract selection.

14. The method of claim 13 wherein said add operation comprises adding said selected grouping(s) of two or more bits of the first operand to said selected grouping(s) of two or more bits of the second operand to produce said intermediate sum.

15. The system of claim 13 wherein said subtract operation comprises subtracting said selected grouping(s) of two or more bits of the first operand from said selected grouping (s) of two or more bits of the second operand to produce said intermediate sum.

16. A method to perform an arithmetic operation on two N-nary operands including a 1-of-P first operand and a 1-of-Q second operand, comprising:

selecting one or more groupings of two or more bits of the 1-of-P first operand and one or more groupings of two or more bits of the 1-of-Q second operand;

performing an arithmetic operation on said selected groupings to generate an intermediate sum and an HPG indicator;

generating a block HPG indicator; and generating a 1-of-R final result, wherein said 1-of-R final result comprises said intermediate sum, and wherein said final result further comprises additional bits of said second operand when said intermediate sum comprises fewer bits than said second operand, such that said final result and said second operand comprise an equal number of bits, said additional bits of said second operand being selected according to said control logic.

17. The method of claim 16 further comprises:

receiving a 1-of-S operation selector, wherein said operation selector comprises one of a predetermined plurality of select values comprising an add selection and a subtract selection.

18. The method of claim 17 wherein said step of performing an arithmetic operation comprises performing an add operation when said operation selector comprises said add selection, and a performing subtract operation when said operation selector comprises said subtract selection.

19. The method of claim 18 wherein said step of performing an add operation comprises adding said selected grouping(s) of two or more bits of the first operand to said selected grouping(s) of two or more bits of the second operand to produce said intermediate sum.

20. The method of claim 18 wherein said step of performing a subtract operation comprises subtracting said selected grouping(s) of two or more bits of the first operand from said selected grouping(s) of two or more bits of the second operand to produce said intermediate sum.

* * * * *